US009316908B2

(12) United States Patent
Takahashi

(10) Patent No.: US 9,316,908 B2
(45) Date of Patent: Apr. 19, 2016

(54) ACTINIC-RAY- OR RADIATION-SENSITIVE RESIN COMPOSITION, ACTINIC-RAY- OR RADIATION-SENSITIVE FILM, PHOTOMASK BLANK AND METHOD OF FORMING PATTERN

(71) Applicant: FUJIFILM Corporation, Minato-ku, Tokyo (JP)

(72) Inventor: Koutarou Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/472,831

(22) Filed: Aug. 29, 2014

(65) Prior Publication Data

US 2014/0370425 A1 Dec. 18, 2014

Related U.S. Application Data

(63) Continuation of application No. PCT/JP2013/056208, filed on Feb. 28, 2013.

(30) Foreign Application Priority Data

Mar. 2, 2012 (JP) ................................ 2012-046807

(51) Int. Cl.

| | |
|---|---|
| ***G03F 7/039*** | (2006.01) |
| ***G03F 7/20*** | (2006.01) |
| ***G03F 7/038*** | (2006.01) |
| ***G03F 7/004*** | (2006.01) |
| ***G03F 7/30*** | (2006.01) |
| *G03F 7/11* | (2006.01) |

(52) U.S. Cl.

CPC ............ *G03F 7/0388* (2013.01); *G03F 7/0045* (2013.01); *G03F 7/0046* (2013.01); *G03F 7/0392* (2013.01); *G03F 7/0397* (2013.01); *G03F 7/30* (2013.01); *G03F 7/11* (2013.01); *G03F 7/2041* (2013.01)

(58) Field of Classification Search

CPC ....... G03F 7/004; G03F 7/0045; G03F 7/029; G03F 7/039; G03F 7/0392; G03F 7/20; G03F 7/203

See application file for complete search history.

(56) References Cited

U.S. PATENT DOCUMENTS

| | | | | |
|---|---|---|---|---|
| 5,861,231 | A | 1/1999 | Barclay et al. | |
| 6,042,997 | A | 3/2000 | Barclay et al. | |
| 7,670,751 | B2 | 3/2010 | Ohashi et al. | |
| 8,252,518 | B2 * | 8/2012 | Tanaka et al. | 430/326 |
| 2004/0175654 | A1 * | 9/2004 | Yasunami et al. | 430/281.1 |
| 2007/0042290 | A1 | 2/2007 | Inabe et al. | |
| 2009/0274978 | A1 | 11/2009 | Ohashi et al. | |
| 2011/0171577 | A1 | 7/2011 | Tsuchimura et al. | |
| 2011/0189609 | A1 | 8/2011 | Kawabata et al. | |
| 2011/0318691 | A1 | 12/2011 | Tsuchimura et al. | |
| 2012/0003583 | A1 | 1/2012 | Tsuchimura et al. | |
| 2015/0017576 | A1 * | 1/2015 | Inoue et al. | 430/9 |

FOREIGN PATENT DOCUMENTS

| | | | |
|---|---|---|---|
| JP | 3843115 | B2 | 11/2006 |
| JP | 2007-52346 | A | 3/2007 |
| JP | 2009-80474 | A | 4/2009 |
| JP | 2009-269953 | A | 11/2009 |
| JP | 2010-100604 | A | 5/2010 |
| JP | 2011-33839 | A | 2/2011 |
| JP | 2011-158647 | A | 8/2011 |
| JP | 2012-13807 | A | 1/2012 |
| JP | 2012-13811 | A | 1/2012 |
| JP | 2012-32748 | A | 2/2012 |
| JP | 2013-11738 | A | 1/2013 |
| JP | 2013-20226 | A | 1/2013 |

OTHER PUBLICATIONS

International Search Report for PCT/JP2013/056208 dated Apr. 16, 2013.

English Translation of International Preliminary Report on Patentability issued in application No. PCT/JP2013/056208 dated Sep. 12, 2014.

* cited by examiner

*Primary Examiner* — Anca Eoff

(74) *Attorney, Agent, or Firm* — Sughrue Mion, PLLC

(57) ABSTRACT

Provided is an actinic-ray- or radiation-sensitive resin composition including (A) a resin that when acted on by an acid, is decomposed to thereby increase its alkali solubility, which resin comprises at least either any of repeating units (I) of general formula (I) below or any of repeating units (II) of general formula (II) below, (B) an onium salt acid generator that when exposed to actinic rays or radiation, generates a sulfonic acid whose volume ranges from 250 $Å^3$ to less than 350 $Å^3$, and (C) an onium salt acid generator that when exposed to actinic rays or radiation, generates a sulfonic acid whose volume is 400 $Å^3$ or greater.

(I)

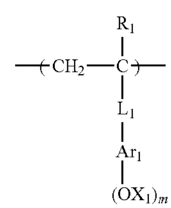

(II)

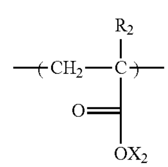

18 Claims, No Drawings

ACTINIC-RAY- OR RADIATION-SENSITIVE RESIN COMPOSITION, ACTINIC-RAY- OR RADIATION-SENSITIVE FILM, PHOTOMASK BLANK AND METHOD OF FORMING PATTERN

CROSS-REFERENCE TO RELATED APPLICATIONS

This application is a Continuation Application of PCT Application No. PCT/JP2013/056208, filed Feb. 28, 2013, and based upon and claiming the benefit of priority from Japanese Patent Application No. 2012-046807, filed Mar. 2, 2012, the entire contents of all of which are incorporated herein by reference.

BACKGROUND OF THE INVENTION

1. Field of the Invention

The present invention relates to an actinic-ray- or radiation-sensitive resin composition for use in a semiconductor production process for an IC or the like, a circuit board production for a liquid crystal, a thermal head or the like, the fabrication of an imprint mold structure, other photofabrication processes, a lithographic printing plate and an acid-hardenable composition, and further relates to an actinic-ray- or radiation-sensitive film, a photomask blank and a method of forming a pattern.

In the present invention, the term "actinic rays" or "radiation" means, for example, brightline spectra from a mercury lamp, far ultraviolet represented by an excimer laser, extreme ultraviolet, X-rays, soft X-rays, electron beams and the like. In the present invention, the term "light" means actinic rays or radiation.

2. Description of the Related Art

Heretofore, the microfabrication by lithography using a photoresist composition is performed in the process for manufacturing semiconductor devices, such as an IC and an LSI. In recent years, the formation of an ultrafine pattern in the submicron region or quarter-micron region is increasingly required in accordance with the realization of high integration for integrated circuits. Accordingly, the trend of exposure wavelength toward a short wavelength is seen. To now, an exposure equipment using an ArF excimer laser of 193 nm wavelength as a light source has been developed. Further, a method, known as a liquid-immersion method, in which the space between a projector lens and a sample is filled with a liquid of high refractive index (hereinafter also referred to as an "immersion liquid") has progressed as a technology for enhancing the resolving power. Still further, the development of lithography technology using electron beams, X-rays, EUV light or the like, aside from the excimer laser light, is now being promoted. Accordingly, chemically amplified resist compositions that are effectively sensitive to various radial rays and excel in sensitivity, resolution, pattern shape, capability of suppressing any line edge roughness (LER) (roughness performance) and the like have been developed (see, for example, patent reference 1).

With respect to, in particular, the resolution and roughness performance, the smaller the pattern size, the greater the importance thereof. In the lithography using X-rays, electron beams or EUV, it is intended to form a fine pattern of several tens of nanometers (nm). Accordingly, the excellence in resolution and roughness performance are especially required in the lithography.

The electron beam (EB) lithography is positioned as the next-generation or next-next-generation pattern forming technology, and is indispensable as a method of processing a photomask blank for use in the fabrication of a photomask for semiconductor production.

In the EB lithography, it is known that the influence of electron scattering, namely, forward scattering in a resist film is lessened by increasing the acceleration voltage of EB. Therefore, in recent years, the acceleration voltage of EB tends to be increased. However, increasing the acceleration voltage of EB may lower the ratio of trapping of electron energy in the resist film, thereby lowering the sensitivity.

Moreover, increasing the acceleration voltage of EB, although lessening the influence of forward scattering, increases the influence of the scattering of electrons reflected by a resist substrate, namely, backward scattering. When it is intended to form an isolated pattern of large exposure area, this influence of backward scattering is markedly grave. Therefore, for example, an increase of the acceleration voltage of EB might lead to the possibility of a deterioration of the resolution of the isolated pattern.

In particular in the patterning of a photomask blank for use in semiconductor exposure, as a light shielding film containing a heavy atom, such as chromium, molybdenum or tantalum, is present in a layer under a resist, the influence of backward scattering attributed to a reflection from the resist underlayer is more conspicuous than in the application of a resist onto a silicon wafer. Therefore, when an isolated pattern is formed on a photomask blank, the influence of backward scattering is so grave that the possibility of resolution deterioration is high.

As a method for enhancing the resolution of an isolated pattern, the use of a resin containing a group capable of regulating the solubility of the resin is being studied (see, for example, patent reference 2). However, this has not yet fully satisfied the resolution and rectangularity of an isolated pattern.

Moreover, further enhancement of resolution is also required in the formation of a fine contact hole pattern.

CITATION LIST

Patent Literature

[Patent reference 1] Jpn. Pat. Appln. KOKAI Publication No. (hereinafter referred to as JP-A-) 2011-158647, and

[Patent reference 2] Japanese Patent No. 3843115.

BRIEF SUMMARY OF THE INVENTION

It is an object of the present invention to provide an actinic-ray- or radiation-sensitive resin composition excelling in sensitivity, resolution and roughness performance, from which a pattern of favorable shape can be formed, even in the formation of a fine contact hole pattern and isolated pattern. It is other objects of the present invention to provide an actinic-ray- or radiation-sensitive film and a photomask blank from the composition and provide a method of forming a pattern in which the composition is used.

Some aspects according to the present invention are as follows.

[1] An actinic-ray- or radiation-sensitive resin composition comprising:

(A) a resin that when acted on by an acid, is decomposed to thereby increase its alkali solubility, which resin comprises at least either any of repeating units (I) of general formula (I) below or any of repeating units (II) of general formula (II) below, (B) an onium salt acid generator that when exposed to actinic rays or radiation, generates a sulfonic acid whose volume ranges from 250 Å$^3$ to less than 350 Å$^3$, and (C) an onium salt acid generator that when exposed to actinic rays or radiation, generates a sulfonic acid whose volume is 400 Å$^3$ or greater, (I)

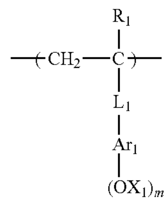

(II)

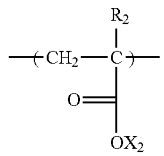

in which in general formula (I), $R_1$ represents a hydrogen atom or a methyl group; $L_1$ represents a single bond or a bivalent connecting group; $Ar_1$ represents an aromatic connecting group; $X_1$ represents a group leaving when acted on by an acid; and m is an integer of 1 to 3, and in general formula (II), $R_2$ represents a hydrogen atom, a methyl group, a hydroxymethyl group, an alkoxymethyl group or a halogen atom; and $X_2$ represents a group leaving when acted on by an acid.

[2] The composition according to item [1], wherein the resin (A) comprises both the any of repeating units (I) and any of repeating units (III) of general formula (III) below, (III)

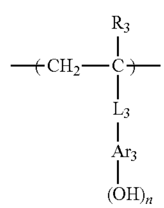

in which in general formula (III), $R_3$ represents a hydrogen atom or a methyl group; $L_3$ represents a single bond or a bivalent connecting group; $Ar_3$ represents an aromatic connecting group; and n is an integer of 1 to 3.

[3] The composition according to item [2], wherein $L_1$ in general formula (I) and $L_3$ in general formula (III) simultaneously represent a single bond.

[4] The composition according to any of items [1] to [3], wherein at least one group represented by $OX_1$ in general formula (I) has an acetal structure.

[5] The composition according to any of items [1] to [4], wherein the acid generators (B) and (C) are simultaneously acid generators that when exposed to actinic rays or radiation, generate an optionally substituted benzenesulfonic acid.

[6] The composition according to any of items [1] to [5], wherein the acid generator (B) is an onium salt acid generator with any of anion structures of general formula (IV) below, and the acid generator (C) is an onium salt acid generator with any of anion structures of general formula (V) below, (IV)

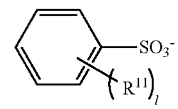

(V)

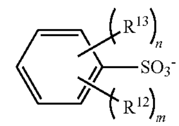

in which in general formula (IV), $R^{11}$ represents an alkyl group or a cycloalkyl group and has 7 to 12 carbon atoms in total; and 1 is an integer of 1 to 3, and in general formula (V), $R^{12}$ represents a cycloalkyl group; $R^{13}$ represents an alkyl group, a halogen atom or a hydroxyl group; m is an integer of 2 to 5; and n is an integer of 0 to 3 satisfying the relationship $m+n \leq 5$.

[7] The composition according to any of items [1] to [6], wherein the acid generators (B) and (C) are simultaneously sulfonium salts.

[8] An actinic-ray- or radiation-sensitive film formed from the composition according to any of items [1] to [7].

[9] A method of forming a pattern, comprising forming a film from the composition according to any of items [1] to [7], exposing the film to actinic rays or radiation, and developing the thus exposed film.

[10] The method of forming a pattern according to item [9], wherein electron beams are used as the actinic rays or radiation.

[11] A photomask blank comprising the actinic-ray- or radiation-sensitive film according to item [8].

The present invention has made it feasible to provide an actinic-ray- or radiation-sensitive resin composition excelling in sensitivity, resolution and roughness performance, from which a pattern of favorable shape can be formed, even in the formation of a fine contact hole pattern and isolated pattern. Furthermore, the present invention has made it feasible to provide an actinic-ray- or radiation-sensitive film and a photomask blank from the composition and to provide a method of forming a pattern in which the composition is used.

DETAILED DESCRIPTION OF THE INVENTION

Herein, the groups (atomic groups) for which no statement is made as to substitution or nonsubstitution are to be interpreted as including those containing no substituents and also those containing substituents. For example, the "alkyl groups" for which no statement is made as to substitution or nonsubstitution are to be interpreted as including not only the alkyl groups containing no substituents (unsubstituted alkyl groups) but also the alkyl groups containing substituents (substituted alkyl groups).

The actinic-ray- or radiation-sensitive resin composition of the present invention comprises a resin that comprises specified repeating units and that when acted on by an acid, increases its alkali solubility, and a compound (acid generator) that when exposed to actinic rays or radiation, generates an acid. A characteristic feature of the composition is that an onium salt acid generator that when exposed to actinic rays or radiation, generates a sulfonic acid whose volume ranges from 250 Å$^3$ to less than 350 Å$^3$, and an onium salt acid generator that when exposed to actinic rays or radiation, generates a sulfonic acid whose volume is 400 Å$^3$ or greater are contained as the acid generator.

The present invention will be described in detail below.

[1] Compound (Acid Generator) that when Exposed to Actinic Rays or Radiation, Generates an Acid The actinic-ray- or radiation-sensitive resin composition of the present invention comprises, as acid generators, an onium salt acid generator (hereinafter also referred to as an "acid generator (B)") that when exposed to actinic rays or radiation, generates a sulfonic acid whose volume ranges from 250 Å$^3$ to less than 350 Å$^3$, and an onium salt acid generator (hereinafter also referred to as an "acid generator (C)") that when exposed to actinic rays or radiation, generates a sulfonic acid whose volume is 400 Å$^3$ or greater are contained. The capability of LER suppression and the resolution of contact hole pattern (hole resolution) can be enhanced by the joint use of acid generator (B) and acid generator (C) that generate sulfonic acids (generated acids) having specified ranges of volumes different from each other. It is presumed that the reason therefor would be that the distance of diffusion of generated acids (diffusion length) can be controlled by the joint use of acid generator (B) capable of generating an acid whose volume ranges from 250 Å$^3$ to less than 350 Å$^3$ and acid generator (C) capable of generating an acid whose volume is 400 Å$^3$ or greater. Namely, it is presumed that by the joint use of acid generator (B) and acid generator (C), the deteriorations of LER and hole resolution attributed to any fluctuation after neutralization of generated acid can be inhibited when the diffusion length of generated acid is small, while the deteriorations of LER and hole resolution attributed to an intensification of development irregularity due to a low acid concentration gradient (d[H]/dx, change of generated acid amount per distance) in boundary regions can be inhibited when the diffusion length of generated acid is large.

It is preferred for the volume of an acid generated by acid generator (B) to be in the range of 280 to 320 Å$^3$. It is preferred for the volume of an acid generated by acid generator (C) to be in the range of 400 to 470 Å$^3$.

In an aspect of the present invention, the acid generator (B) and acid generator (C) can be added in a ratio such that the below defined "average value" of generated acid volumes is preferably in the range of 300 to 500 Å$^3$, more preferably 350 to 450 Å$^3$.

Herein, the "average value" refers to {the sum of [volume (Å$^3$) of an acid generated by each acid generator]×[mass ratio of the acid generator based on the total mass of acid generators]}.

In an aspect of the present invention, it is preferred for the acid generator (B) and acid generator (C) to be each an onium salt compound that when exposed to actinic rays or radiation, generates an optionally substituted benzenesulfonic acid. Further, the acid generator (B) is more preferably an onium salt with any of anion structures of general formula (IV) below, and the acid generator (C) is more preferably an onium salt with any of anion structures of general formula (V) below.

Namely, the anion moiety of the acid generator (B) is expressed by, for example, general formula (IV) below.

(IV)

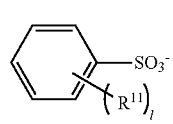

In general formula (IV), $R^{11}$ represents an alkyl group or a cycloalkyl group and has 7 to 12 carbon atoms in total; and l is an integer of 1 to 3.

The alkyl group represented by $R^{11}$ preferably has 1 to 4 carbon atoms. For example, there can be mentioned methyl, ethyl, isopropyl, n-propyl, n-butyl, isobutyl, s-butyl, t-butyl or the like.

As the cycloalkyl group represented by $R^{11}$, there can be mentioned, for example, a cyclopentyl group, a cyclohexyl group or the like.

Preferred examples of anion moieties of the acid generators (B) are shown below, which in no way limit the scope of the present invention. In some of these examples, the calculated value of volume is noted. In all other examples in which the volume value is not noted, the volumes thereof range from 250 Å$^3$ to less than 350 Å$^3$. Herein, the noted volume value refers to the volume of generated acid comprised of the anion moiety and a proton bonded thereto.

The value of each of these volumes was determined in the following manner by means of the software "WinMOPAC" compiled by Fujitsu Limited. Namely, first, the chemical structure of the acid according to each of the examples was inputted. Subsequently, while regarding this structure as an initial structure, the most stable conformation of the acid was determined by a molecular force field calculation using an MM3 method. Thereafter, a molecular orbital calculation using a PM3 method was carried out with respect to the most stable conformation. Thus, the "accessible volume" of each of the acids was calculated.

338Å$^3$

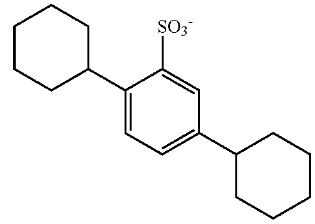

303Å$^3$

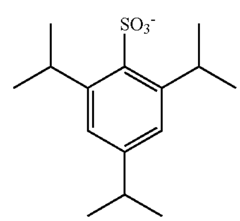

280Å$^3$

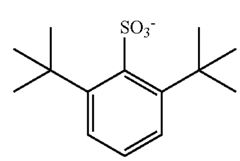

310Å$^3$

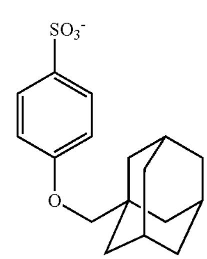

-continued

281Å$^3$

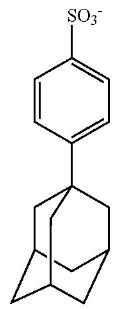

271Å$^3$

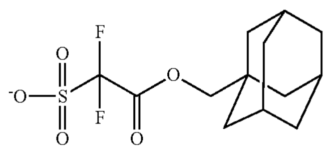

266Å$^3$

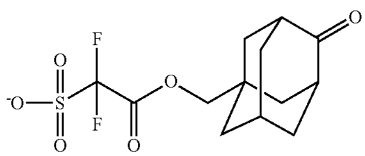

339Å$^3$

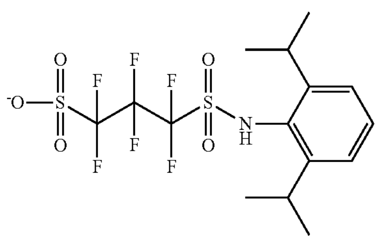

347Å$^3$

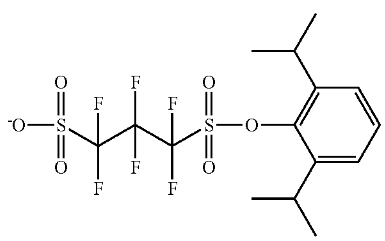

271Å$^3$

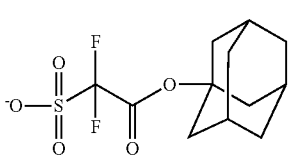

291Å$^3$

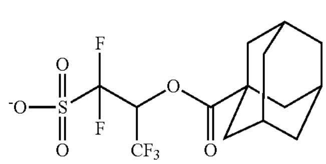

250Å$^3$

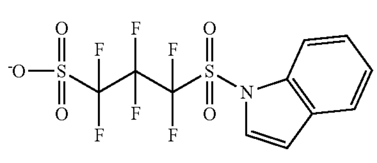

-continued

277Å$^3$

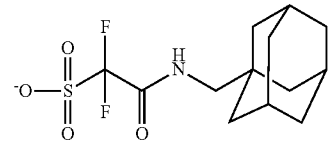

297Å$^3$

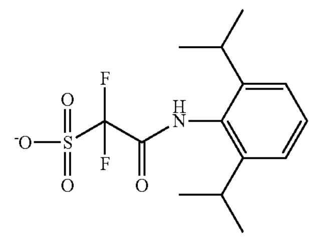

315Å$^3$

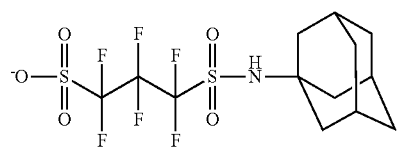

311Å$^3$

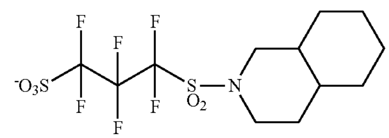

The anion moiety of the acid generator (C) is expressed by, for example, general formula (V) below.

(V)

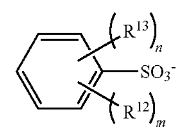

In general formula (V), $R^{12}$ represents a cycloalkyl group; $R^{13}$ represents an alkyl group, a halogen atom or a hydroxyl group; m is an integer of 2 to 5; and n is an integer of 0 to 3 satisfying the relationship m+n≤5.

The cycloalkyl group represented by $R^{12}$ may be monocyclic or polycyclic. In the latter instance, the cycloalkyl group may be a bridged one.

The monocycloalkyl group is preferably one having 3 to 15 carbon atoms. As such a cycloalkyl group, there can be mentioned, for example, a cyclohexyl group, a cyclooctyl group or the like. With respect to the number of ring members, 3 to 8-membered rings are preferred, and a 5 or 6-membered ring is more preferred.

As the polycycloalkyl group, there can be mentioned a group with, for example, a bicyclo, tricyclo or tetracyclo structure. The polycycloalkyl group is preferably one having 6 to 20 carbon atoms. As such, there can be mentioned, for example, an adamantyl group, a norbornyl group, an isobornyl group, a camphonyl group, a dicyclopentyl group, an α-pinanyl group, a tricyclodecanyl group, a tetracyclododecyl group or an androstanyl group.

A substituent may be introduced in the cycloalkyl group represented by $R^{12}$.

As the alkyl group represented by $R^{13}$, there can be mentioned, for example, a methyl group, an ethyl group, an n-propyl group, an isopropyl group, a t-butyl group or the like.

As the halogen atom represented by $R^{13}$, there can be mentioned a fluorine atom, a chlorine atom or a bromine atom.

$R^{13}$ is preferably an alkyl group.

Preferably, m is 2 or 3. Preferably, n is 0 or 1.

In the anion structure of general formula (V), it is preferred for the benzene ring to be substituted, at its ortho position to the $SO_3^-$ group in the formula, with at least one cycloalkyl group represented by $R^{12}$. More preferably, the benzene ring is substituted, at its ortho position to the $SO_3^-$ group in the formula, with two cycloalkyl groups represented by $R^{12}$.

Preferred examples of anion moieties of the acid generators (C) are shown below, which in no way limit the scope of the present invention. In some of these examples, the value of volume calculated as a generated acid comprised of the anion moiety and a proton bonded thereto is noted. The calculation method is the same as set forth hereinabove. In all other examples in which the volume value is not noted, the volumes thereof are each 400 Å$^3$ or greater.

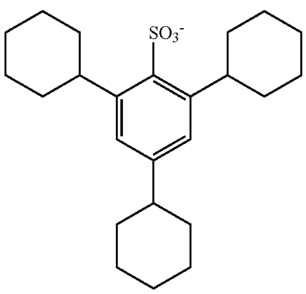

437 Å$^3$

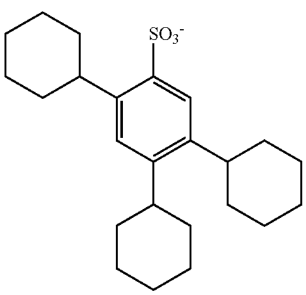

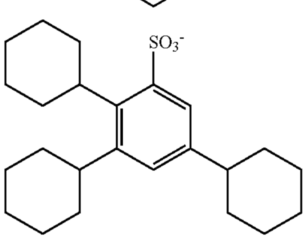

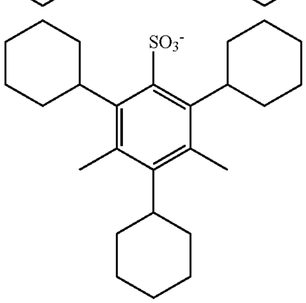

-continued

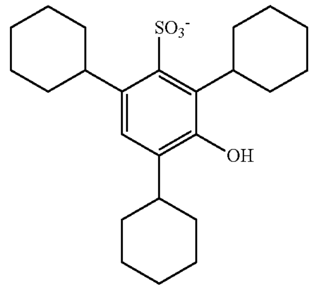

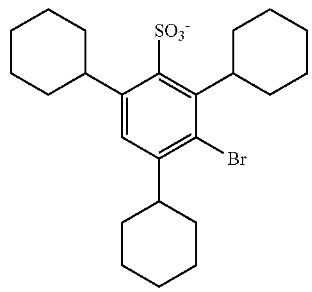

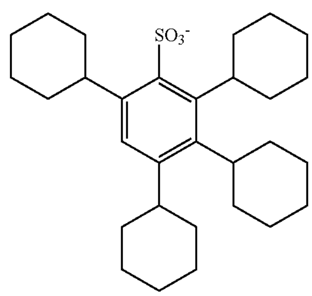

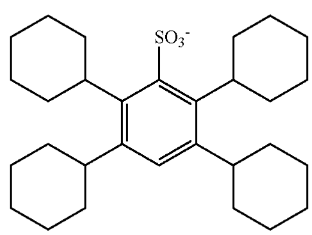

529 Å$^3$

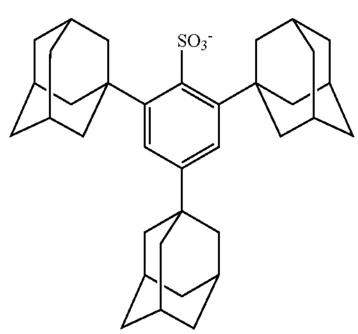

-continued
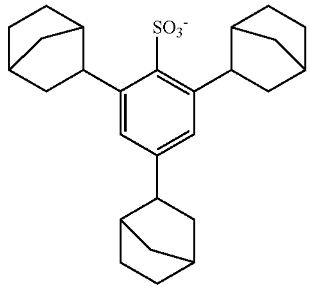
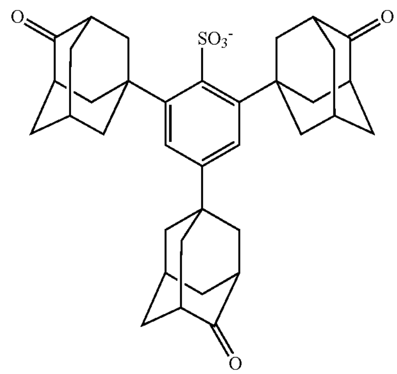
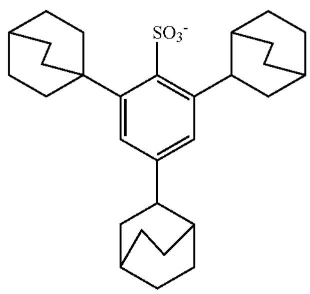
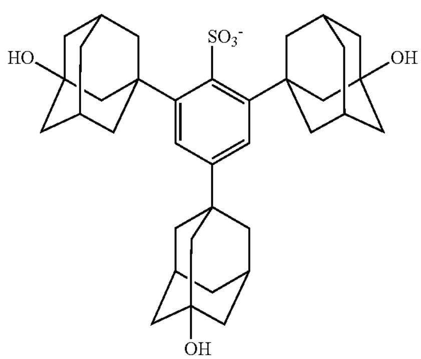
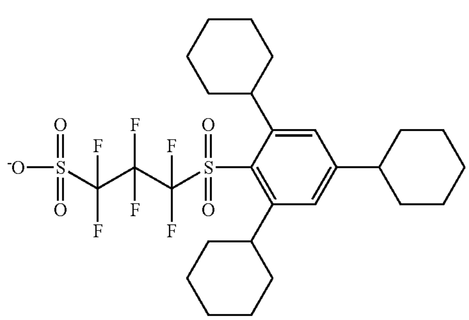
525 Å$^3$
-continued
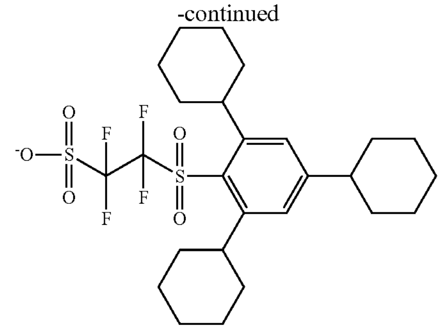
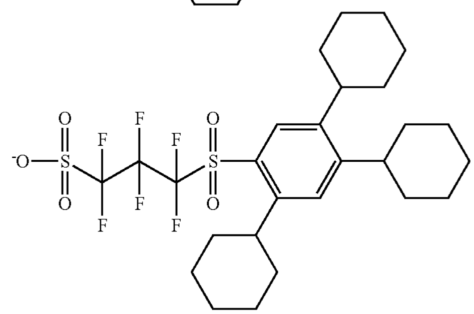
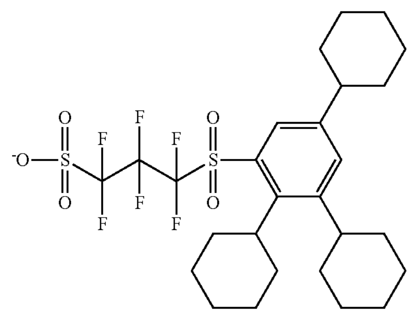
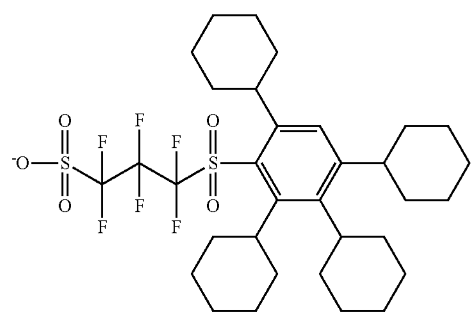
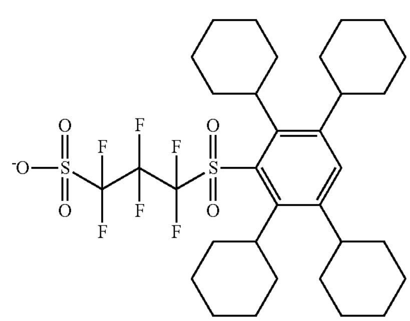

-continued
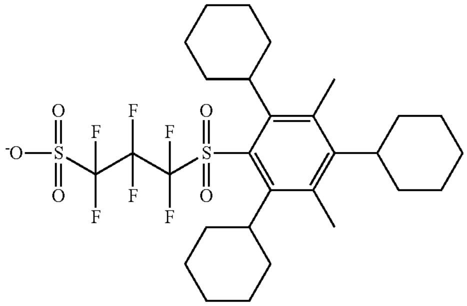
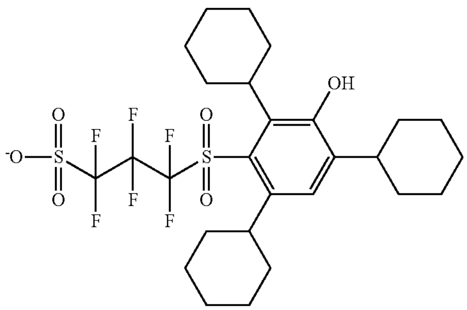
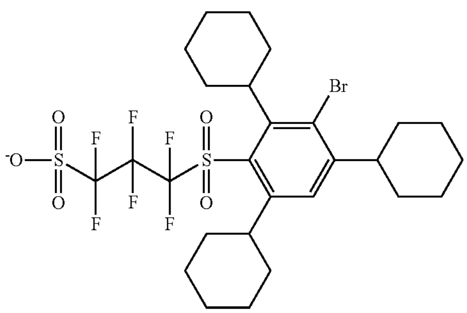
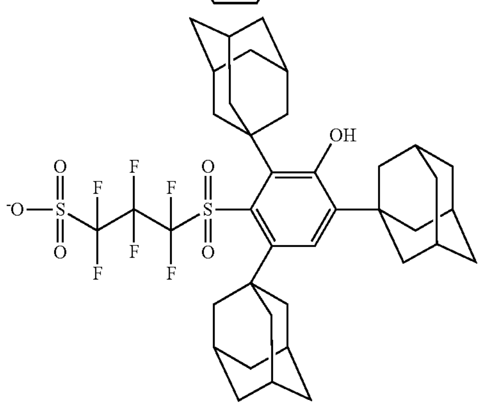
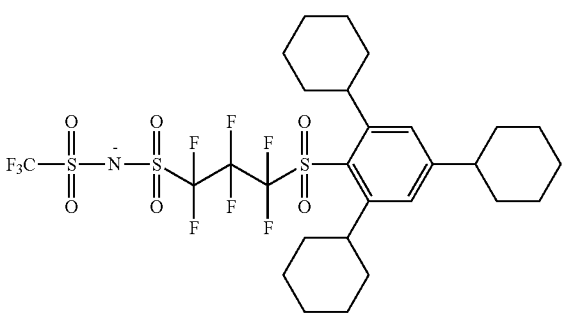
582 Å$^3$
-continued
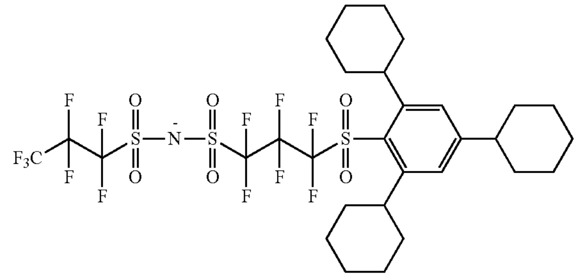
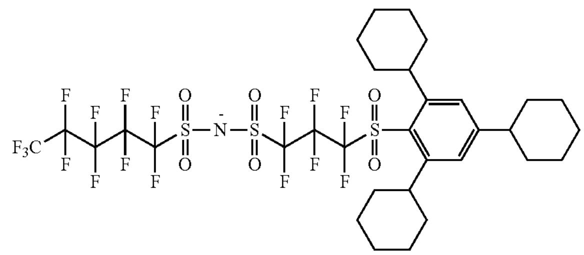
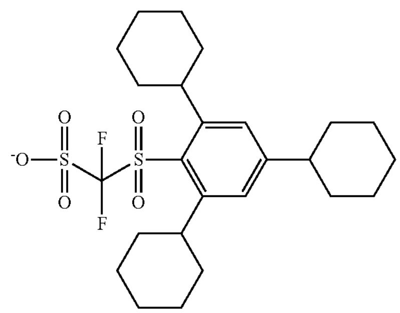
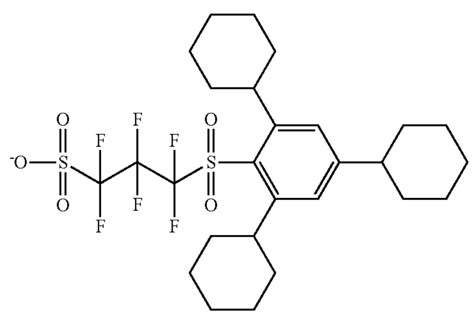
535 Å$^3$
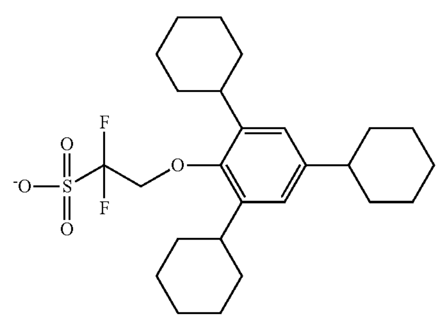

-continued
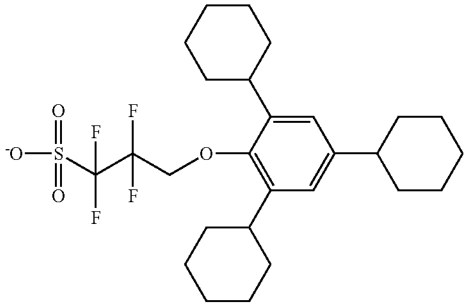
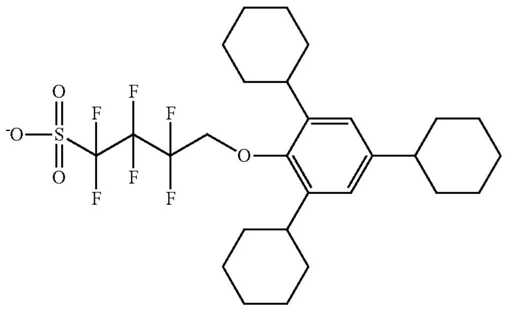
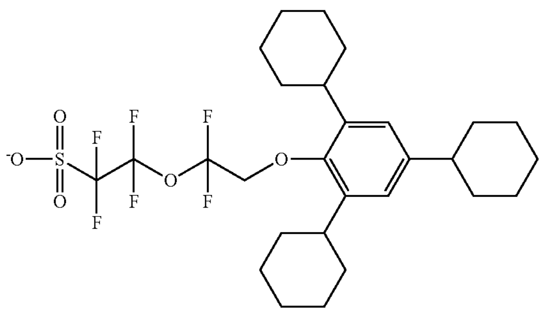
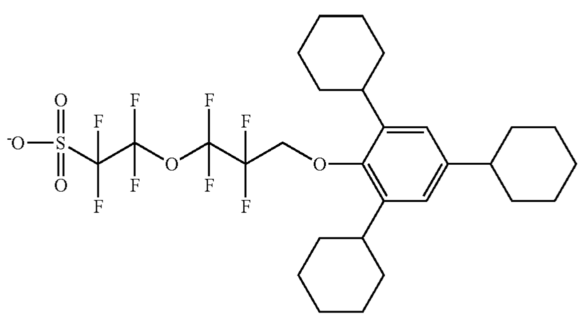
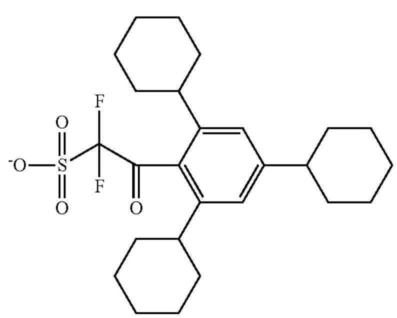
-continued
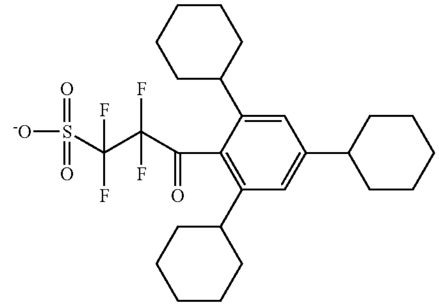
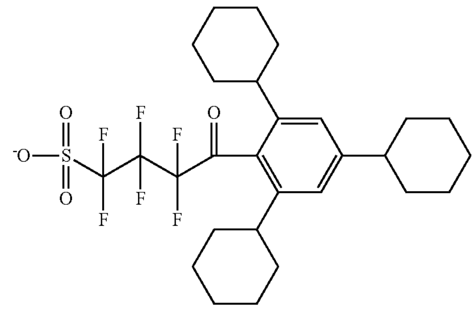
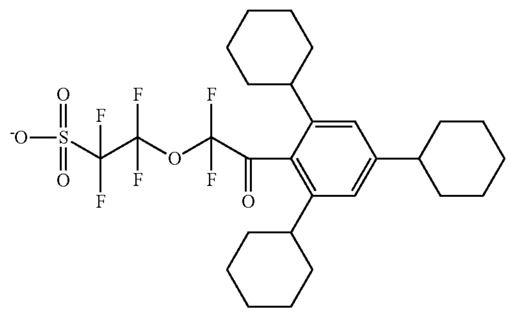
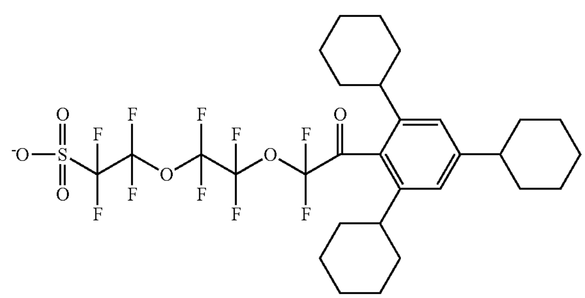
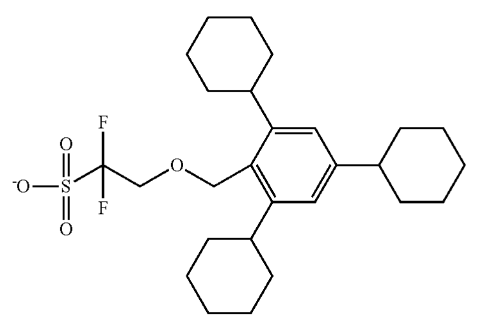

-continued
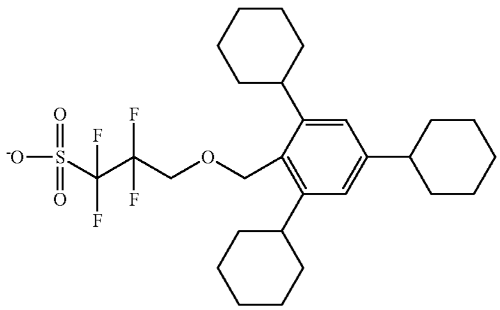
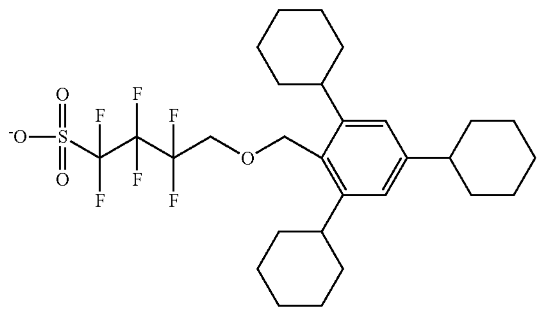
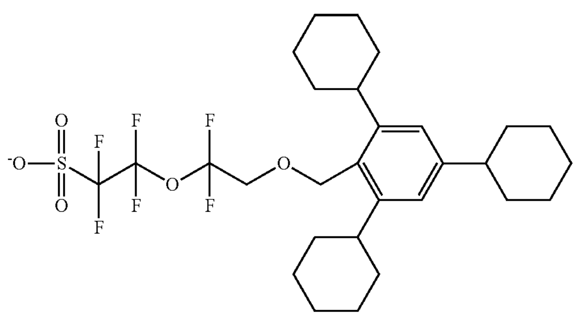
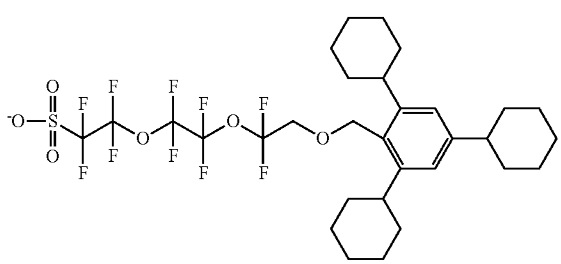
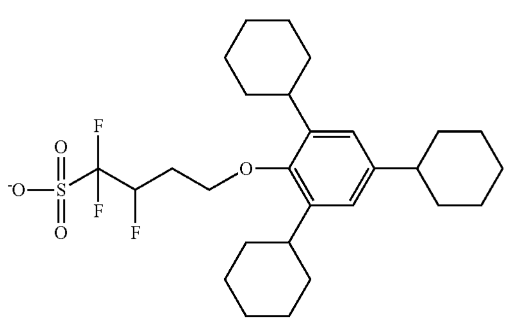
-continued
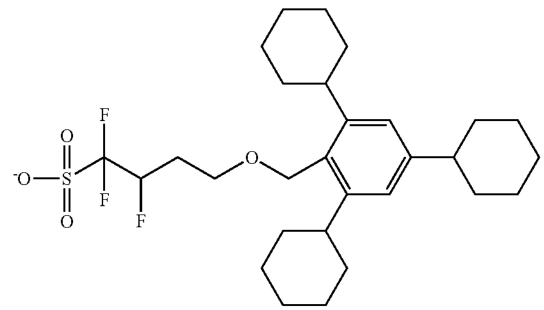
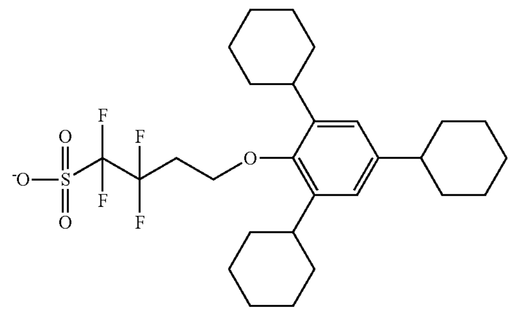
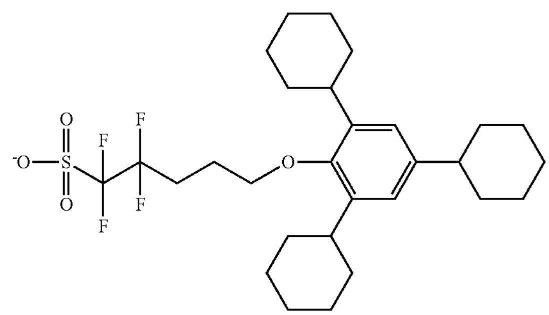
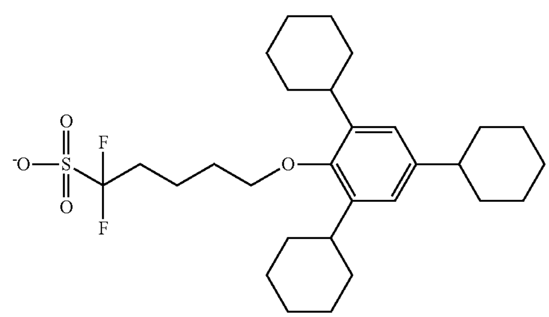
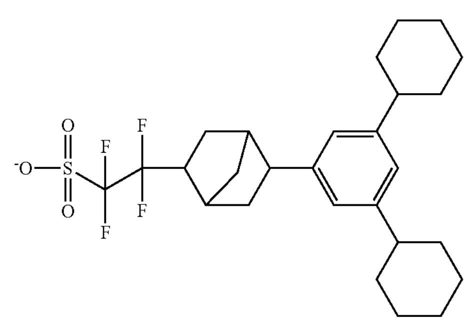

-continued

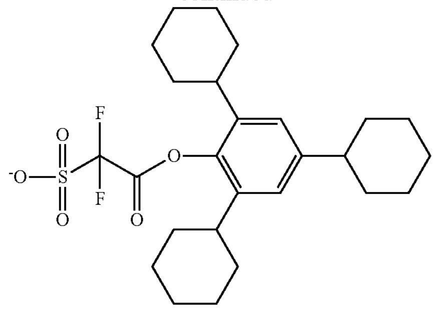

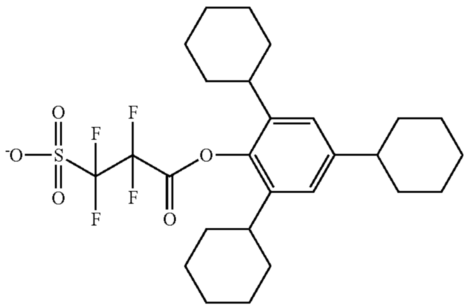

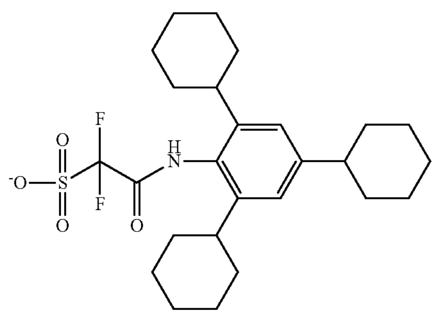

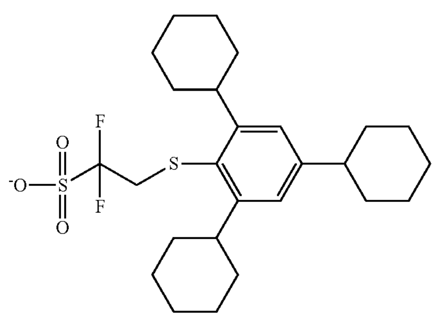

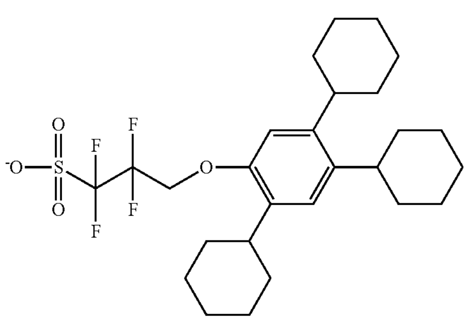

-continued

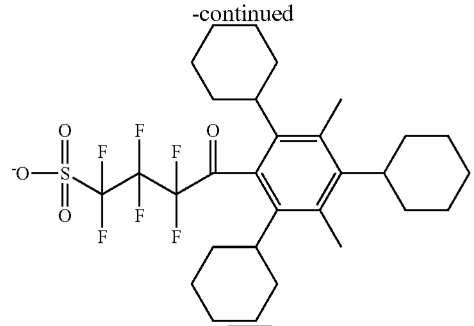

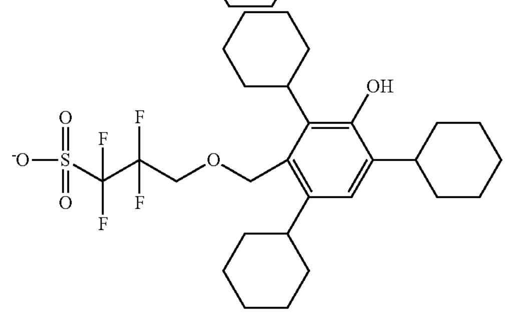

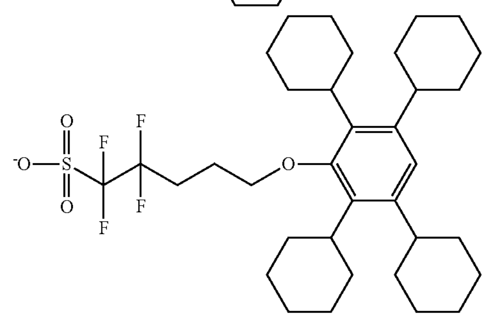

The cation moieties of the onium salts as the acid generator (B) and acid generator (C) will be described below.

The onium salts as the acid generator (B) and acid generator (C) are preferably sulfonium or iodonium salts, more preferably sulfonium salts.

The cation moieties of the onium salts as the acid generator (B) and acid generator (C) can be expressed by, for example, general formula (ZI) below or general formula (ZII) below.

$$R_{201}-\overset{\displaystyle R_{202}\atop |}{S^{+}}-R_{203} \qquad \text{(ZI)}$$

$$R_{204}-I^{+}-R_{205} \qquad \text{(ZII)}$$

In general formula (ZI) above, each of $R_{201}$, $R_{202}$ and $R_{203}$ independently represents an organic group. The number of carbon atoms of each of the organic groups represented by $R_{201}$, $R_{202}$ and $R_{203}$ is, for example, in the range of 1 to 30, preferably 1 to 20.

Two of $R_{201}$ to $R_{203}$ may be bonded to each other through a single bond or a bivalent connecting group to thereby form a ring structure. As the bivalent connecting group, there can be mentioned, for example, an ether group, a thioether group, an ester group, an amido group, a carbonyl group, a methylene group and an ethylene group. As the group formed by bonding of two of $R_{201}$ to $R_{203}$, there can be mentioned, for example, an alkylene group such as a butylene group or a pentylene group.

As the organic groups represented by $R_{201}$, $R_{202}$ and $R_{203}$, there can be mentioned, for example, corresponding groups of the following cations (ZI-1), (ZI-2) and (ZI-3).

Cations (ZI-1) are arylsulfonium cations of general formula (ZI) wherein at least one of $R_{201}$ to $R_{203}$ is an aryl group.

In the cations (ZI-1), all of the $R_{201}$ to $R_{203}$ may be aryl groups. It is also appropriate that the $R_{201}$ to $R_{203}$ are partially an aryl group and the remainder is an alkyl group. When each of the cations (ZI-1) contains a plurality of aryl groups, the aryl groups may be identical to or different from each other.

As the cations (ZI-1), there can be mentioned, for example, a triarylsulfonium cation, a diarylalkylsulfonium cation and an aryldialkylsulfonium cation.

The aryl group of the cations (ZI-1) is preferably a phenyl group, a naphthyl group or a heteroaryl group such as an indole residue, a pyrrole residue or the like. The aryl group is more preferably a phenyl group, a naphthyl group or an indole residue.

The alkyl group contained in the cation (ZI-1) according to necessity is preferably a linear or branched alkyl group or a cycloalkyl group having 1 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group and alkyl group represented by $R_{201}$ to $R_{203}$ may have a substituent. As the substituent, there can be mentioned an alkyl group (preferably having 1 to 15 carbon atoms), an aryl group (preferably having 6 to 14 carbon atoms), an alkoxy group (preferably having 1 to 15 carbon atoms), a halogen atom, a hydroxyl group or a phenylthio group.

Preferred substituents are a linear, branched or cyclic alkyl group having 1 to 12 carbon atoms and a linear, branched or cyclic alkoxy group having 1 to 12 carbon atoms. More preferred substituents are an alkyl group having 1 to 6 carbon atoms and an alkoxy group having 1 to 6 carbon atoms. The substituents may be contained in any one of the three $R_{201}$ to $R_{203}$, or alternatively may be contained in all three of $R_{201}$ to $R_{203}$. When $R_{201}$ to $R_{203}$ represent a phenyl group, the substituent preferably lies at the p-position of the aryl group.

It is also appropriate that any one or two of the three $R_{201}$ to $R_{203}$ is an optionally substituted aryl group and the remainder is a linear, branched or cyclic alkyl group. As particular examples of the structures, there can be mentioned the structures described in Paragraphs 0141 to 0153 of JP-A-2004-210670.

As the aryl group, there can be mentioned the same aryl groups as mentioned with respect to $R_{201}$ to $R_{203}$. It is preferred for the aryl group to have a substituent selected from a hydroxyl group, an alkoxy group and an alkyl group. More preferred substituent is an alkoxy group having 1 to 12 carbon atoms. Especially preferred is an alkoxy group having 1 to 6 carbon atoms.

The linear, branched or cyclic alkyl group of the remainder is preferably an alkyl group having 1 to 6 carbon atoms. These groups may further have substituents. When the two remainders exist, they may be bonded to each other to thereby form a ring.

The cations (ZI-1) in one form thereof are those of general formula (ZI-1A) below.

(ZI-1A)

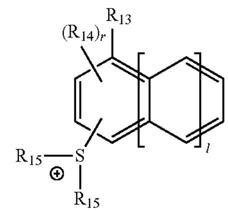

In general formula (ZI-1A), $R_{13}$ represents any of a hydrogen atom, a fluorine atom, a hydroxyl group, an alkyl group, a cycloalkyl group, an alkoxy group, a cycloalkyloxy group and an alkoxycarbonyl group.

$R_{14}$, each independently in the instance of $R_{14}$s, represents any of an alkyl group, a cycloalkyl group, an alkoxy group, an alkylsulfonyl group and a cycloalkylsulfonyl group.

Each of $R_{15}$s independently represents an alkyl group or a cycloalkyl group, provided that the two $R_{15}$s may be bonded to each other to thereby form a ring. These groups may have substituents.

In the formula, 1 is an integer of 0 to 2, and r is an integer of 0 to 8.

The alkyl groups represented by $R_{13}$, $R_{14}$ and $R_{15}$ may be linear or branched and preferably each has 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are especially preferred.

As the cycloalkyl groups represented by $R_{13}$, $R_{14}$ and $R_{15}$, there can be mentioned a cyclopropyl group, a cyclobutyl group, a cyclopentyl group, a cyclohexyl group, a cycloheptyl group, a cyclooctyl group, a cyclododecanyl group, a cyclopentenyl group, a cyclohexenyl group, a cyclooctadienyl group and the like. Of these a cyclopropyl group, a cyclopentyl group, a cyclohexyl group and a cyclooctyl group are especially preferred.

With respect to the alkyl group of the alkoxy group represented by $R_{13}$ or $R_{14}$, there can be mentioned, for example, the same specific examples as mentioned above with respect to the alkyl groups represented by $R_{13}$ to $R_{15}$. As the alkoxy group, a methoxy group, an ethoxy group, an n-propoxy group and an n-butoxy group are especially preferred.

With respect to the cycloalkyl group of the cycloalkyloxy group represented by $R_{13}$, there can be mentioned, for example, the same specific examples as mentioned above with respect to the cycloalkyl groups represented by $R_{13}$ to $R_{15}$. As the cycloalkyloxy group, a cyclopentyloxy group and a cyclohexyloxy group are especially preferred.

With respect to the alkoxy group of the alkoxycarbonyl group represented by $R_{13}$, there can be mentioned, for example, the same specific examples as mentioned above with respect to the alkoxy groups represented by $R_{13}$ or $R_{14}$. As the alkoxycarbonyl group, a methoxycarbonyl group, an ethoxycarbonyl group and an n-butoxycarbonyl group are especially preferred.

With respect to the alkyl group of the alkylsulfonyl group represented by $R_{14}$, there can be mentioned, for example, the same specific examples as mentioned above with respect to the alkyl groups represented by $R_{13}$ to $R_{15}$. With respect to the cycloalkyl group of the cycloalkylsulfonyl group represented by $R_{14}$, there can be mentioned, for example, the same specific examples as mentioned above with respect to the cycloalkyl groups represented by $R_{13}$ to $R_{15}$. As the alkylsulfonyl group and cycloalkylsulfonyl group, a methanesulfonyl group, an ethanesulfonyl group, an n-propanesulfonyl group, an n-butanesulfonyl group, a cyclopentanesulfonyl group and a cyclohexanesulfonyl group are especially preferred.

In the formula, 1 is preferably 0 or 1, more preferably 1, and r is preferably 0 to 2.

Each of the groups represented by $R_{13}$ to $R_{15}$ may further have a substituent. As such a substituent, there can be mentioned, for example, a halogen atom (e.g., a fluorine atom), a hydroxyl group, a carboxyl group, a cyano group, a nitro group, an alkoxy group, a cycloalkyloxy group, an alkoxyalkyl group, a cycloalkyloxyalkyl group, an alkoxycarbonyl group, a cycloalkyloxycarbonyl group, an alkoxycarbonyloxy group, a cycloalkyloxycarbonyloxy group or the like.

As the alkoxy group, there can be mentioned, for example, a linear or branched group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group and the like.

As the cycloalkyloxy group, there can be mentioned, for example, a cycloalkyloxy group having 3 to 20 carbon atoms, such as a cyclopentyloxy group, a cyclohexyloxy group and the like.

As the alkoxyalkyl group, there can be mentioned, for example, a linear or branched alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the cycloalkyloxyalkyl group, there can be mentioned, for example, a cycloalkyloxyalkyl group having 4 to 21 carbon atoms, such as a cyclohexyloxymethyl group, a cyclopentyloxymethyl group or a cyclohexyloxyethyl group.

As the alkoxycarbonyl group, there can be mentioned, for example, a linear or branched alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group or a t-butoxycarbonyl group.

As the cycloalkyloxycarbonyl group, there can be mentioned, for example, a cycloalkyloxycarbonyl group having 4 to 21 carbon atoms, such as a cyclopentyloxycarbonyl group or a cyclohexyloxycarbonyl group.

As the alkoxycarbonyloxy group, there can be mentioned, for example, a linear or branched alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group or a t-butoxycarbonyloxy group.

As the cycloalkyloxycarbonyloxy group, there can be mentioned, for example, a cycloalkyloxycarbonyloxy group having 4 to 21 carbon atoms, such as a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-1A).

The cyclic structure may further have a substituent. As such substituent, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like.

It is especially preferred for the $R_{15}$ to be a methyl group, an ethyl group, a bivalent group allowing two $R_{15}$s to be bonded to each other so as to form a tetrahydrothiophene ring structure in cooperation with the sulfur atom of the general formula (ZI-1A).

Each of $R_{13}$ and $R_{14}$ may further have a substituent. As such a substituent, there can be mentioned, for example, a hydroxyl group, an alkoxy group, an alkoxycarbonyl group, a halogen atom (especially, a fluorine atom) or the like.

Specific examples of the cations of general formula (ZI-1A) will be shown below.

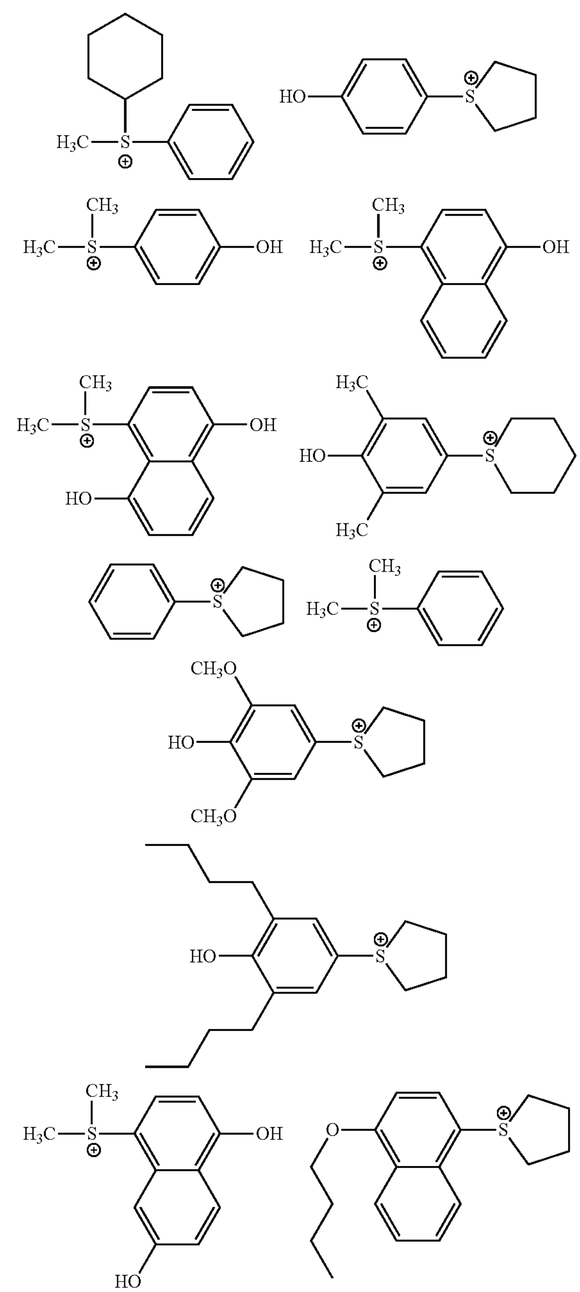

-continued

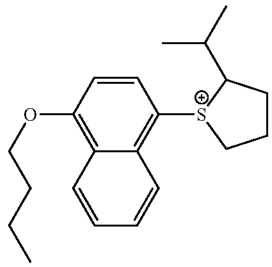

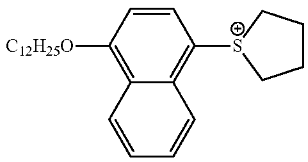

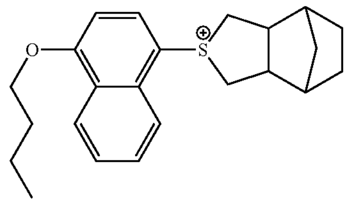

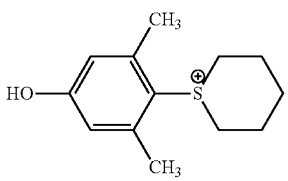

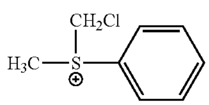

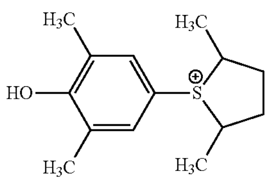

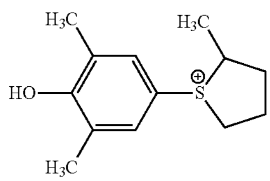

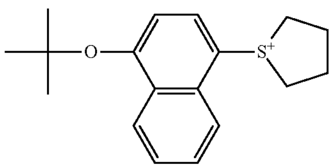

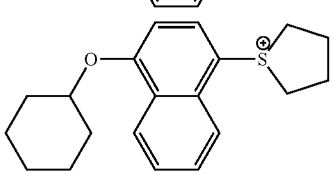

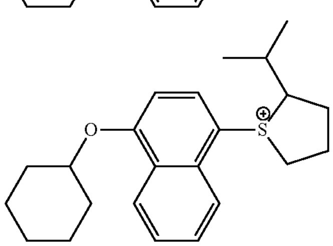

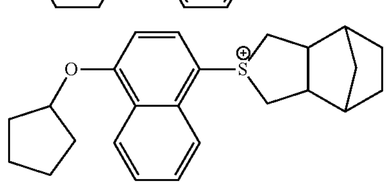

-continued

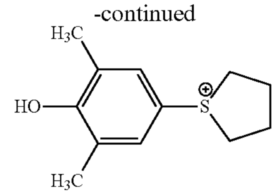

Now, cations (ZI-2) will be described.

The cations (ZI-2) are those of formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a 2-oxoalkyl group, an alkoxycarbonylmethyl group, an allyl group or a vinyl group. More preferred groups are a linear, branched or cyclic 2-oxoalkyl group or an alkoxycarbonylmethyl group. Especially preferred is a linear or branched 2-oxoalkyl group.

The alkyl group represented by $R_{201}$ to $R_{203}$ may be linear, branched or cyclic. As preferred alkyl groups, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group).

The 2-oxoalkyl group represented by $R_{201}$ to $R_{203}$ may be linear or branched. A group having >C═O at the 2-position of the alkyl group is preferred.

As preferred alkoxy groups of the alkoxycarbonylmethyl group represented by $R_{201}$ to $R_{203}$, there can be mentioned alkoxy groups having 1 to 5 carbon atoms (a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

Two of $R_{201}$ to $R_{203}$ may be bonded to each other to thereby form a ring structure. This ring structure within the ring may contain an oxygen atom, a sulfur atom, an ester bond, an amido bond and/or a carbonyl group. As the group formed by the mutual bonding of two of $R_{201}$ to $R_{203}$, there can be mentioned, for example, an alkylene group (for example, a butylene group or a pentylene group).

Now, the cations (ZI-3) will be described.

The cations (ZI-3) are those represented by general formula (ZI-3), below, which have a phenacylsulfonium structure.

(ZI-3)

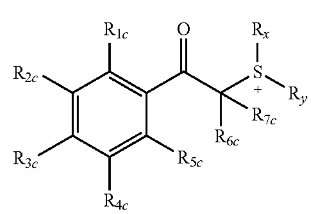

In general formula (ZI-3), each of $R_{1c}$ to $R_{5c}$ independently represents a hydrogen atom, an alkyl group, an alkoxy group or a halogen atom. The numbers of carbon atoms of the alkyl group and the alkoxy group are preferably 1 to 6.

Each of $R_{6c}$ and $R_{7c}$ independently represents a hydrogen atom or an alkyl group. The number of carbon atoms of the alkyl group is preferably 1 to 6.

Each of $R_x$ and $R_y$ independently represents an alkyl group, a 2-oxoalkyl group, an alkoxycarbonylmethyl group, an allyl group or a vinyl group. Each of these atomic groups preferably has 1 to 6 carbon atoms.

Any two or more of $R_{1c}$ to $R_{7c}$ may be bonded to each other to thereby form a ring structure. $R_x$ and $R_y$ may be bonded to each other to thereby form a ring structure. Each of these ring structures may contain an oxygen atom, a sulfur atom, an ester bond and/or an amido bond.

As particular examples of the cations (ZI-3), there can be mentioned the cations of the compounds set forth by way of example in Paragraphs 0047 and 0048 of JP-A-2004-233661 and set forth by way of example in Paragraphs 0040 to 0046 of JP-A-2003-35948.

Further, cations (ZI-4) will be described below.

Cations (ZI-4) are those of general formula (ZI-4) below. The cations of general formula (ZI-4) are effective in outgas suppression.

(ZI-4)

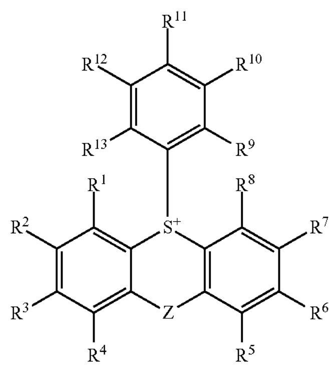

In general formula (ZI-4), each of $R^1$ to $R^{13}$ independently represents a hydrogen atom or a substituent, provided that at least one of $R^1$ to $R^{13}$ is a substituent containing an alcoholic hydroxyl group. In the present invention, the alcoholic hydroxyl group refers to a hydroxyl group bonded to a carbon atom of an alkyl group.

Z represents a single bond or a bivalent connecting group.

When $R^1$ to $R^{13}$ represent substituents containing an alcoholic hydroxyl group, it is preferred for the $R^1$ to $R^{13}$ to represent the groups of the formula —W—Y, wherein Y represents a hydroxyl-substituted alkyl group and W represents a single bond or a bivalent connecting group.

As preferred examples of the alkyl group represented by Y, there can be mentioned an ethyl group, a propyl group and an isopropyl group. Especially preferably, Y contains the structure of $—CH_2CH_2OH$.

W is preferably a single bond, or a bivalent group as obtained by replacing with a single bond any hydrogen atom of a group selected from among an alkoxy group, an acyloxy group, an acylamino group, an alkyl- or arylsulfonylamino group, an alkylthio group, an alkylsulfonyl group, an acyl group, an alkoxycarbonyl group and a carbamoyl group. More preferably, W is a single bond, or a bivalent group as obtained by replacing with a single bond any hydrogen atom of a group selected from among an acyloxy group, an alkylsulfonyl group, an acyl group and an alkoxycarbonyl group.

When $R^1$ to $R^{13}$ represent substituents containing an alcoholic hydroxyl group, the number of carbon atoms contained in each of the substituents is preferably in the range of 2 to 10, more preferably 2 to 6 and further preferably 2 to 4.

Each of the substituents containing an alcoholic hydroxyl group represented by $R^1$ to $R^{13}$ may have two or more alcoholic hydroxyl groups. The number of alcoholic hydroxyl groups contained in each of the substituents containing an alcoholic hydroxyl group represented by $R^1$ to $R^{13}$ is in the range of 1 to 6, preferably 1 to 3 and more preferably 1.

The number of alcoholic hydroxyl groups contained in any of the compounds of the general formula (ZI-4) as the total of those of $R^1$ to $R^{13}$ is in the range of 1 to 10, preferably 1 to 6 and more preferably 1 to 3.

When $R^1$ to $R^{13}$ do not contain any alcoholic hydroxyl group, the substituents of $R^1$ to $R^{13}$ are, for example, a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxy group, an aryloxy group, a silyloxy group, a heterocyclooxy group, an acyloxy group, a carbamoyloxy group, an alkoxycarbonyloxy group, an aryloxycarbonyloxy group, an amino group (containing an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, heterocyclothio group, a sulfamoyl group, a sulfo group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocycloazo group, an imido group, a phosphino group, a phosphynyl group, a phosphynyloxy group, a phosphynylamino group, a phosphono group, a silyl group, a hydrazino group, a ureido group, a boron acid group [$—B(OH)_2$], a phosphato group [$—OPO(OH)_2$], a sulphato group [$—OSO_3H$] or other publicly known compounds.

When $R^1$ to $R^{13}$ do not contain any alcoholic hydroxyl group, each of $R^1$ to $R^{13}$ preferably represents a hydrogen atom, a halogen atom, an alkyl group, a cycloalkyl group, an alkenyl group, a cycloalkenyl group, an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or arylsulfonylamino group, an alkylthio group, an arylthio group, a sulfamoyl group, an alkyl- or arylsulfonyl group, an aryloxycarbonyl group, an alkoxycarbonyl group, a carbamoyl group, an imido group, a silyl group or a ureido group.

When $R^1$ to $R^{13}$ do not contain any alcoholic hydroxyl group, each of $R^1$ to $R^{13}$ more preferably represents a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group or a carbamoyl group.

When $R^1$ to $R^{13}$ do not contain any alcoholic hydroxyl group, especially preferably, each of $R^1$ to $R^{13}$ represents a hydrogen atom, an alkyl group, a cycloalkyl group, a halogen atom or an alkoxy group.

Any two adjacent to each other of $R^1$ to $R^{13}$ may be bonded to each other to thereby form a ring structure. This ring structure includes an aromatic or nonaromatic cyclohydrocarbon or heterocycle. This cyclic structure can form a condensed cycle through further combination.

In general formula (ZI-4), at least one of $R^1$ to $R^{13}$ preferably contains an alcoholic hydroxyl group. More preferably, at least one of $R^9$ to $R^{13}$ contains an alcoholic hydroxyl group.

Z represents a single bond or a bivalent connecting group. The bivalent connecting group is, for example, an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH═CH—, an aminocarbonylamino group, an aminosulfonylamino group or the like.

The bivalent connecting group may have a substituent. As the substituents, there can be mentioned, for example, the same substituents as mentioned with respect to $R^1$ to $R^{13}$.

Preferably, Z is a single bond or a group exhibiting no electron withdrawing properties, such as an alkylene group, an arylene group, an ether group, a thioether group, an amino group, —CH═CH—, an aminocarbonylamino group or an aminosulfonylamino group. More preferably, Z is a single bond, an ether group or a thioether group. Most preferably, Z is a single bond.

Now, general formula (ZII) will be described.

In general formula (ZII), each of $R_{204}$ and $R_{205}$ independently represents an aryl group, an alkyl group or a cycloalkyl group. Substituents may be introduced in these aryl group, alkyl group and cycloalkyl group.

Preferred examples of the aryl groups represented by $R_{204}$ and $R_{205}$ are the same as set forth above in connection with $R_{201}$ to $R_{203}$ of the cations (ZI-1).

As preferred examples of the alkyl groups and cycloalkyl groups represented by $R_{204}$ and $R_{205}$, there can be mentioned the linear, branched or cyclic alkyl groups set forth above in connection with $R_{201}$ to $R_{203}$ of the cations (ZI-2).

Particular examples of the acid generators (B) are shown below, which in no way limit the scope of the present invention. In these examples, the value of volume calculated as a generated acid comprised of an anion moiety and a proton bonded thereto is noted. The calculation method is the same as set forth hereinabove.

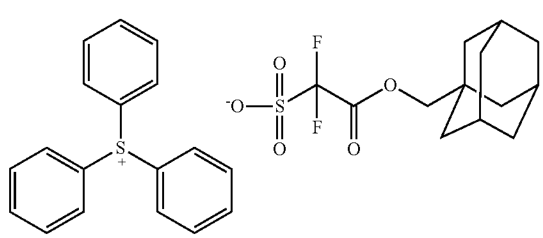

271Å$^3$

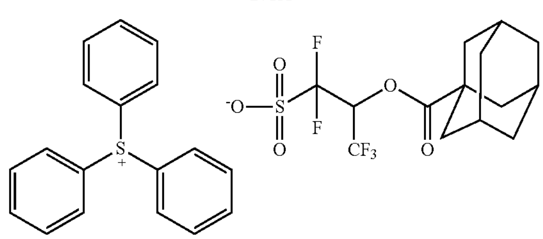

291Å$^3$

-continued

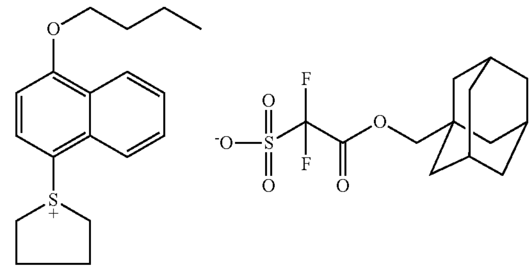

271Å$^3$

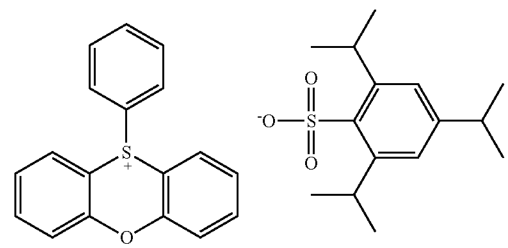

303Å$^3$

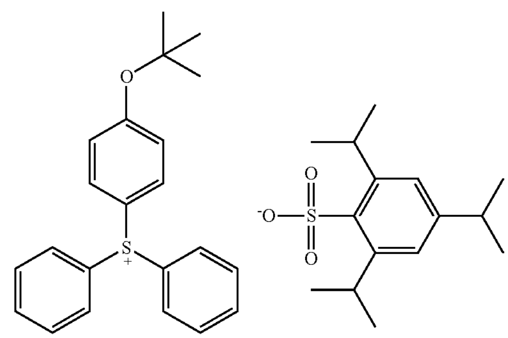

303Å$^3$

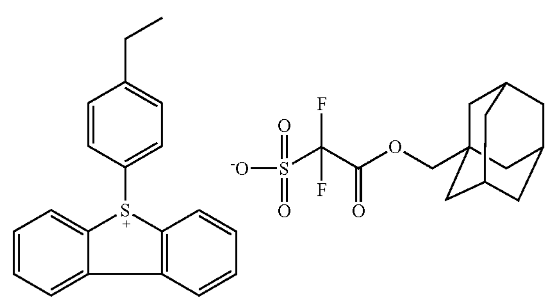

271Å$^3$

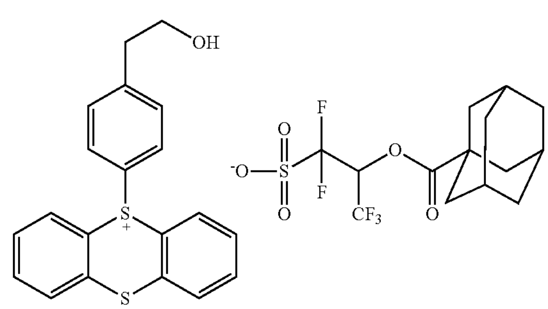

291Å$^3$

-continued

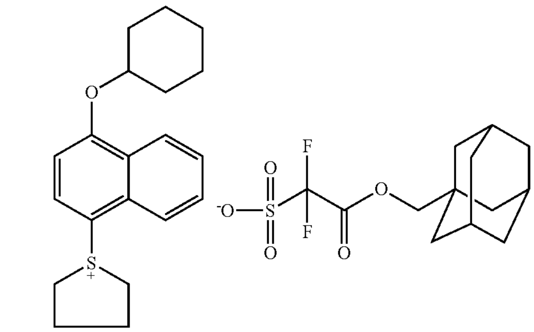

271Å$^3$

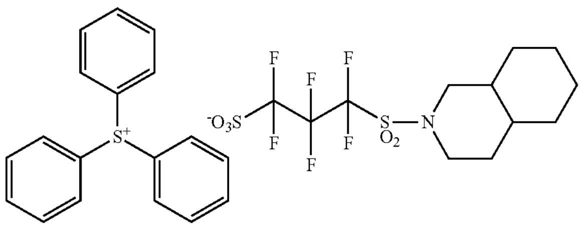

311Å$^3$

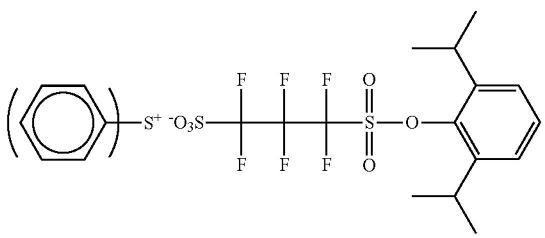

347Å$^3$

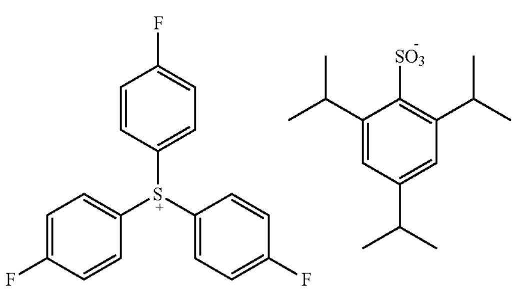

303Å$^3$

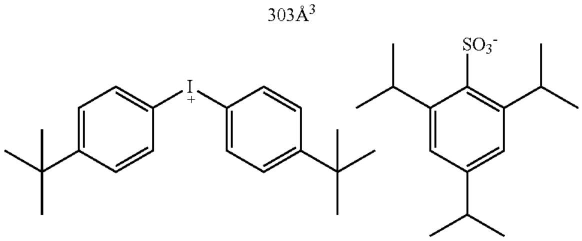

303Å$^3$

Particular examples of the acid generators (C) are shown below, which in no way limit the scope of the present invention. In these examples, the value of volume calculated as a generated acid comprised of an anion moiety and a proton bonded thereto is noted. The calculation method is the same as set forth hereinabove.

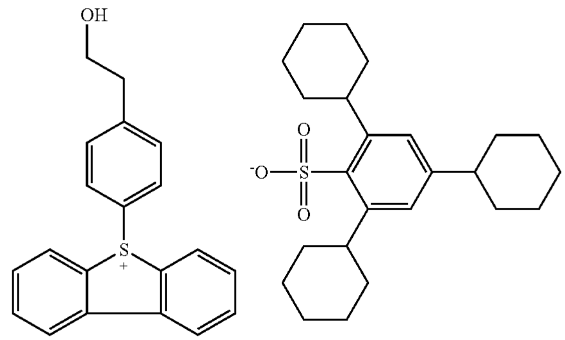

437 Å$^3$

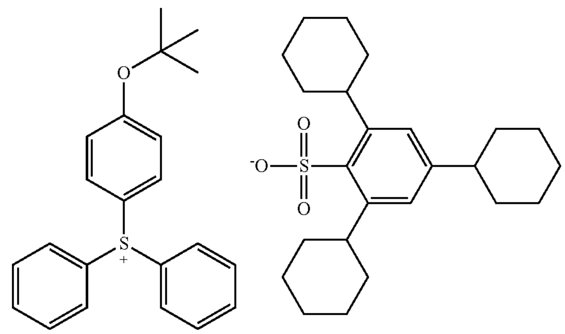

437 Å$^3$

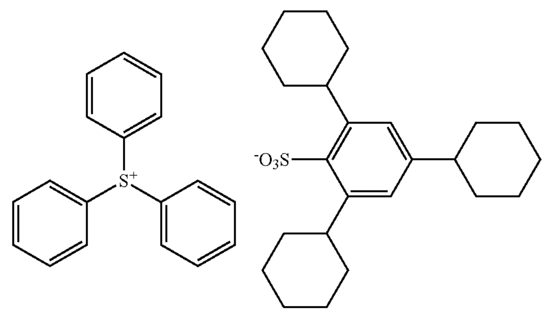

437 Å$^3$

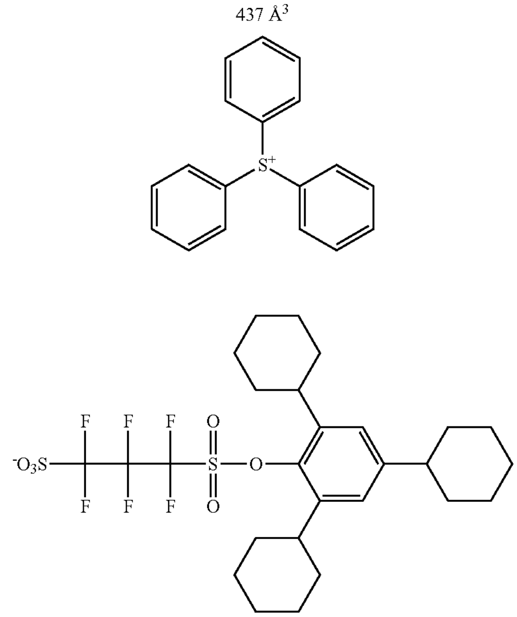

535 Å$^3$

-continued
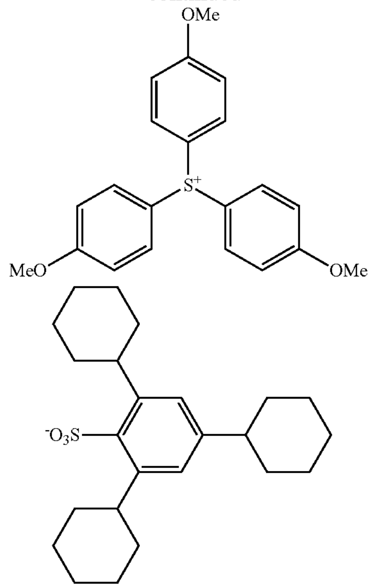
437 Å$^3$
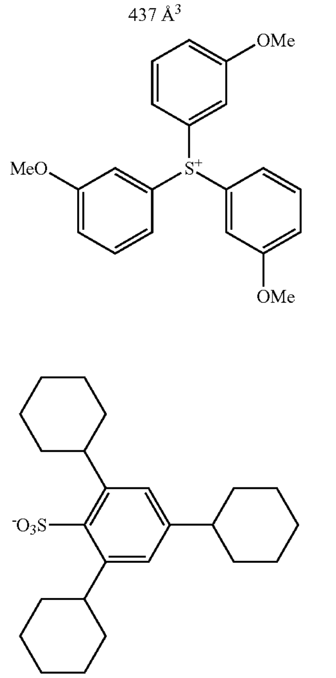
437 Å$^3$
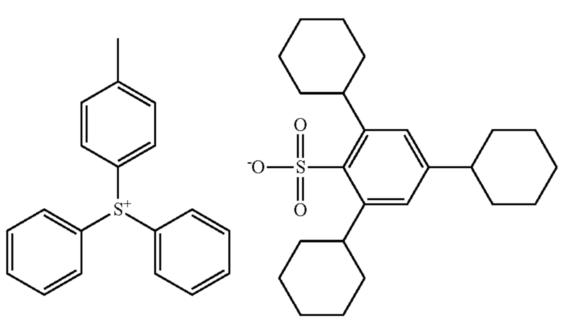
437 Å$^3$
-continued
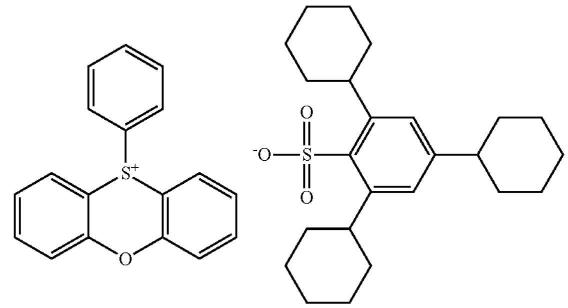
437 Å$^3$
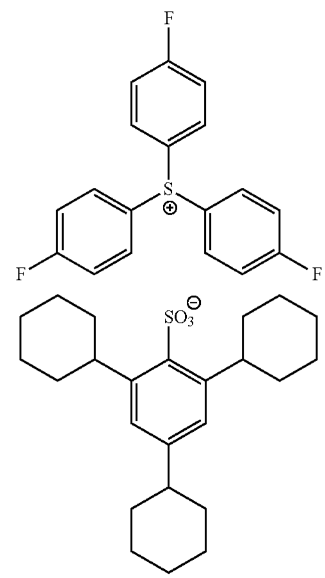
437 Å$^3$
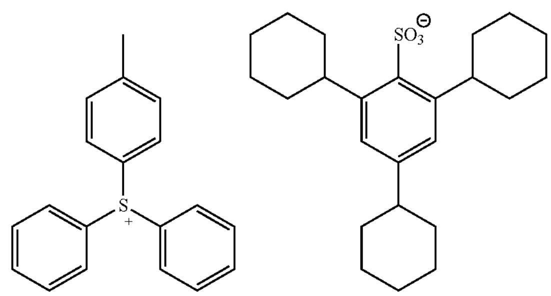
437 Å$^3$
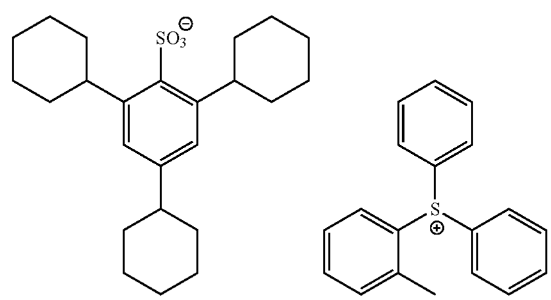
437 Å$^3$
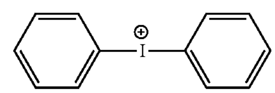

-continued

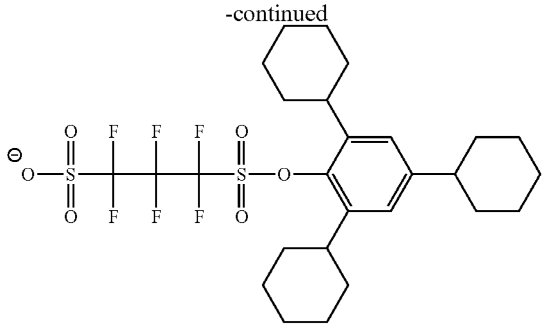

535 Å$^3$

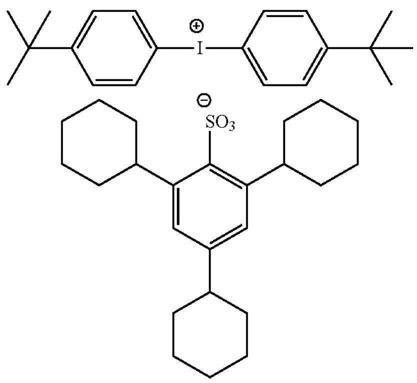

437 Å$^3$

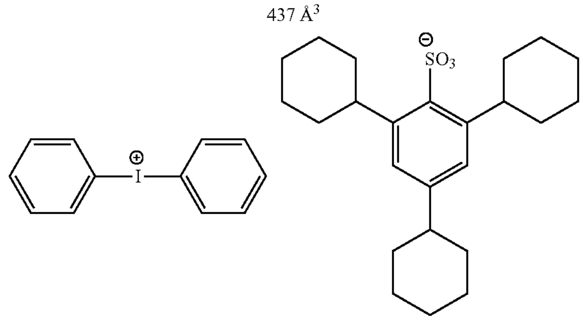

437 Å$^3$

The total content of acid generator (B) and acid generator (C), based on the total solids of the composition of the present invention, is preferably in the range of 5 to 50 mass %, more preferably 8 to 35 mass % and further more preferably 8 to 20 mass %.

The ratio of contained acid generator (B) to acid generator (C), in terms of the total mass of acid generator (B): total mass of acid generator (C), is preferably in the range of 10:90 to 90:10, more preferably 20:80 to 80:20 and further more preferably 30:70 to 70:30.

[Other Acid Generator]

In the present invention, other acid generators may be used in combination with the acid generator (B) and acid generator (C). As such other acid generators usable in combination (hereinafter referred to as, for example, "photoacid generator (D)"), there can be mentioned members appropriately selected from among a photoinitiator for photocationic polymerization, an initiator for photoradical polymerization, a photo-achromatic agent and photo-discoloring agent for dyes, any of heretofore known compounds that when exposed to actinic rays or radiation, generate acids, employed in microresists, etc., and mixtures thereof. For example, there can be mentioned a diazonium salt, a phosphonium salt, a sulfonium salt, an iodonium salt, an imide sulfonate, an oxime sulfonate, diazosulfone, disulfone and o-nitrobenzyl sulfonate.

Nonlimiting particular examples of the acid generators other than the acid generator (B) and acid generator (C) are shown below.

(z1)

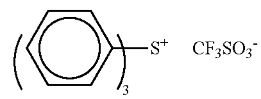

(z2)

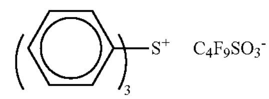

113 Å$^3$ (z3)

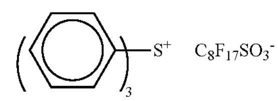

220 Å$^3$ (z4)

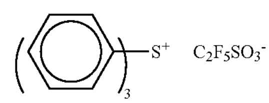

(z5)

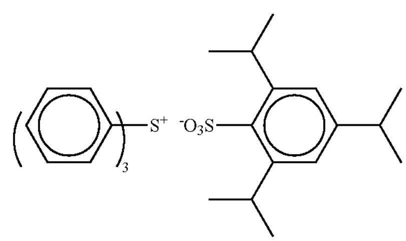

303 Å$^3$ (z6)

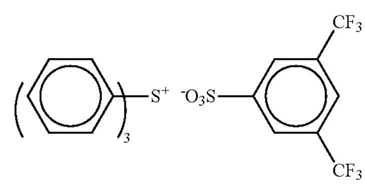

(z7)

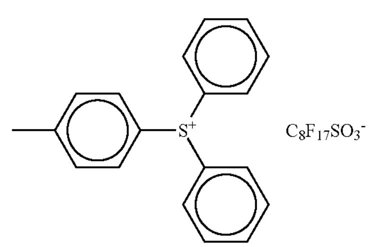

(z8)

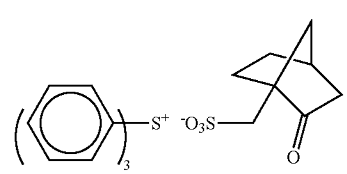

216 Å$^3$

-continued
(z9)
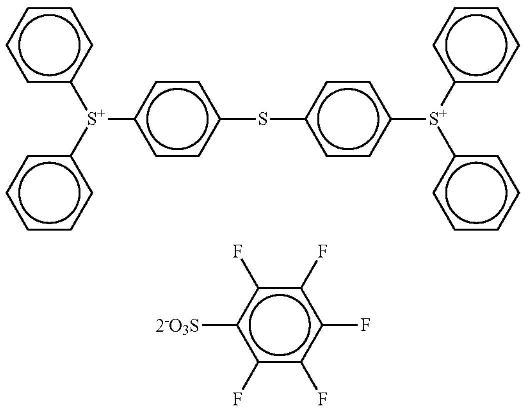
127 Å3
(z10)
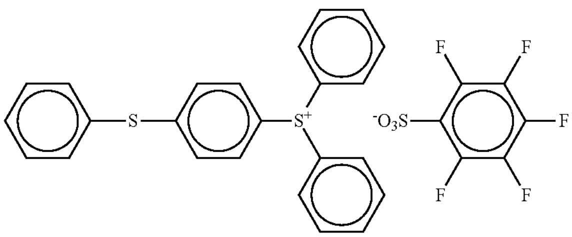
127 Å3
(z11)
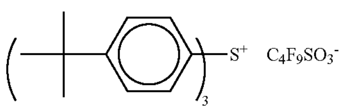
113 Å3
(z12)
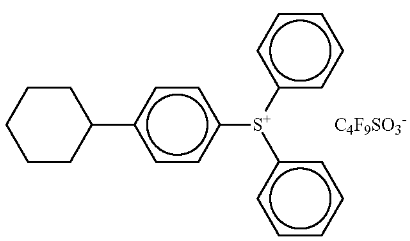
113 Å3
(Z13)
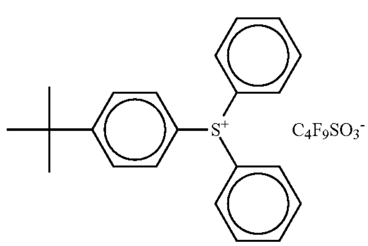
113 Å3
-continued
(z14)
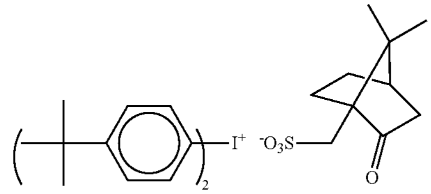
216 Å3
(z15)
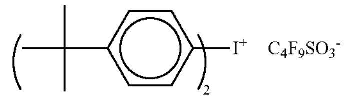
113 Å3
(z16)
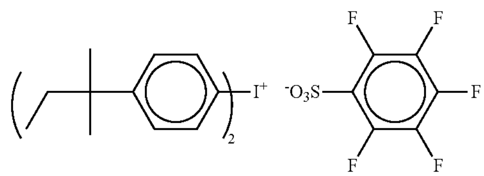
127 Å3
(z17)
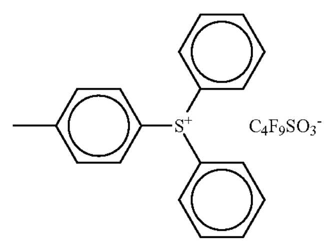
113 Å3
(z18)
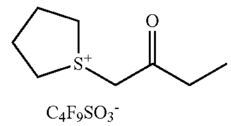
113 Å3
(z19)
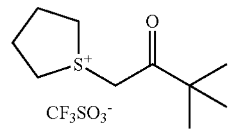
113 Å3
(z20)
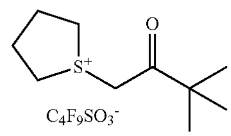
113 Å3
(z21)
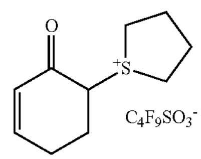
113 Å3

-continued
(z22)
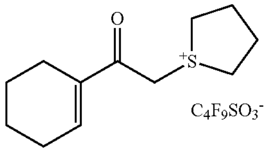
113 Å$^3$
(z23)
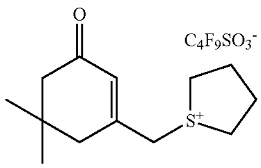
113 Å$^3$
(z24)
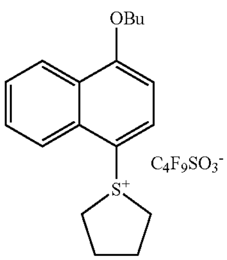
113 Å$^3$
(z25)
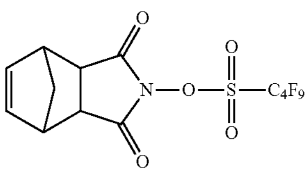
113 Å$^3$
(z26)
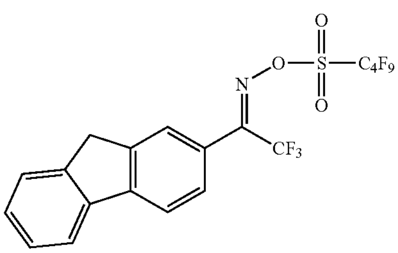
113 Å$^3$
(z27)
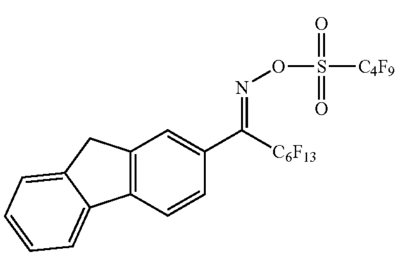
113 Å$^3$
-continued
(z28)
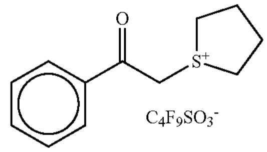
113 Å$^3$
(z29)
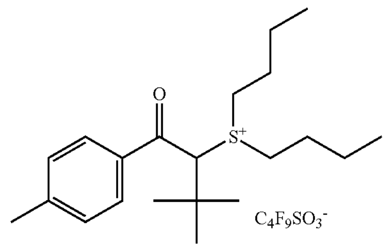
113 Å$^3$
(z30)
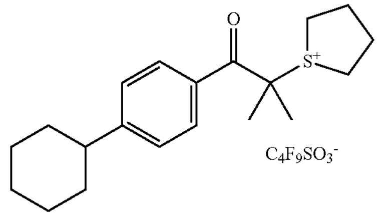
113 Å$^3$
(z31)
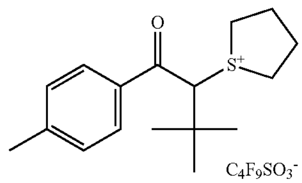
113 Å$^3$
(z32)
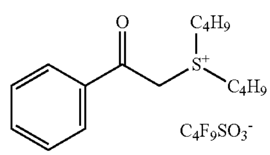
113 Å$^3$
(z33)
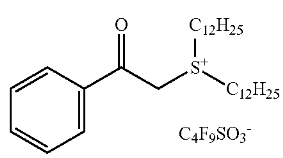
113 Å$^3$
(z34)
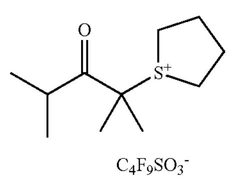
113 Å$^3$ -continued
(z35)
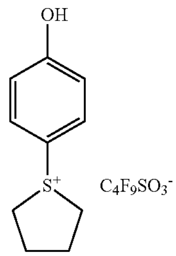
113 Å$^3$
(z36)
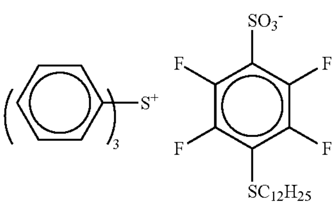
393 Å$^3$
(z37)
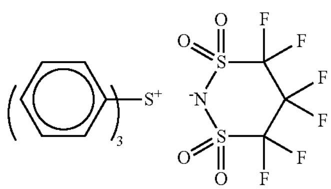
136 Å$^3$
(z38)
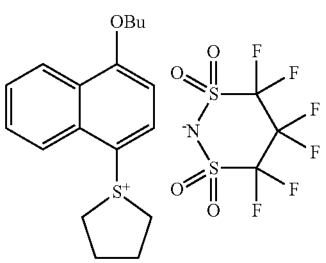
136 Å$^3$
(z39)
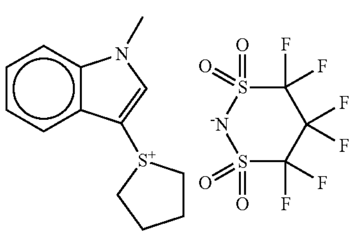
136 Å$^3$
(z40)
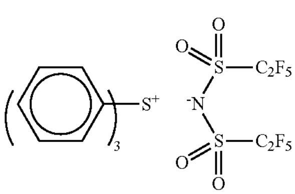
173 Å$^3$
-continued
(z41)
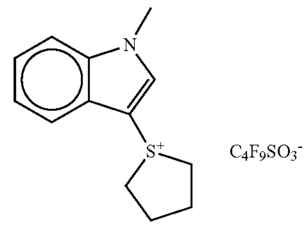
113 Å$^3$
(z42)
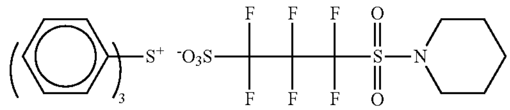
244 Å$^3$
(z43)
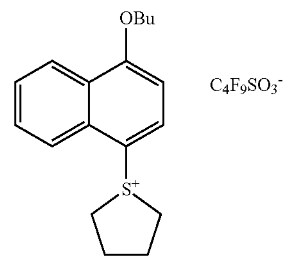
113 Å$^3$
(z44)
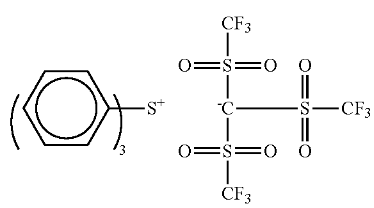
189 Å$^3$
(z45)
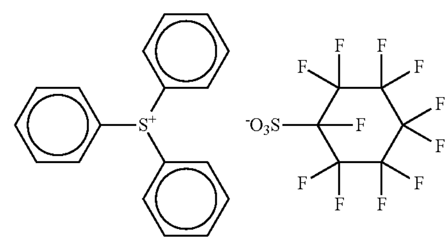
136 Å$^3$
(z46)
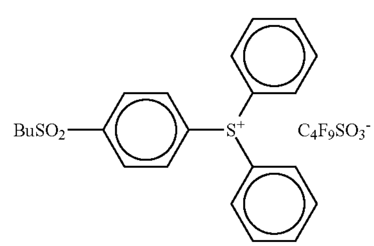
113 Å$^3$ -continued (z47)

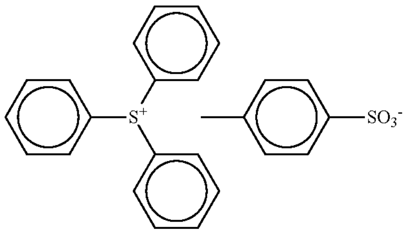

186 Å$^3$ (z48)

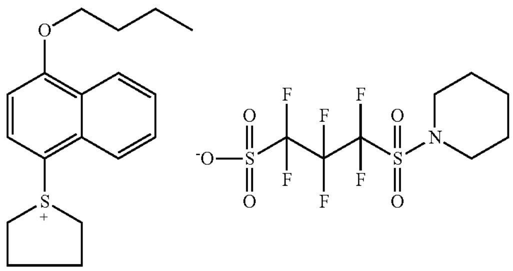

244 Å$^3$ (z49)

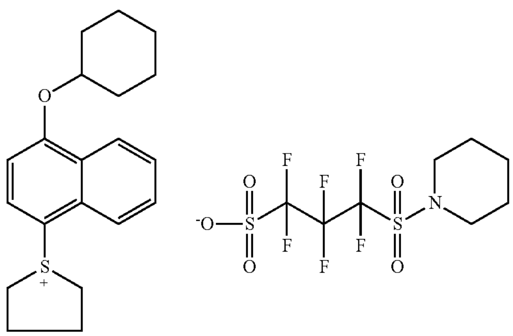

244 Å$^3$ (z50)

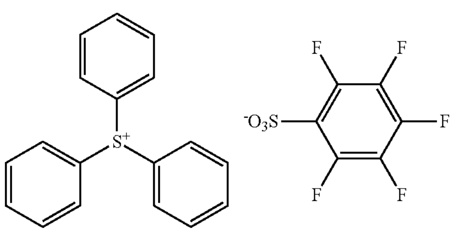

127 Å$^3$ (z51)

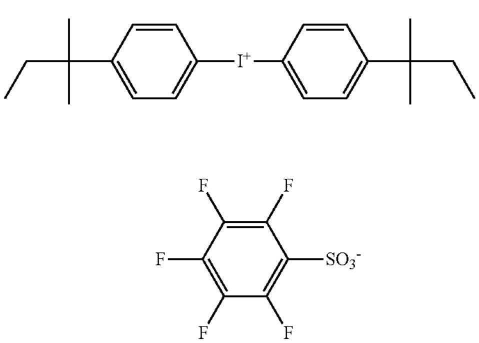

-continued (z52)

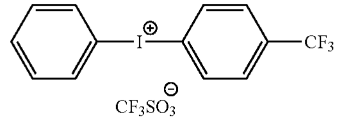

[2] Resin Whose Solubility in an Alkali Developer is Increased Under the Action of an Acid The actinic-ray- or radiation-sensitive resin composition of the present invention comprises, as a resin (hereinafter also referred to as an "acid-decomposable resin") that when acted on by an acid, is decomposed to thereby increase its solubility in an alkali developer, a resin (hereinafter also referred to as a "resin (A)") comprising at least either any of repeating units (I) of general formula (I) below or any of repeating units (II) of general formula (II) below.

(I)

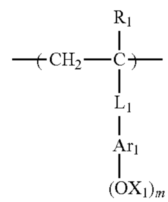

(II)

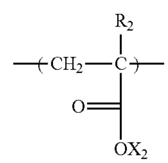

In general formula (I), $R_1$ represents a hydrogen atom or a methyl group. $L_1$ represents a single bond or a bivalent connecting group. $Ar_1$ represents an aromatic connecting group. $X_1$ represents a group leaving when acted on by an acid; and m is an integer of 1 to 3.

In general formula (II), $R_2$ represents a hydrogen atom, a methyl group, a hydroxymethyl group, an alkoxymethyl group or a halogen atom. $X_2$ represents a group leaving when acted on by an acid.

General formula (I) will be described in detail below.

The bivalent connecting group represented by $L_1$ can be, for example, an alkylene group (preferably having 1 to 15 carbon atoms, such as a methylene group or an ethylene group), a cycloalkylene group (preferably having 5 to 15 carbon atoms), an arylene group (preferably having 6 to 14 carbon atoms), —O—, —NH—, —C(═O)— or a combination of two or more of these groups.

It is preferred for $L_1$ to be a single bond.

The aromatic connecting group represented by $Ar_1$ may be unsubstituted or substituted. For example, an aromatic group having 6 to 14 carbon atoms is preferred. As $Ar_1$, there can be mentioned, for example, a phenylene group, a naphthylene group, a biphenylene group or the like. A phenylene group is especially preferred.

As the group leaving when acted on by an acid, represented by $X_1$, there can be mentioned, for example, any of groups of the formulae —C($R_{36}$)($R_{37}$)($R_{38}$), —C(═O)—O—C($R_{36}$)($R_{37}$)($R_{38}$), —C($R_{01}$)($R_{02}$)($OR_{39}$), —C($R_{01}$)($R_{02}$)—C(═O)—O—C($R_{36}$)($R_{37}$)($R_{38}$) and —CH($R_{36}$)(Ar).

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to thereby form a ring structure.

Each of $R_{01}$ and $R_{02}$ independently represents a hydrogen atom, an alkyl group, a cycloalkyl group, an aryl group, an aralkyl group or an alkenyl group.

Ar represents an aryl group.

Each of the alkyl groups represented by $R_{36}$ to $R_{39}$, $R_{01}$ and $R_{02}$ preferably has 1 to 8 carbon atoms. For example, there can be mentioned a methyl group, an ethyl group, a propyl group, an n-butyl group, a sec-butyl group, a hexyl group or an octyl group.

Each of the cycloalkyl groups represented by $R_{36}$ to $R_{39}$, $R_{01}$ and $R_{02}$ may be monocyclic or polycyclic. When the cycloalkyl group is monocyclic, it is preferably a cycloalkyl group having 3 to 8 carbon atoms. As such, there can be mentioned, for example, a cyclopropyl group, a cyclobutyl group, a cyclopentyl group, a cyclohexyl group or a cyclooctyl group. When the cycloalkyl group is polycyclic, it is preferably a cycloalkyl group having 6 to 20 carbon atoms. As such, there can be mentioned, for example, an adamantyl group, a norbornyl group, an isobornyl group, a camphonyl group, a dicyclopentyl group, an α-pinanyl group, a tricyclodecanyl group, a tetracyclododecyl group or an androstanyl group. With respect to these, the carbon atoms of each of the cycloalkyl groups may be partially replaced with a heteroatom, such as an oxygen atom.

Each of the aryl groups represented by $R_{36}$ to $R_{39}$, $R_{01}$, $R_{02}$ and Ar is preferably one having 6 to 10 carbon atoms. For example, there can be mentioned a phenyl group, a naphthyl group or an anthryl group.

Each of the aralkyl groups represented by $R_{36}$ to $R_{39}$, $R_{01}$ and $R_{02}$ is preferably an aralkyl group having 7 to 12 carbon atoms. Preferred aralkyl groups are, for example, a benzyl group, a phenethyl group and a naphthylmethyl group.

Each of the alkenyl groups represented by $R_{36}$ to $R_{39}$, $R_{01}$ and $R_{02}$ is preferably one having 2 to 8 carbon atoms. For example, there can be mentioned a vinyl group, an allyl group, a butenyl group, or a cyclohexenyl group.

The ring formed by the mutual bonding of $R_{36}$ and $R_{37}$ may be monocyclic or polycyclic. The monocyclic structure is preferably a cycloalkane structure having 3 to 8 carbon atoms. As such, there can be mentioned, for example, a cyclopropane structure, a cyclobutane structure, a cyclopentane structure, a cyclohexane structure, a cycloheptane structure or a cyclooctane structure. The polycyclic structure is preferably a cycloalkane structure having 6 to 20 carbon atoms. As such, there can be mentioned, for example, an adamantane structure, a norbornane structure, a dicyclopentane structure, a tricyclodecane structure or a tetracyclododecane structure. With respect to these, the carbon atoms of each of the cyclic structures may be partially replaced with a heteroatom, such as an oxygen atom.

Substituents may be introduced in these groups. As the substituents, there can be mentioned, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. Preferably, the number of carbon atoms of each of the substituents is up to 8.

In an aspect of the present invention, it is preferred for at least one group represented by $OX_1$ in general formula (I) to be a group with an acetal structure. More preferably, the group leaving when acted on by an acid, $X_1$, has any of structures of general formula (B) below.

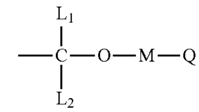

(B)

In the formula, each of $L_1$ and $L_2$ independently represents a hydrogen atom, an alkyl group, a cycloalkyl group, an aryl group or an aralkyl group.

M represents a single bond or a bivalent connecting group.

Q represents an alkyl group, a cycloalkyl group, a cycloaliphatic group, an aromatic ring group, an amino group, an ammonium group, a mercapto group, a cyano group or an aldehyde group. Each of these cycloaliphatic groups and aromatic ring groups may contain a heteroatom.

At least two of Q, M and $L_1$ may be bonded to each other to thereby form a 5-membered or 6-membered ring.

The alkyl groups represented by $L_1$ and $L_2$ are, for example, alkyl groups each having 1 to 8 carbon atoms. As particular examples thereof, there can be mentioned a methyl group, an ethyl group, a propyl group, an n-butyl group, a sec-butyl group, a hexyl group and an octyl group.

The cycloalkyl groups represented by $L_1$ and $L_2$ are, for example, cycloalkyl groups each having 3 to 15 carbon atoms. As particular examples thereof, there can be mentioned a cyclopentyl group, a cyclohexyl group, a norbornyl group and an adamantyl group.

The aryl groups represented by $L_1$ and $L_2$ are, for example, aryl groups each having 6 to 15 carbon atoms. As particular examples thereof, there can be mentioned a phenyl group, a tolyl group, a naphthyl group and an anthryl group.

The aralkyl groups represented by $L_1$ and $L_2$ are, for example, aralkyl groups each having 6 to 20 carbon atoms. As particular examples thereof, there can be mentioned a benzyl group and a phenethyl group.

The bivalent connecting group represented by M is, for example, an alkylene group (e.g., a methylene group, an ethylene group, a propylene group, a butylene group, a hexylene group or an octylene group), a cycloalkylene group (e.g., a cyclopentylene group or a cyclohexylene group), an alkenylene group (e.g., an ethylene group, a propenylene group or a butenylene group), an arylene group (e.g., a phenylene group, a tolylene group or a naphthylene group), —S—, —O—, —CO—, —$SO_2$—, —$N(R_0)$— or a combination of two or more of these groups. $R_0$ represents a hydrogen atom or an alkyl group. The alkyl group represented by $R_0$ is, for example, one having 1 to 8 carbon atoms. As particular examples thereof, there can be mentioned a methyl group, an ethyl group, a propyl group, an n-butyl group, a sec-butyl group, a hexyl group and an octyl group.

The alkyl group and cycloalkyl group represented by Q are the same as mentioned above in connection with $L_1$ and $L_2$.

As the cycloaliphatic group and aromatic ring group represented by Q, there can be mentioned, for example, the cycloalkyl group and aryl group mentioned above as being represented by $L_1$ and $L_2$. Each of the cycloalkyl group and aryl group is preferably a group having 3 to 15 carbon atoms.

As the heteroatom-containing cycloaliphatic group and aromatic ring group represented by Q, there can be mentioned, for example, groups with a heterocyclic structure, such as thiirane, cyclothiorane, thiophene, furan, pyrrole, benzothiophene, benzofuran, benzopyrrole, triazine, imidazole, benzimidazole, triazole, thiadiazole, thiazole and pyrrolidone. However, the heteroatom-containing cycloaliphatic group and aromatic ring group are not limited to these as long as the ring is formed of carbon and a heteroatom, or of heteroatoms only.

As the ring structure that may be formed by the mutual bonding of at least two of Q, M and $L_1$, there can be mentioned, for example, a 5-membered or 6-membered ring structure formed through the formation of a propylene group or a butylene group thereby. The 5-membered or 6-membered ring structure contains an oxygen atom.

Substituents may be introduced in the groups represented by $L_1$, $L_2$, M and Q in general formula (B). As the substituents, there can be mentioned, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. Preferably, the number of carbon atoms of each of the substituents is up to 8.

The groups of the formula -(M-Q) are preferably groups each having 1 to 30 carbon atoms, more preferably 5 to 20 carbon atoms. In particular, from the viewpoint of outgassing suppression, it is preferred for the groups to have each 6 or more carbon atoms.

Nonlimiting particular examples of the repeating units (I) are shown below.

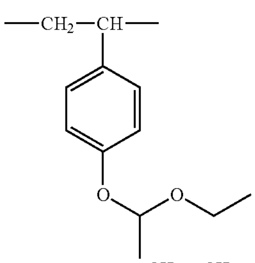

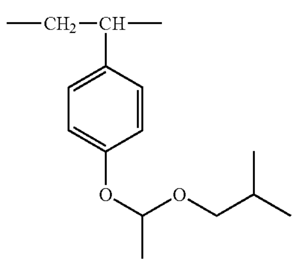

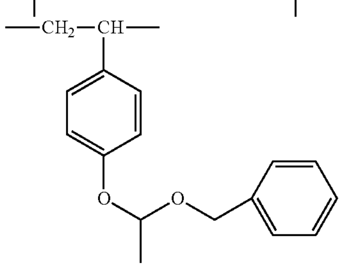

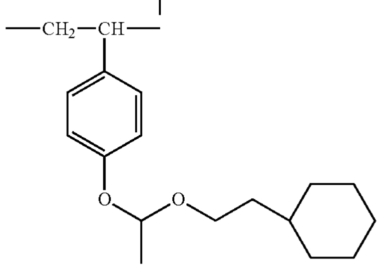

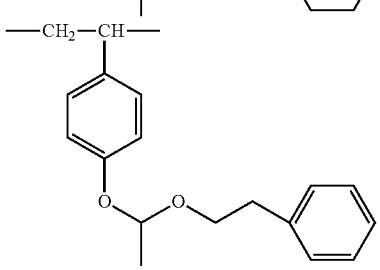

-continued

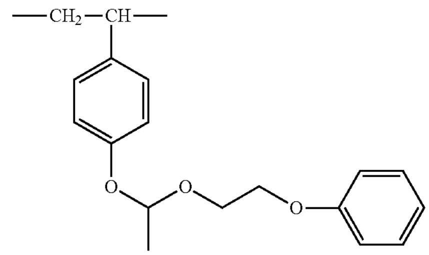

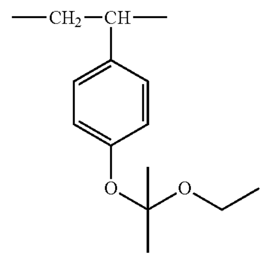

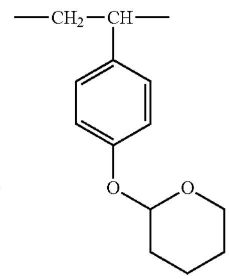

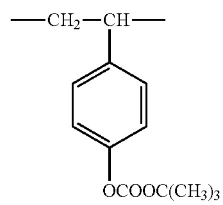

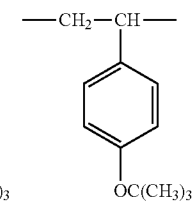

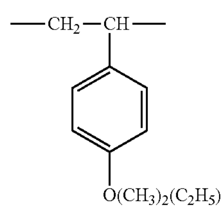

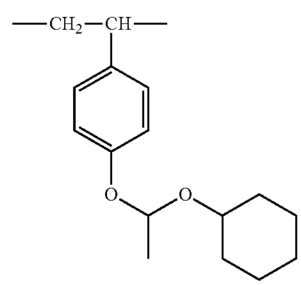

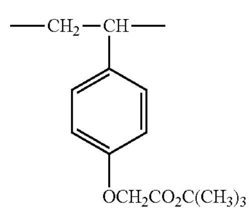

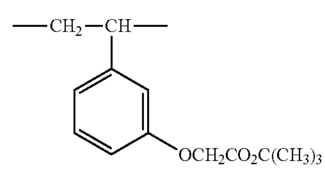

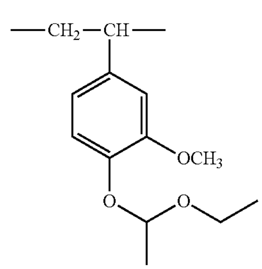

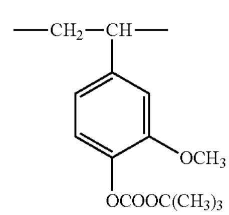

-continued

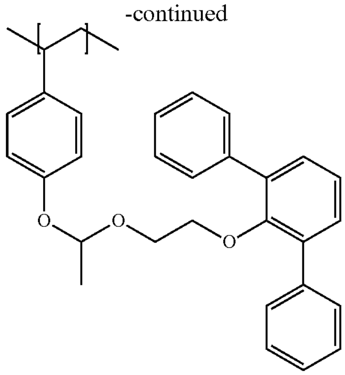

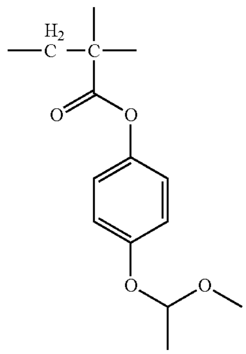

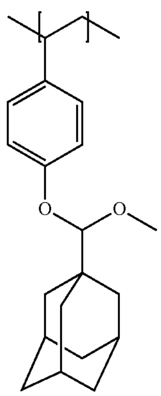

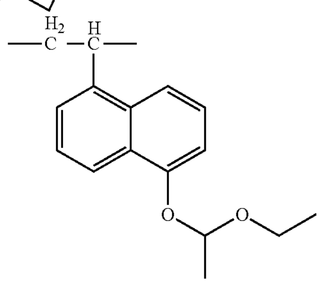

Below, general formula (II) will be described in detail.

As mentioned above, $R_2$ represents a hydrogen atom, a methyl group, a hydroxymethyl group, an alkoxymethyl group or a halogen atom.

The alkoxymethyl group represented by $R_2$ is, for example, one having 2 to 12 carbon atoms. As preferred examples thereof, there can be mentioned a methoxymethyl group, an ethoxymethyl group or the like.

As the halogen atom represented by $R_2$, there can be mentioned a fluorine atom, a chlorine atom, a bromine atom or an iodine atom. A fluorine atom is preferred.

As mentioned above, $X_2$ represents a group leaving when acted on by an acid.

Namely, each of the repeating units (II) of general formula (II) contains the group of the formula "—COOX$_2$" as an acid-decomposable group. $X_2$ is, for example, the same as mentioned above in connection with $X_1$ of general formula (I).

$R_2$ is preferably a hydrocarbon group (preferably 20 or less carbon atoms, more preferably 4 to 12 carbon atoms), more preferably a t-butyl group, a t-amyl group or a hydrocarbon group with an alicyclic structure (for example, an alicyclic group per se or an alkyl group substituted with an alicyclic group).

It is preferred for $R_2$ to be a tertiary alkyl group or a tertiary cycloalkyl group.

The alicyclic structure may be monocyclic or polycyclic. For example, there can be mentioned a monocyclo, bicyclo, tricyclo or tetracyclo structure having 5 or more carbon atoms, or the like. The number of carbon atoms thereof is preferably in the range of 6 to 30, most preferably 7 to 25. A substituent may be introduced in this hydrocarbon group with an alicyclic structure.

Examples of the alicyclic structures are shown below.

(1)

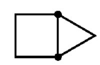

(2)

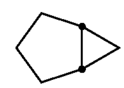

(3)

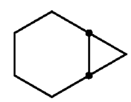

(4)

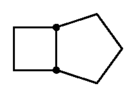

(5)

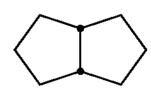

(6)

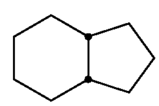

(7)

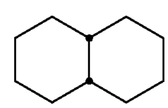

(8)

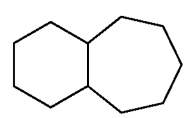

(9)

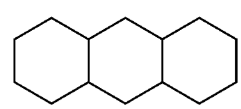

(10)

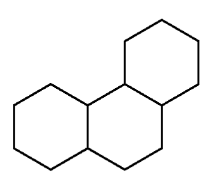

(11)

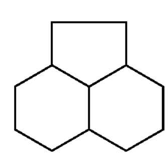

-continued
(12)
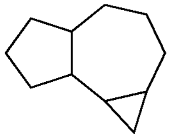
(13)
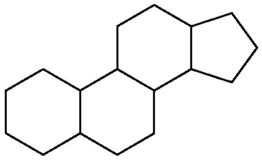
(14)
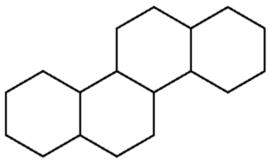
(15)
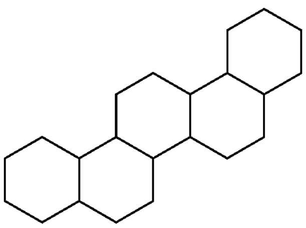
(16)
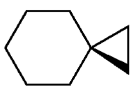
(17)
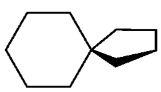
(18)
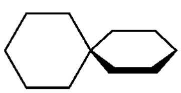
(19)
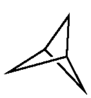
(20)
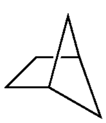
(21)
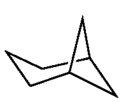
(22)
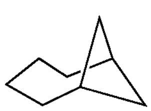
(23)
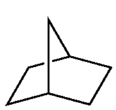
-continued
(24)
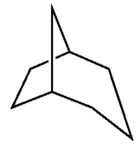
(25)
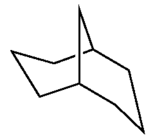
(26)
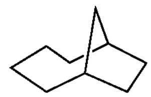
(27)
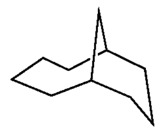
(28)
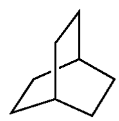
(29)
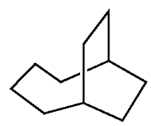
(30)
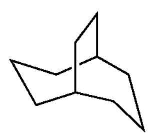
(31)
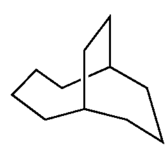
(32)
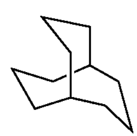
(33)
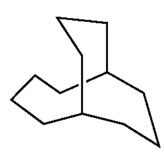
(34)
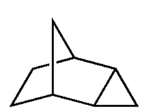

-continued (35)

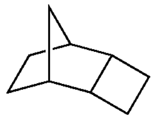

(36)

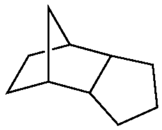

(37)

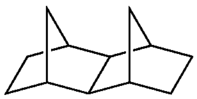

(38)

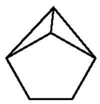

(39)

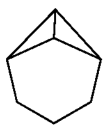

(40)

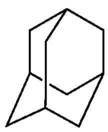

(41)

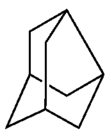

(42)

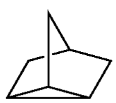

(43)

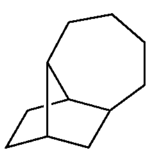

(44)

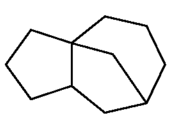

(45)

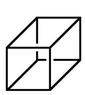

(46)

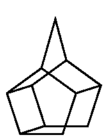

(47)

-continued (48)

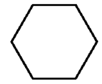

(49)

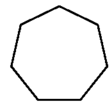

(50)

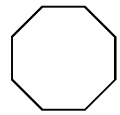

In the present invention, preferred examples of these alicyclic structures include, expressed as monovalent alicyclic groups, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. An adamantyl group, a decalin residue, a norbornyl group, a cedrol group, a cyclohexyl group, a cycloheptyl group, a cyclooctyl group, a cyclodecanyl group and a cyclododecanyl group are more preferred.

As substituents that can be introduced in alicycles of these structures, there can be mentioned an alkyl group, a halogen atom, a hydroxyl group, an alkoxy group, a carboxyl group and an alkoxycarbonyl group. The alkyl group is preferably a lower alkyl group, such as a methyl group, an ethyl group, a propyl group, an isopropyl group or a butyl group. More preferably, the alkyl group is a methyl group, an ethyl group, a propyl group or an isopropyl group. As the alkoxy group, there can be mentioned one having 1 to 4 carbon atoms, such as a methoxy group, an ethoxy group, a propoxy group or a butoxy group. Further substituents may be introduced in these alkyl and alkoxy groups. As further substituents introducible in the alkyl and alkoxy groups, there can be mentioned a hydroxyl group, a halogen atom and an alkoxy group.

The acid-decomposable group with an alicyclic structure is preferably any of those of general formulae (pI) to (pV) below.

(pI)

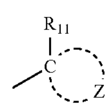

(pII)

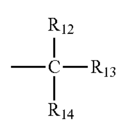

(pIII)

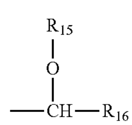

(pIV)

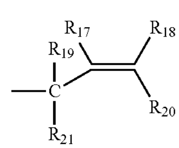

-continued

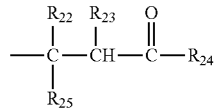

(pV)

In the general formulae (pI) to (pV), $R_{11}$ represents a methyl group, an ethyl group, an n-propyl group, an isopropyl group, an n-butyl group, an isobutyl group or a sec-butyl group, and Z represents an atomic group required for formation of an alicyclic hydrocarbon group in cooperation with a carbon atom.

Each of $R_{12}$ to $R_{16}$ independently represents an alicyclic hydrocarbon group or a linear or branched alkyl group having 1 to 4 carbon atoms, provided that at least one of $R_{12}$ to $R_{14}$ or either $R_{15}$ or $R_{16}$ represents an alicyclic hydrocarbon 1 group.

Each of $R_{17}$ to $R_{21}$ independently represents a hydrogen atom or an alicyclic hydrocarbon group or a linear or branched alkyl group having 1 to 4 carbon atoms, provided that at least one of $R_{17}$ to $R_{21}$ represents an alicyclic hydrocarbon group. Either $R_{19}$ or $R_{21}$ represents an alicyclic hydrocarbon group or a linear or branched alkyl group having 1 to 4 carbon atoms.

Each of $R_{22}$ to $R_{25}$ independently represents a hydrogen atom or an alicyclic hydrocarbon group or a linear or branched alkyl group having 1 to 4 carbon atoms, provided that at least one of $R_{22}$ to $R_{25}$ represents an alicyclic hydrocarbon group. $R_{23}$ and $R_{24}$ may be bonded to each other to thereby form a ring.

In general formulae (pI) to (pV), each of the alkyl groups represented by $R_{12}$ to $R_{25}$ is a linear or branched alkyl group having 1 to 4 carbon atoms, which may be substituted or unsubstituted. As the alkyl group, there can be mentioned, for example, a methyl group, an ethyl group, an n-propyl group, an isopropyl group, an n-butyl group, an isobutyl group, a sec-butyl group, a t-butyl group or the like.

As further substituents introducible in these alkyl groups, there can be mentioned an alkoxy group having 1 to 4 carbon atoms, a halogen atom (a fluorine atom, a chlorine atom, a bromine atom or an iodine atom), an acyl group, an acyloxy group, a cyano group, a hydroxyl group, a carboxyl group, an alkoxycarbonyl group, a nitro group and the like.

As the alicyclic hydrocarbon groups represented by $R_{11}$ to $R_{25}$ and the alicyclic hydrocarbon groups formed by Z and a carbon atom, there can be mentioned those set forth above as alicyclic structures.

It is preferred for the repeating units (II) in one form thereof to be the repeating units of the formula below.

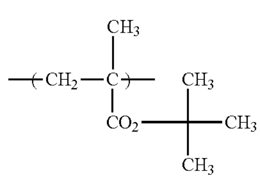

It is preferred for the repeating units (II) in another form thereof to be the repeating units of general formula (IIa) below.

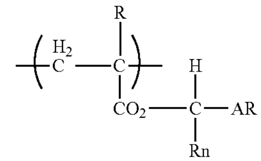

(IIa)

In general formula (IIa),

AR represents an aryl group.

Rn represents an alkyl group, a cycloalkyl group or an aryl group. Rn and AR may be bonded to each other to thereby form a nonaromatic ring.

R represents a hydrogen atom, an alkyl group, a cycloalkyl group, a halogen atom, a cyano group or an alkyloxycarbonyl group.

Below, the repeating units of general formula (IIa) will be described.

As mentioned above, AR represents an aryl group. The aryl group represented by AR is preferably one having 6 to 20 carbon atoms, such as a phenyl group, a naphthyl group, an anthryl group or a fluorene group. An aryl group having 6 to 15 carbon atoms is more preferred.

When AR is a naphthyl group, an anthryl group or a fluorene group, the position of bonding of AR to the carbon atom to which Rn is bonded is not particularly limited. For example, when AR is a naphthyl group, the carbon atom may be bonded to whichever position, α-position or β-position, of the naphthyl group. When AR is an anthryl group, the carbon atom may be bonded to any of the 1-position, 2-position and 9-position of the anthryl group.

One or more substituents may be introduced in each of the aryl groups represented by AR. As particular examples of such substituents, there can be mentioned a linear or branched alkyl group having 1 to 20 carbon atoms, such as a methyl group, an ethyl group, a propyl group, an isopropyl group, an n-butyl group, an isobutyl group, a t-butyl group, a pentyl group, a hexyl group, an octyl group or a dodecyl group; an alkoxy group containing any of these alkyl groups as its part; a cycloalkyl group, such as a cyclopentyl group or a cyclohexyl group; a cycloalkoxy group containing such a cycloalkyl group as its part; a hydroxyl group; a halogen atom; an aryl group; a cyano group; a nitro group; an acyl group; an acyloxy group; an acylamino group; a sulfonylamino group; an alkylthio group; an arylthio group; an aralkylthio group; a thiophenecarbonyloxy group; a thiophenemethylcarbonyloxy group; and a heterocyclic residue, such as a pyrrolidone residue. Among these substituents, a linear or branched alkyl group having 1 to 5 carbon atoms and an alkoxy group containing the alkyl group as its part are preferred. A paramethyl group and a paramethoxy group are more preferred.

When a plurality of substituents are introduced in the aryl group represented by AR, at least two members of the plurality of substituents may be bonded to each other to thereby form a ring. The ring is preferably a 5- to 8-membered one, more preferably a 5- or 6-membered one. Further, this ring may be a heteroring containing a heteroatom, such as an oxygen atom, a nitrogen atom or a sulfur atom, as a ring member.

A substituent may further be introduced in this ring. The substituent is the same as the further substituent mentioned below as being introducible in Rn.

From the viewpoint of roughness performance, it is preferred for each of the repeating units of general formula (A3)

to contain two or more aromatic rings. Generally, the number of aromatic rings introduced in the repeating unit is preferably up to 5, more preferably up to 3.

Also, from the viewpoint of roughness performance, it is preferred for AR of each of the repeating units of general formula (A3) to contain two or more aromatic rings. More preferably, AR is a naphthyl group or a biphenyl group. Generally, the number of aromatic rings introduced in AR is preferably up to 5, more preferably up to 3.

As mentioned above, Rn represents an alkyl group, a cycloalkyl group or an aryl group.

The alkyl group represented by Rn may be in the form of a linear or branched chain. As a preferred alkyl group, there can be mentioned an alkyl group having 1 to 20 carbon atoms, such as a methyl group, an ethyl group, a propyl group, an isopropyl group, an n-butyl group, an isobutyl group, a t-butyl group, a pentyl group, a hexyl group, an octyl group or a dodecyl group. The alkyl group represented by Rn more preferably has 1 to 5 carbon atoms, further more preferably 1 to 3 carbon atoms.

As the cycloalkyl group represented by Rn, there can be mentioned, for example, one having 3 to 15 carbon atoms, such as a cyclopentyl group or a cyclohexyl group.

The aryl group represented by Rn is preferably, for example, one having 6 to 14 carbon atoms, such as a phenyl group, a xylyl group, a tolyl group, a cumenyl group, a naphthyl group or an anthryl group.

Substituents may further be introduced in the alkyl group, cycloalkyl group and aryl group represented by Rn. As such substituents, there can be mentioned, for example, an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and a heterocyclic residue, such as a pyrrolidone residue. Among these substituents, an alkoxy group, a hydroxyl group, a halogen atom, a nitro group, an acyl group, an acyloxy group, an acylamino group and a sulfonylamino group are especially preferred.

As mentioned above, R represents a hydrogen atom, an alkyl group, a cycloalkyl group, a halogen atom, a cyano group or an alkyloxycarbonyl group.

The alkyl group and cycloalkyl group represented by R are, for example, the same as mentioned above in connection with Rn. Substituents may be introduced in the alkyl group and cycloalkyl group. The substituents are, for example, the same as set forth above in connection with Rn.

When R is a substituted alkyl group or cycloalkyl group, it is especially preferred for R to be, for example, a trifluoromethyl group, an alkyloxycarbonylmethyl group, an alkylcarbonyloxymethyl group, a hydroxymethyl group or an alkoxymethyl group.

As the halogen atom represented by R, there can be mentioned a fluorine atom, a chlorine atom, a bromine atom or an iodine atom. A fluorine atom is most preferred.

As the part of alkyl group contained in the alkyloxycarbonyl group represented by R, there can be employed, for example, any of the structures mentioned above as the alkyl group represented by R.

Preferably, Rn and AR are bonded to each other to thereby form a nonaromatic ring. In particular, this can enhance the roughness performance.

The nonaromatic ring that may be formed by the mutual bonding of Rn and AR is preferably a 5- to 8-membered ring, more preferably a 5- or 6-membered ring.

The nonaromatic ring may be an aliphatic ring or a heteroring containing a heteroatom, such as an oxygen atom, a nitrogen atom or a sulfur atom, as a ring member.

A substituent may be introduced in the nonaromatic ring. The substituent is, for example, the same as the further substituent mentioned above as being introducible in Rn.

Nonlimiting particular examples of the repeating units (II) and monomers corresponding to the repeating units (II) are shown below.

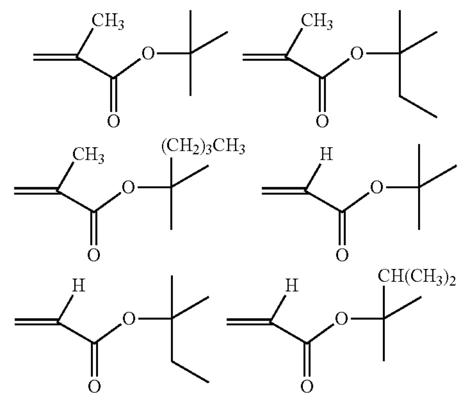

1

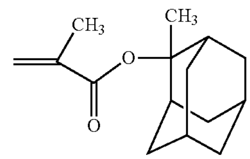

2

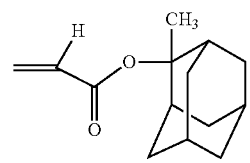

3

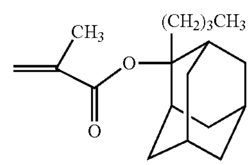

4

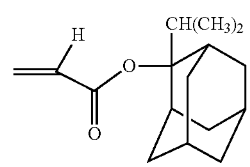

5

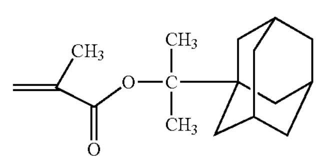

6

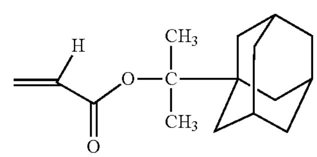

-continued
7
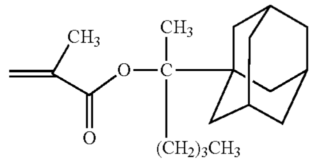
8
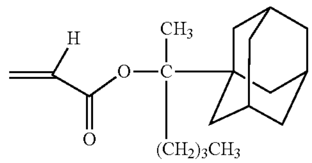
9
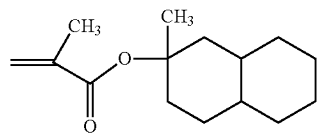
10
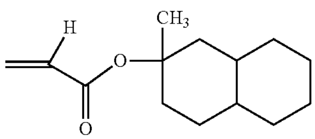
11
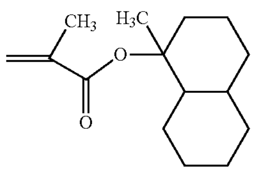
12
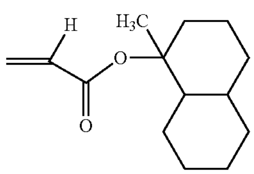
13
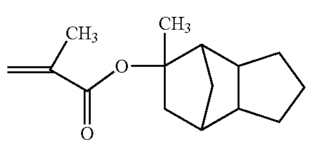
14
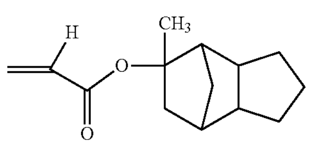
15
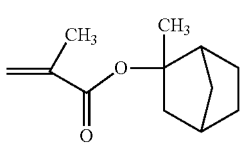
16
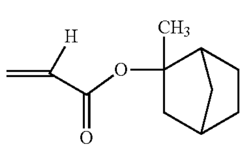
-continued
17
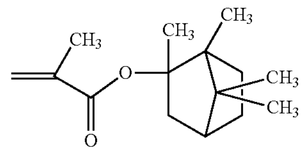
18
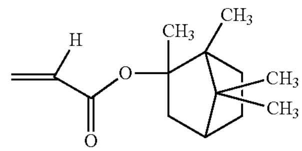
19
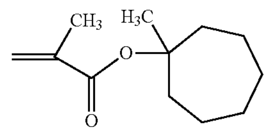
20
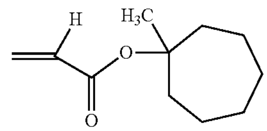
21
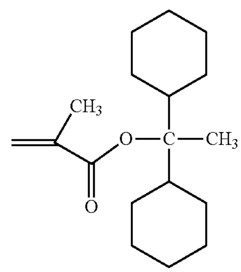
22
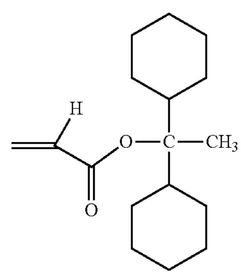
23
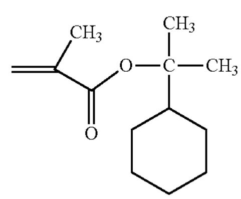
24
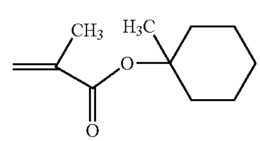
25
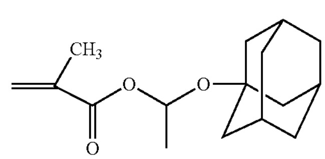

-continued
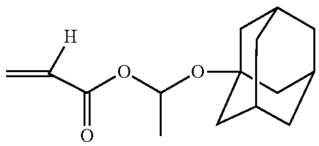
26
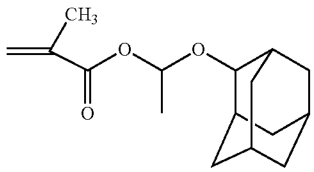
27
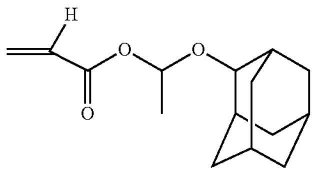
28
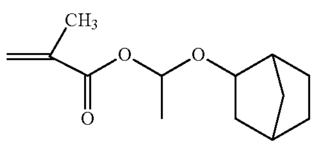
29
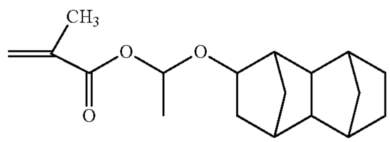
30
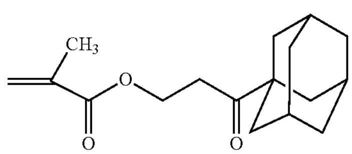
31
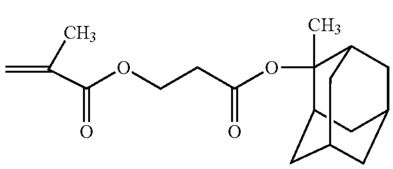
32
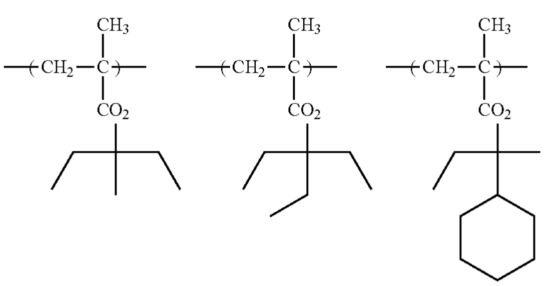
-continued
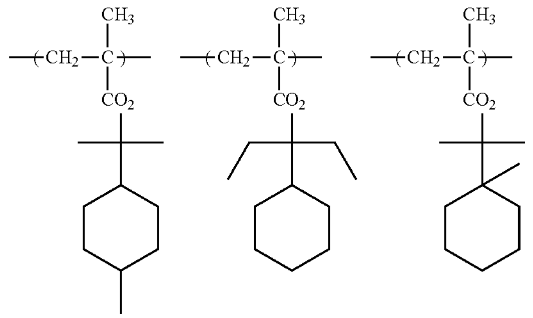
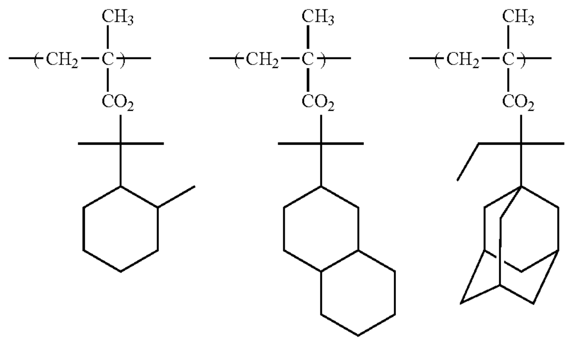
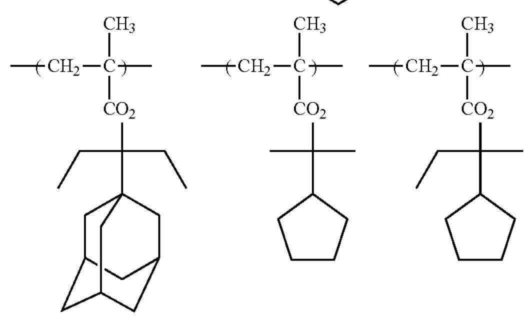
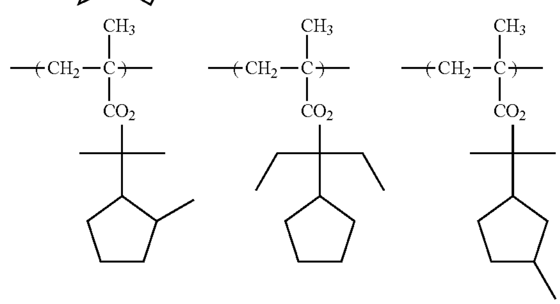
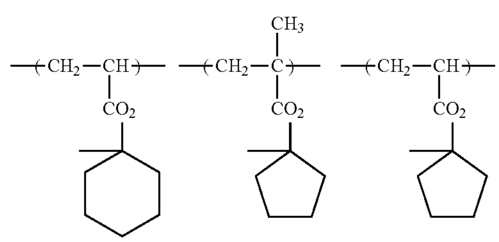
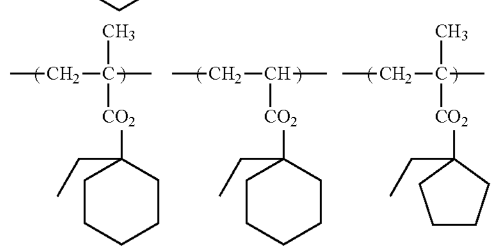

-continued
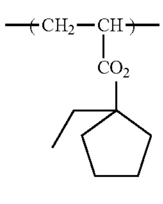
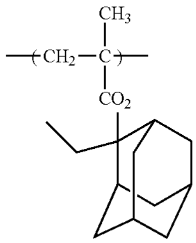
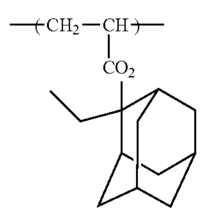
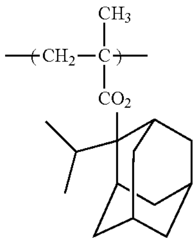
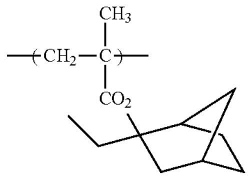
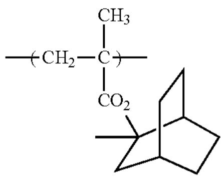
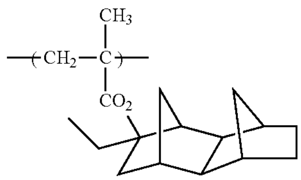
Nonlimiting particular examples of the structures of repeating units of general formula (IIa) are shown below.
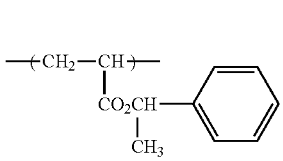
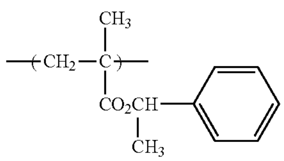
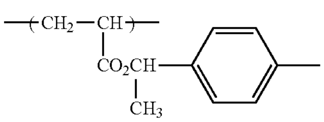
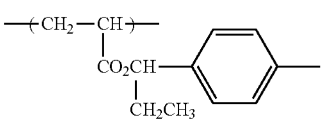
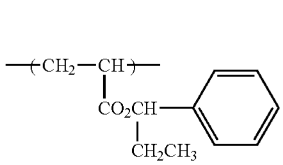
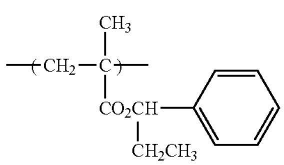
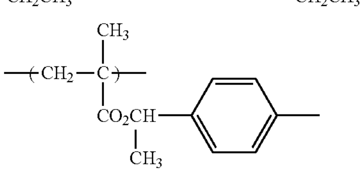
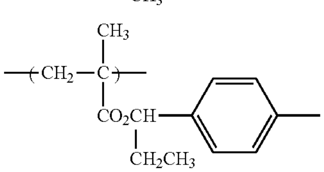
-continued
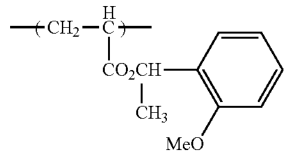
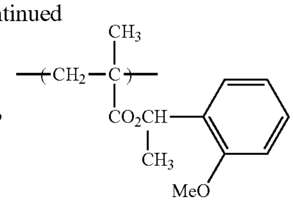
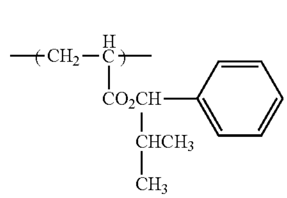
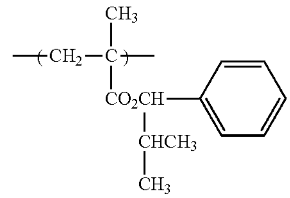
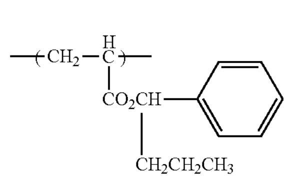
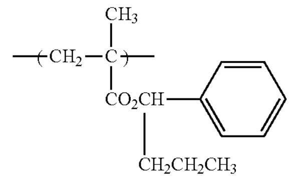
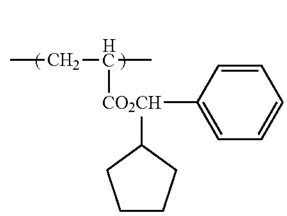
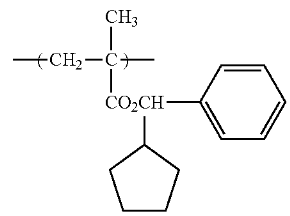
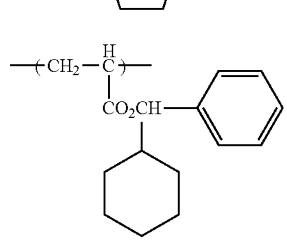
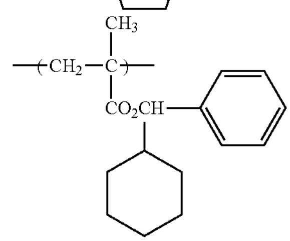
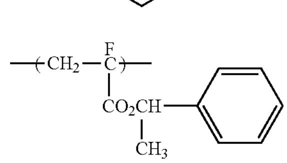
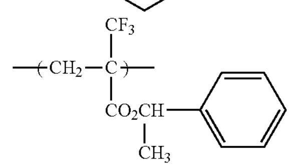
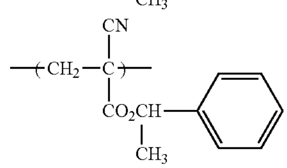
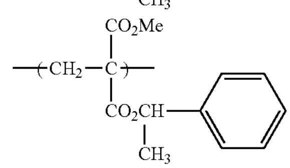
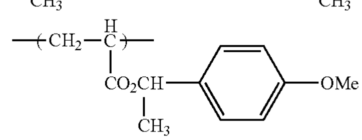
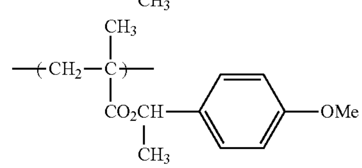
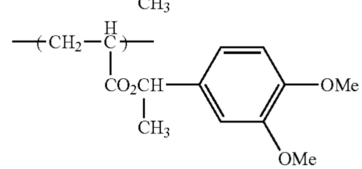

-continued
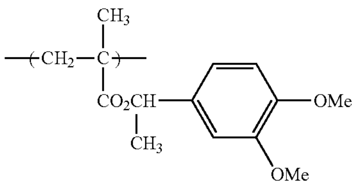
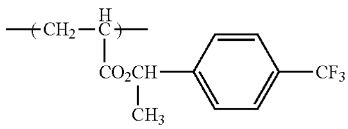
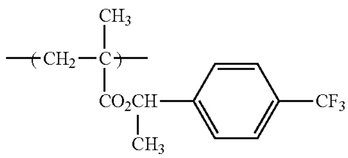
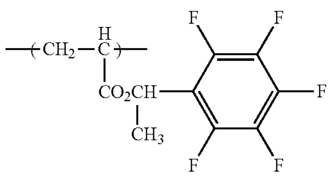
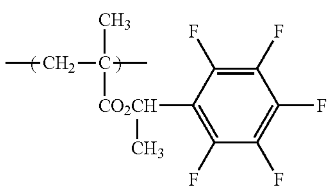
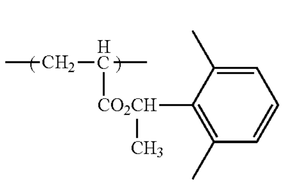
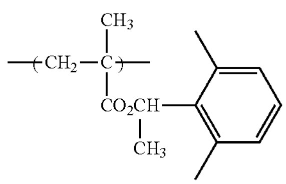
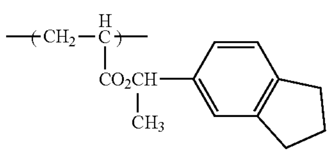
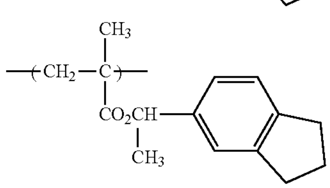
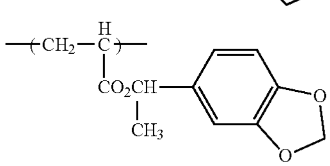
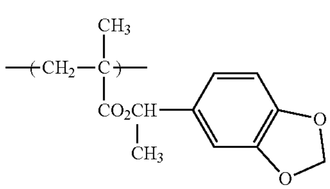
-continued
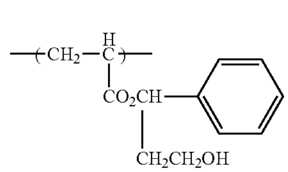
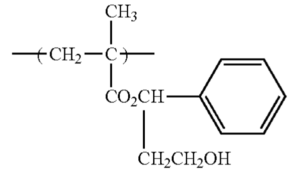
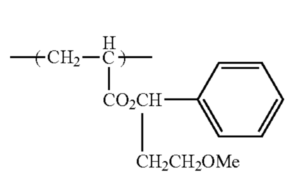
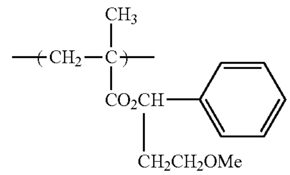
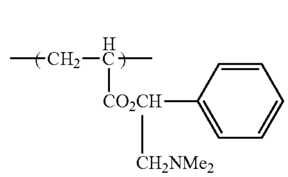
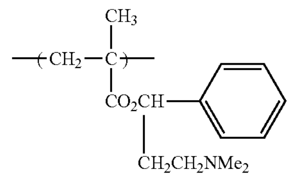
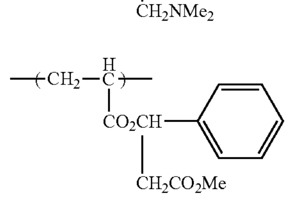
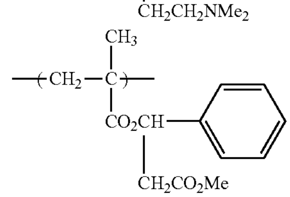
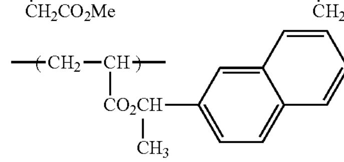
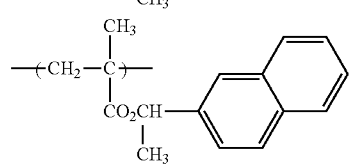
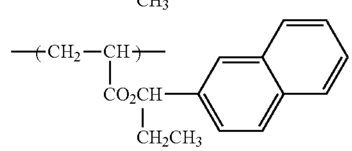
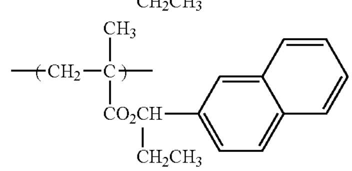
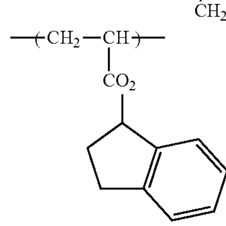
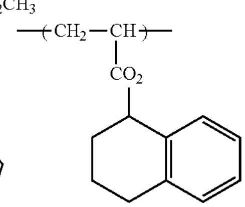
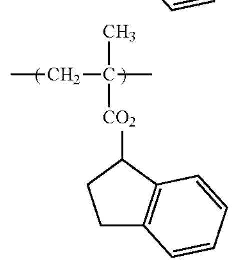
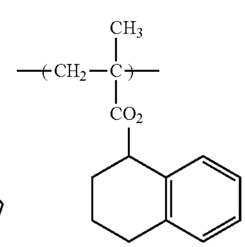

-continued
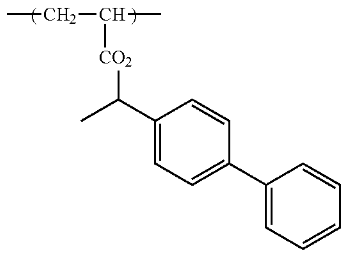
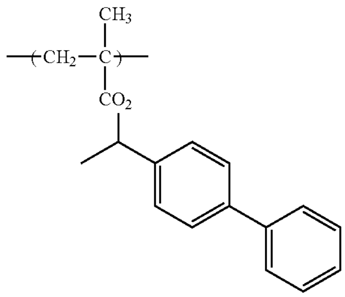
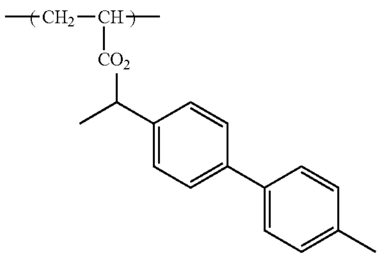
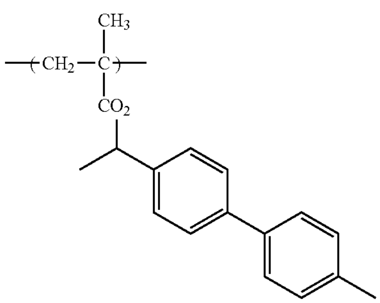
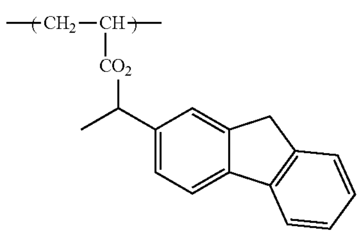
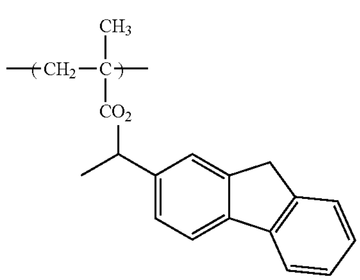
-continued
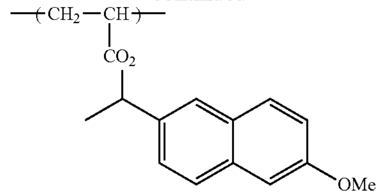
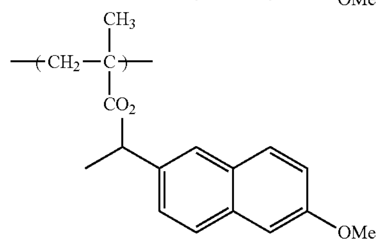
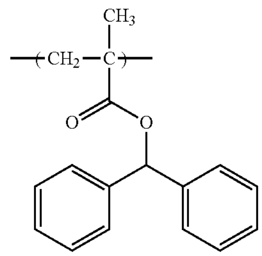
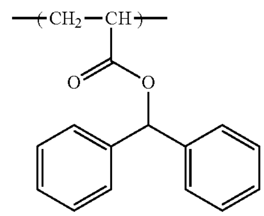
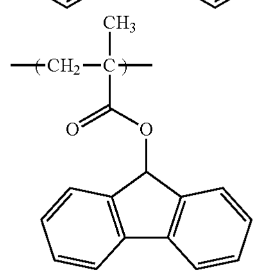
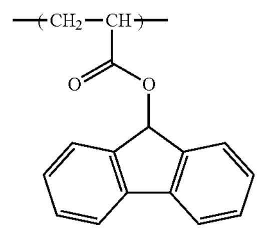
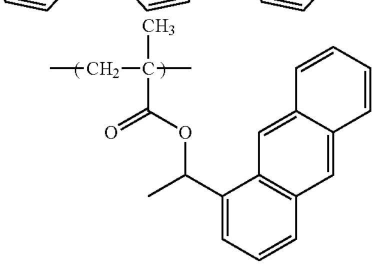
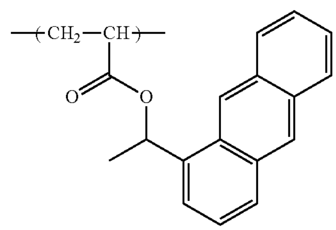
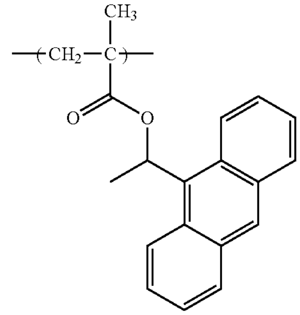

-continued
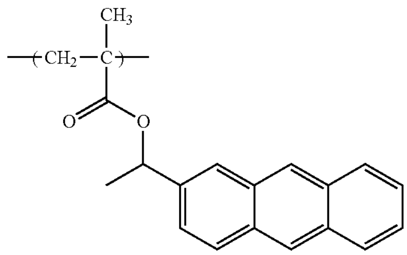
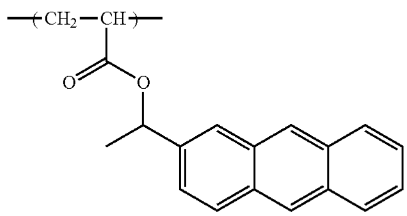
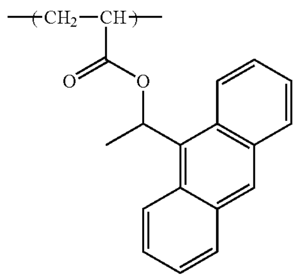
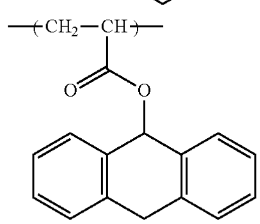
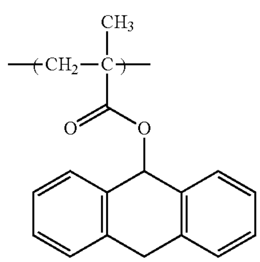
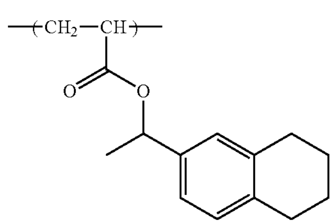
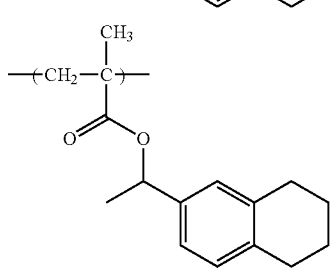
-continued
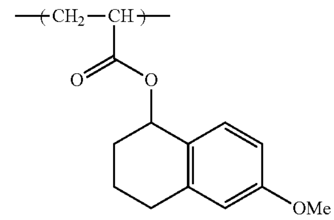
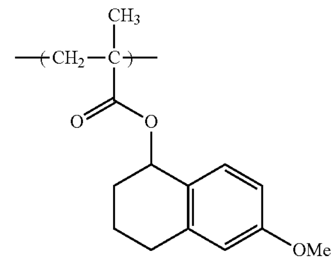
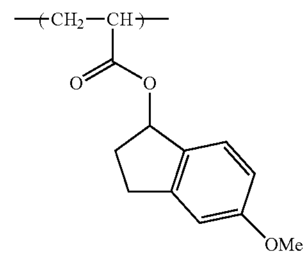
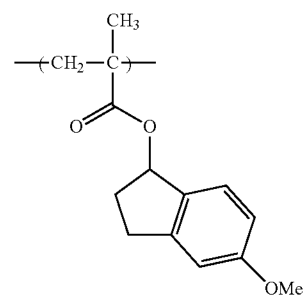
Among these, the repeating units below are especially preferred.
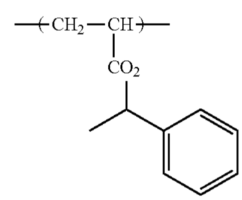
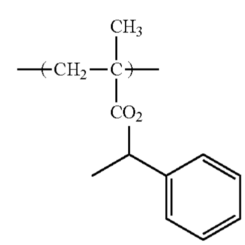
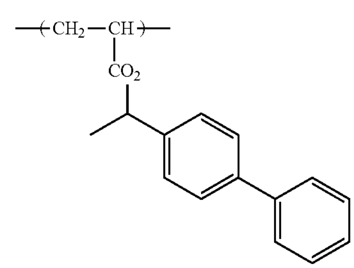

-continued
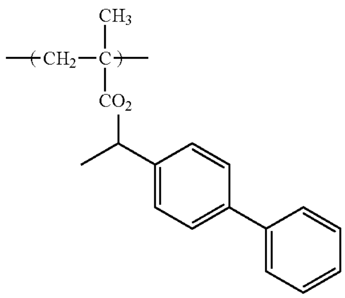
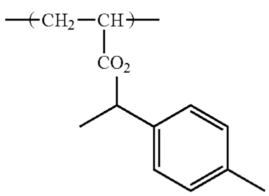
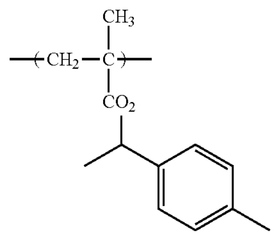
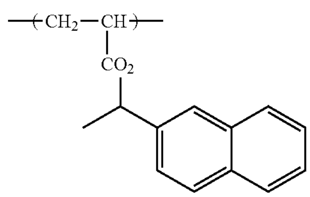
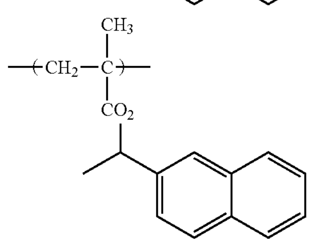
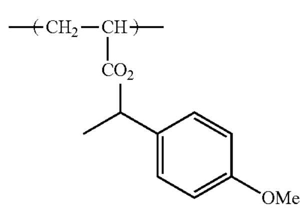
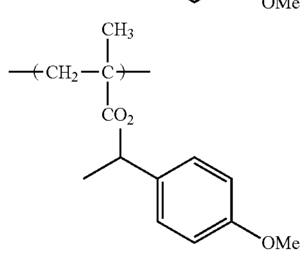
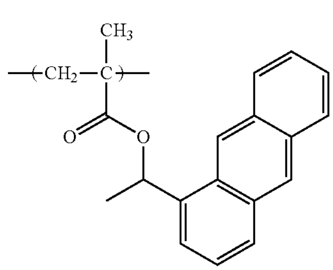
-continued
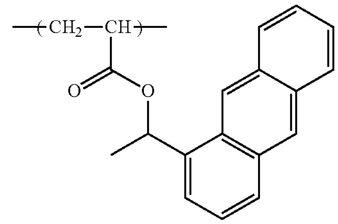
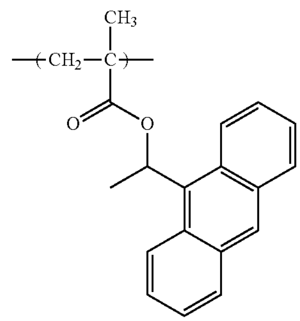
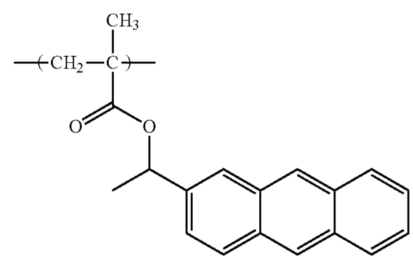
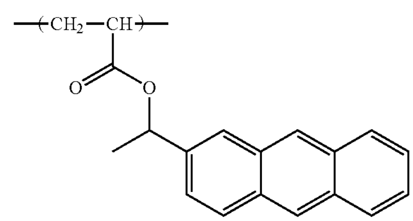
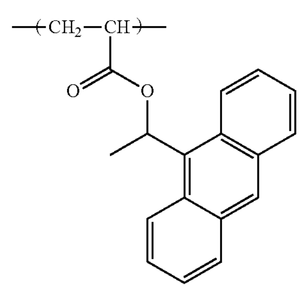
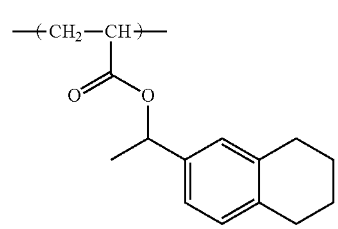

-continued

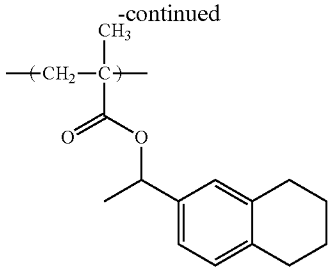

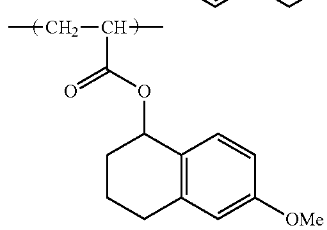

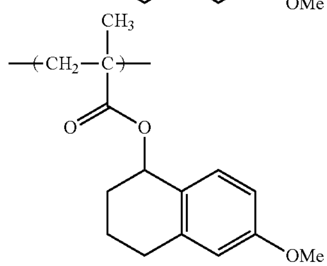

In some aspects, it is preferred for the repeating units (II) to be those of t-butyl methacrylate and ethylcyclopentyl methacrylate.

The monomers corresponding to the repeating units of general formula (A2) can be synthesized by performing an esterification between (meth)acrylic chloride and an alcohol compound in a solvent, such as THF, acetone or methylene chloride, in the presence of a basic catalyst, such as triethylamine, pyridine or DBU. Alternatively, commercially available monomers may be used.

In an aspect of the present invention, it is preferred for the resin (A) to further comprise any of repeating units (III) of general formula (III) below.

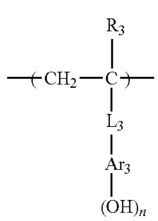

(III)

In general formula (III), $R_3$ represents a hydrogen atom or a methyl group. $L_3$ represents a single bond or a bivalent connecting group. $Ar_3$ represents an aromatic connecting group, and n is an integer of 1 to 3.

Particular examples of the bivalent connecting groups represented by $L_3$ are, for example, the same as set forth above in connection with $L_1$ in general formula (I).

Preferably, $L_3$ is a single bond.

The aromatic connecting group represented by $Ar_3$ may be unsubstituted or substituted. Particular examples thereof are, for example, the same as those of the aromatic groups represented by $Ar_1$ in general formula (I) above. The aromatic connecting group is most preferably a phenylene group.

Examples of the repeating units (III) are shown below.

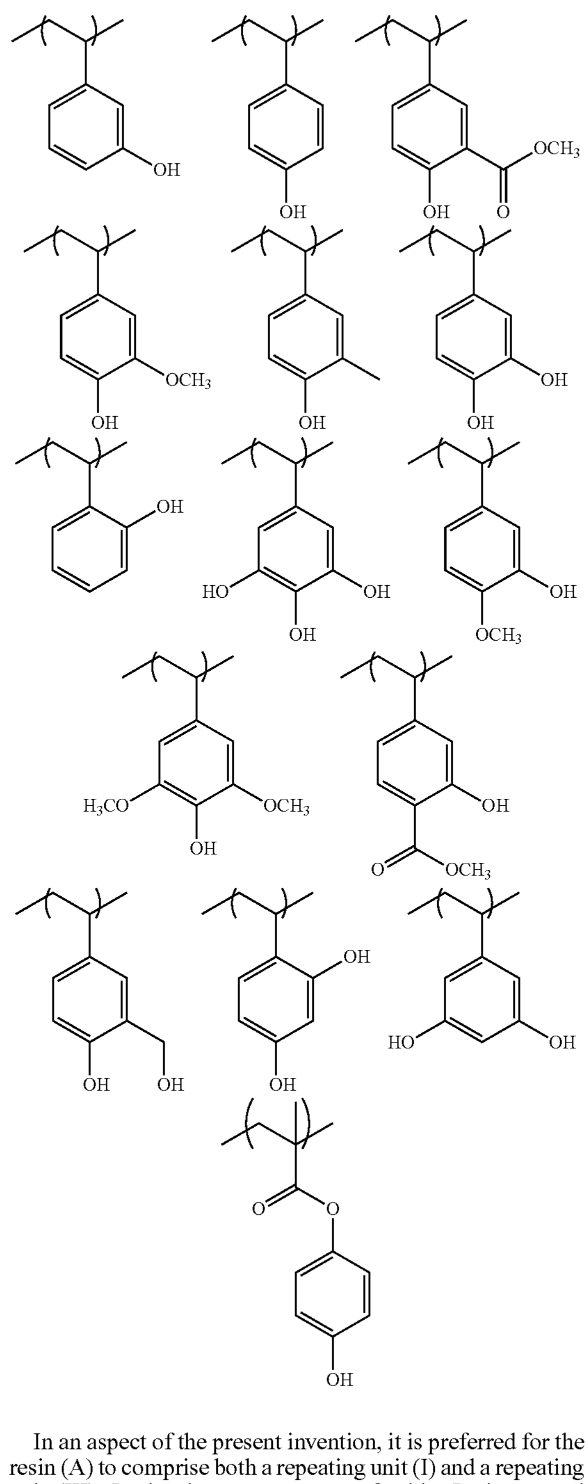

In an aspect of the present invention, it is preferred for the resin (A) to comprise both a repeating unit (I) and a repeating unit (III). In that instance, more preferably, $L_1$ in general formula (I) and $L_3$ in general formula (III) are simultaneously single bonds.

The resin for use in the present invention may comprise, as a repeating unit containing an acid-decomposable group, a repeating unit (I) only, or a repeating unit (II) only, or both a repeating unit (I) and a repeating unit (II).

The content of repeating unit (I) or (II) (total content when both a repeating unit (I) and a repeating unit (II) are contained) in the resin (A) is preferably in the range of 5 to 50 mol %, more preferably 8 to 45 mol % and most preferably 10 to 40 mol %, based on all the repeating units of the resin.

The content of repeating unit (III) in the resin (A) is preferably in the range of 50 to 90 mol %, more preferably 55 to 90 mol % and most preferably 60 to 90 mol %, based on all the repeating units of the resin.

The resin (A) may further comprise any of repeating units of general formula (X) below.

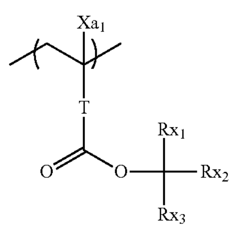

(X)

In general formula (X), $Xa_1$ represents a hydrogen atom, a methyl group, a trifluoromethyl group or a hydroxymethyl group.

T represents a single bond or a bivalent connecting group.

Each of $Rx_1$ to $Rx_3$ independently represents a linear or branched alkyl group or a monocyclic or polycyclic alkyl group. At least two of $Rx_1$ to $Rx_3$ may be bonded to each other to thereby form a monocyclic or polycyclic alkyl group.

As the bivalent connecting group represented by T, there can be mentioned, for example, an alkylene group, a group of the formula —COO-Rt-, a group of the formula —O-Rt- and the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a $—CH_2—$ group or $—(CH_2)_3—$ group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocyclic alkyl group, such as a cyclopentyl group or a cyclohexyl group, or a polycyclic alkyl group, such as a norbornyl group, a tetracyclodecanyl group, a tetracyclododecanyl group or an adamantyl group.

The cycloalkyl group formed by bonding of at least two of $Rx_1$ to $Rx_3$ is preferably a monocyclic alkyl group, such as a cyclopentyl group or a cyclohexyl group, or a polycyclic alkyl group, such as a norbornyl group, a tetracyclodecanyl group, a tetracyclododecanyl group or an adamantyl group.

In a preferred mode, $Rx_1$ is a methyl group or an ethyl group, and $Rx_2$ and $Rx_3$ are bonded to each other to thereby form any of the above-mentioned cycloalkyl groups.

Specific examples of the repeating units of general formula (X) will be shown below, which however in no way limit the scope of the present invention.

In the following formulae, Rx represents H, $CH_3$, $CF_3$ or $CH_2OH$. Each of Rxa and Rxb independently represents an alkyl group having 1 to 4 carbon atoms.

1

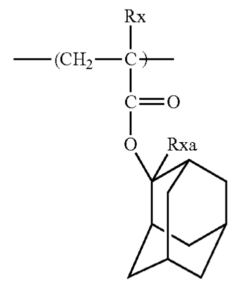

2

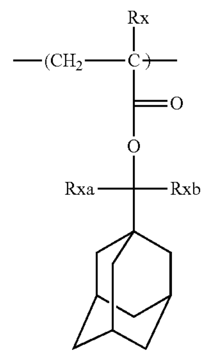

3

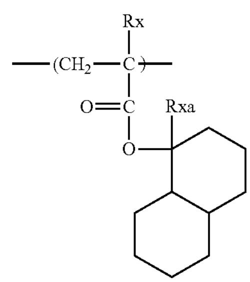

4

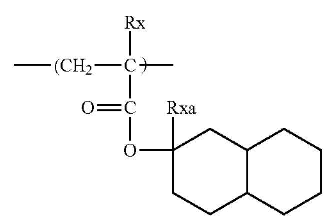

5

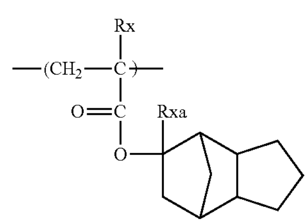

6

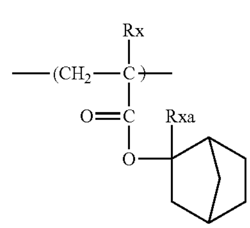

-continued
7
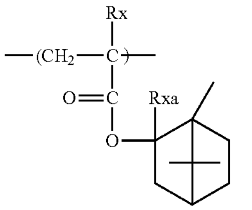
8
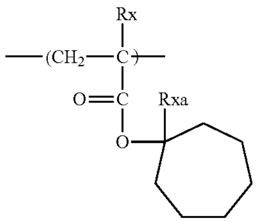
9
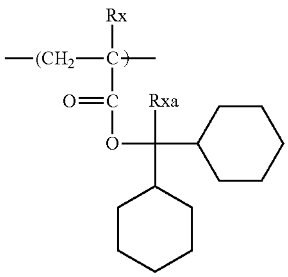
10
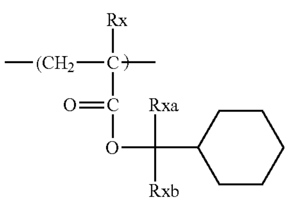
11
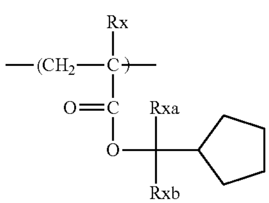
12
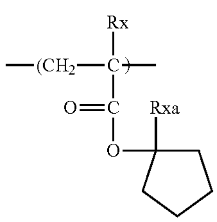
13
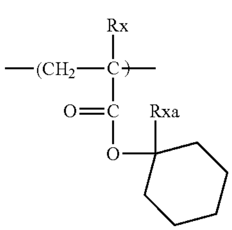
-continued
14
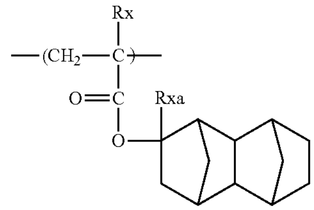
15
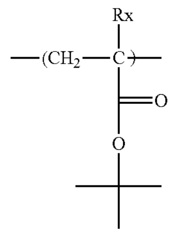
16
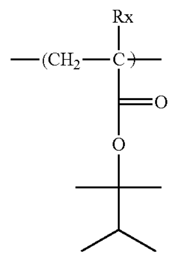
17
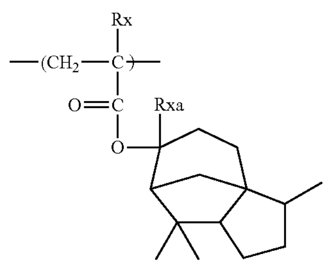
18
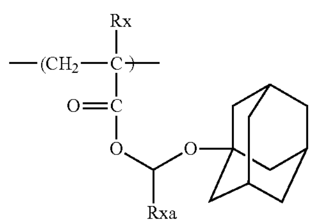
19
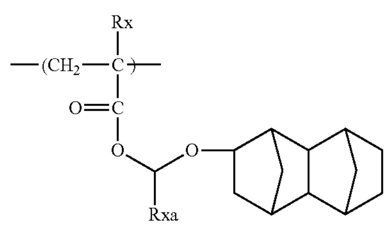
20
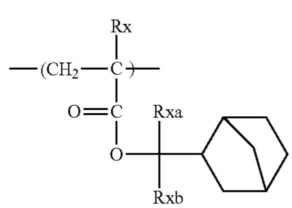

-continued

21

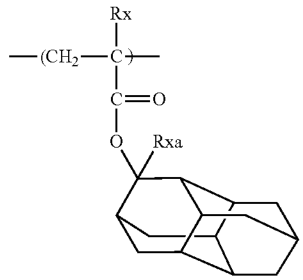

22

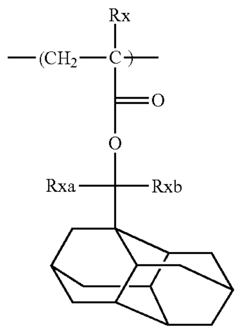

23

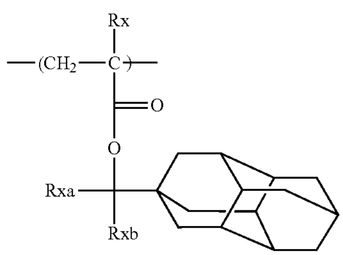

24

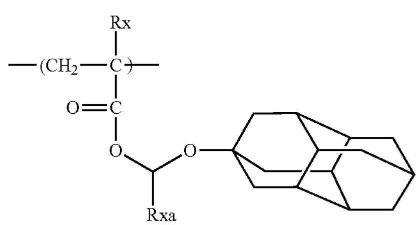

25

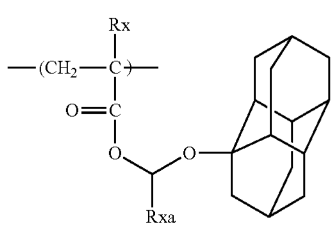

The content of repeating unit expressed by general formula (X) in the resin (A), based on all the repeating units of the resin, is preferably in the range of 3 to 90 mol %, more preferably 5 to 80 mol % and most preferably 7 to 70 mol %.

The content of group decomposable by the action of an acid is calculated by the formula B/(B+S) wherein B refers to the number of groups decomposable by the action of an acid in a resin and S refers to the number of alkali-soluble groups not protected by any group leaving under the action of an acid. The content is preferably in the range of 0.01 to 0.7, more preferably 0.05 to 0.50 and further more preferably 0.05 to 0.40.

When the composition of the present invention is to be exposed to an ArF excimer laser light, it is preferred for the resin to have a monocyclic or polycyclic aliphatic hydrocarbon structure. Hereinafter, this resin is referred to as an "alicyclic hydrocarbon based acid-decomposable resin."

Preferably, the alicyclic hydrocarbon based acid-decomposable resin is a resin comprising at least one member selected from the group consisting of repeating units with the partial structures containing alicyclic hydrocarbons expressed by general formulae (pI) to (pV) below and repeating units of general formula (II-AB) below.

(pI)

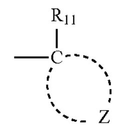

(pII)

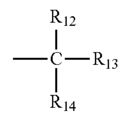

(pIII)

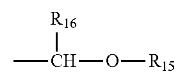

(pIV)

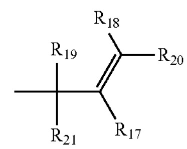

(pV)

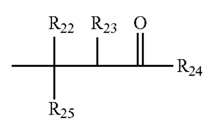

In general formulae (pI) to (pV), $R_{11}$ represents a methyl group, an ethyl group, an n-propyl group, an isopropyl group, an n-butyl group, an isobutyl group or a sec-butyl group, and Z represents an atomic group required for formation of a cycloalkyl group in cooperation with a carbon atom.

Each of $R_{12}$ to $R_{16}$ independently represents a linear or branched alkyl group having 1 to 4 carbon atoms or a cycloalkyl group, provided that at least one of $R_{12}$ to $R_{14}$ represents a cycloalkyl group and at least either $R_{15}$ or $R_{16}$ represents a cycloalkyl group.

Each of $R_{17}$ to $R_{21}$ independently represents a hydrogen atom or a cycloalkyl group or a linear or branched alkyl group having 1 to 4 carbon atoms, provided that at least one of $R_{17}$ to $R_{21}$ represents a cycloalkyl group and at least either $R_{19}$ or $R_{21}$ represents a cycloalkyl group or a linear or branched alkyl group having 1 to 4 carbon atoms.

Each of $R_{22}$ to $R_{25}$ independently represents a hydrogen atom or a cycloalkyl group or a linear or branched alkyl group having 1 to 4 carbon atoms, provided that at least one of $R_{22}$ to $R_{25}$ represents a cycloalkyl group. $R_{23}$ and $R_{24}$ may be bonded to each other to thereby form a ring.

(II-AB)

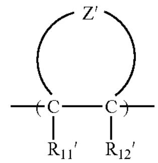

In general formula (II-AB), each of $R_{11}'$ and $R_{12}'$ independently represents a hydrogen atom, a cyano group, a halogen atom or an alkyl group.

Z' represents an atomic group for formation of an alicyclic structure in cooperation with two bonded carbon atoms (C—C).

Further preferably, general formula (II-AB) is either general formula (II-AB1) or general formula (II-AB2) below.

(II-AB1)

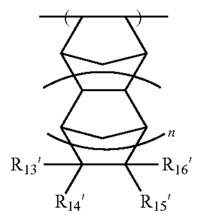

(II-AB2)

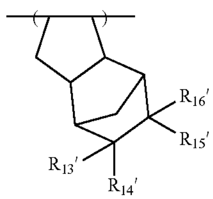

In general formulae (II-AB1) and (II-AB2), each of $R_{13}'$ to $R_{16}'$ independently represents a hydrogen atom, a halogen atom, a cyano group, a hydroxyl group, —COOH, —$COOR_5$, a group that is decomposed by the action of an acid, —C(═O)—X-A'-$R_{17}'$, an alkyl group or a cycloalkyl group. In the above formula, $R_5$ represents an alkyl group, a cycloalkyl group or a group with a lactone structure. X represents an oxygen atom, a sulfur atom, —NH—, —$NHSO_2$— or —$NHSO_2NH$—. A' represents a single bond or a bivalent connecting group. $R_{17}'$ represents —COOH, —$COOR_5$, —CN, a hydroxyl group, an alkoxy group, —CO—NH—$R_6$, —CO—NH—$SO_2$—$R_6$ or a group with a lactone structure. $R_6$ represents an alkyl group or a cycloalkyl group. At least two of $R_{13}'$ to $R_{16}'$ may be bonded to each other to thereby form a ring.

n is 0 or 1.

In general formulae (pI) to (pV), each of the alkyl groups represented by $R_{12}$ to $R_{25}$ is preferably a linear or branched alkyl group having 1 to 4 carbon atoms. As such, there can be mentioned, for example, a methyl group, an ethyl group, a propyl group, an n-butyl group, a sec-butyl group, a t-butyl group and the like.

The cycloalkyl groups represented by $R_{12}$ to $R_{25}$ and the cycloalkyl group formed by Z and a carbon atom may be monocyclic or polycyclic. In particular, there can be mentioned groups of a monocyclo, bicyclo, tricyclo or tetracyclo structure or the like having 5 or more carbon atoms. The number of carbon atoms thereof is preferably in the range of 6 to 30, especially preferably 7 to 25.

As preferred cycloalkyl groups, there can be mentioned an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. As more preferred cycloalkyl groups, there can be mentioned an adamantyl group, a norbornyl group, a cyclohexyl group, a cyclopentyl group, a tetracyclododecanyl group and a tricyclodecanyl group.

These alkyl groups and cycloalkyl groups may further have substituents. As substituents, there can be mentioned an alkyl group (1 to 4 carbon atoms), a halogen atom, a hydroxyl group, an alkoxy group (1 to 4 carbon atoms), a carboxyl group and an alkoxycarbonyl group (2 to 6 carbon atoms). These substituents may further have substituents. As substituents that can be further introduced in the alkyl groups, alkoxy groups, alkoxycarbonyl groups, etc., there can be mentioned a hydroxyl group, a halogen atom and an alkoxy group.

The structures of the general formulae (pI) to (pV) can be used for the protection of the alkali-soluble groups. As the alkali-soluble groups, there can be mentioned various groups generally known in this technical field.

In particular, there can be mentioned, for example, structures resulting from replacement of a hydrogen atom of a carboxylic acid group, sulfonic acid group, phenol group or thiol group with any of the structures of the general formulae (pI) to (pV). Structures resulting from replacement of a hydrogen atom of a carboxylic acid group or sulfonic acid group with any of the structures of the general formulae (pI) to (pV) are preferred.

As preferred repeating units having any of the alkali-soluble groups protected by the structures of the general formulae (pI) to (pV), there can be mentioned those of general formula (pA) below.

(pA)

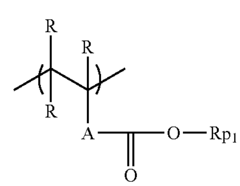

In general formula (pA), R represents a hydrogen atom, a halogen atom or a linear or branched alkyl group having 1 to 4 carbon atoms. Two or more R's may be identical to or different from each other.

A represents any one or a combination of two or more groups selected from the group consisting of a single bond, an alkylene group, an ether group, a thioether group, a carbonyl group, an ester group, an amido group, a sulfonamido group, a urethane group and a urea group. A single bond is preferred.

Pp1 represents any of the groups of the above general formulae (pI) to (pV).

The repeating units of the general formula (pA) are most preferably those derived from a 2-alkyl-2-adamantyl (meth)acrylate and a dialkyl(1-adamantyl)methyl (meth)acrylate.

Specific examples of the repeating units of the general formula (pA) will be shown below.

-continued
1
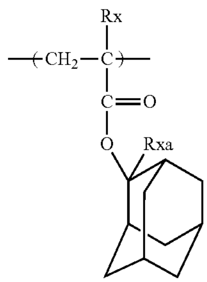
2
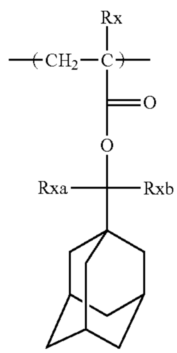
3
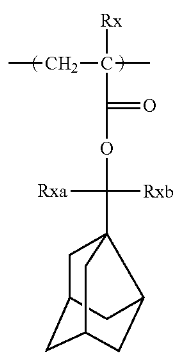
4
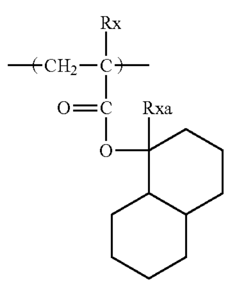
5
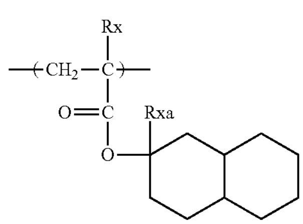
6
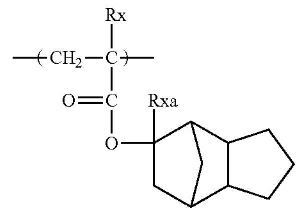
7
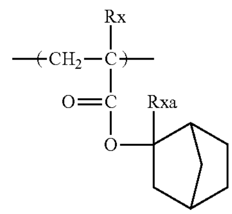
8
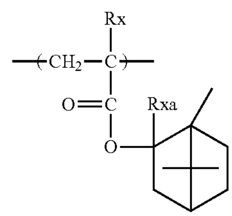
9
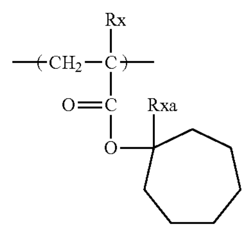
10
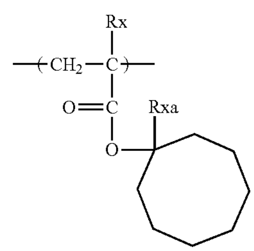
11
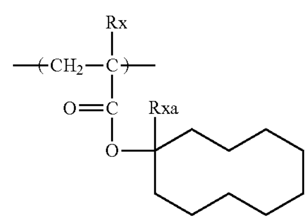
12
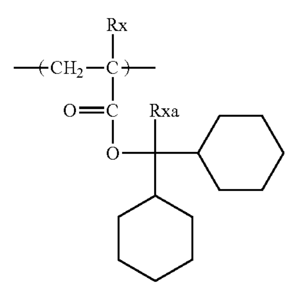

-continued

13

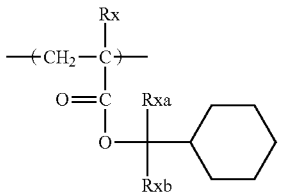

14

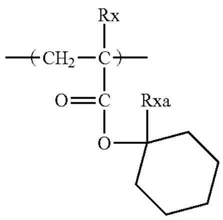

15

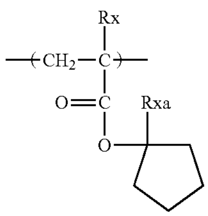

16

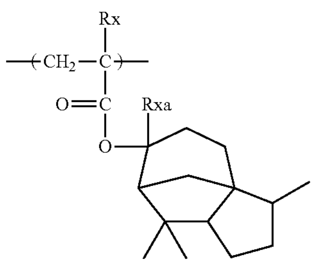

17

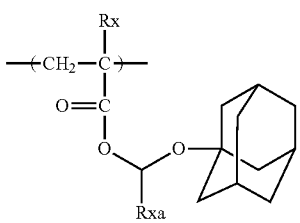

18

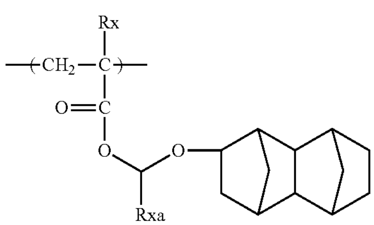

19

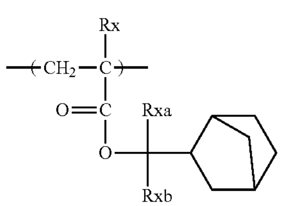

In the above structural formulae, Rx represents H, $CH_3$, $CF_3$ or $CH_2OH$. Each of Rxa and Rxb independently represents an alkyl group having 1 to 4 carbon atoms.

In the general formula (II-AB), the halogen atoms represented by $R_{11}$' and $R_{12}$' include a chlorine atom, a bromine atom, a fluorine atom, an iodine atom, etc.

The alkyl groups represented by $R_{11}$' and $R_{12}$' are preferably linear or branched alkyl groups each having 1 to 10 carbon atoms. For example, there can be mentioned a methyl group, an ethyl group, an n-propyl group, an isopropyl group, a linear or branched butyl, pentyl, hexyl or heptyl group, and the like.

The atomic group represented by Z' is one capable of providing the resin with a repeating unit of optionally substituted alicyclic hydrocarbon. The atomic group is preferably one capable of providing a bridged alicyclic structure for formation of a bridged alicyclic hydrocarbon repeating unit.

The provided alicyclic hydrocarbon skeleton can be the same as that of the cycloalkyl groups represented by $R_{12}$ to $R_{25}$ in the general formulae (pI) to (pV).

The alicyclic hydrocarbon skeleton may have a substituent. As the substituent, there can be mentioned any of the atoms or groups represented by $R_{13}$' to $R_{16}$' in the general formulae (II-AB1) and (II-AB2).

In the alicyclic hydrocarbon acid-decomposable resin, at least one repeating unit selected from among the repeating units having partial structures containing the alicyclic hydrocarbons of general formulae (pI) to (pV), the repeating units of general formula (II-AB) and the repeating units of copolymer components to be described below may contain the group that is decomposed by the action of an acid.

Any of the various substituents that can be introduced in $R_{13}$' to $R_{16}$' in general formulae (II-AB1) and (II-AB2) can be a substituent for the atomic groups Z' for formation of the alicyclic structures or the bridged alicyclic structures of general formula (II-AB).

Specific examples of the repeating units of general formulae (II-AB1) and (II-AB2) will be shown below, which however in no way limit the scope of the present invention.

[II-1]

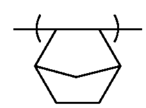

[II-2]

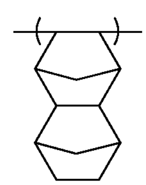

[II-3]

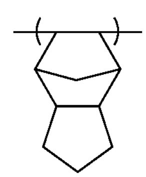

-continued
[II-4]
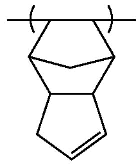
[II-5]
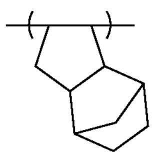
[II-6]
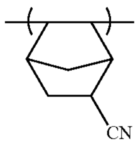
[II-7]
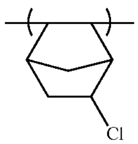
[II-8]
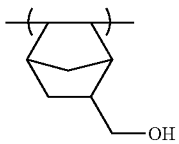
[II-9]
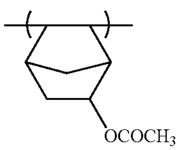
[II-10]
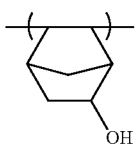
[II-11]
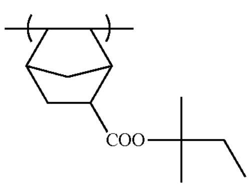
[II-12]
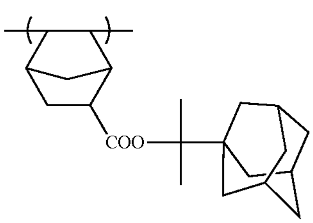
-continued
[II-13]
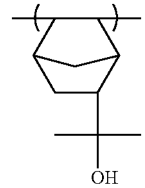
[II-14]
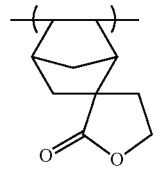
[II-15]
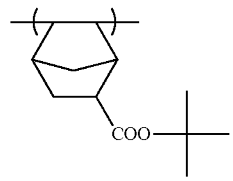
[II-16]
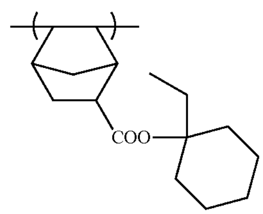
[II-17]
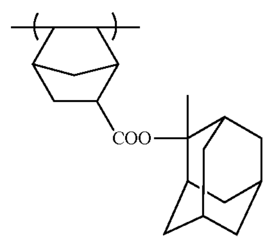
(II-18]
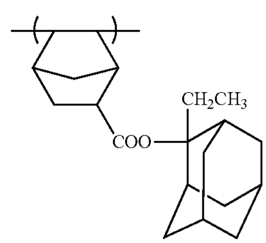
(II-19]
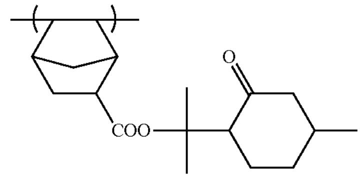

-continued
(II-20]
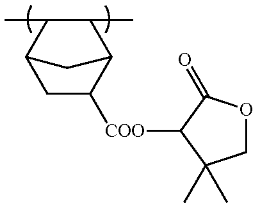
(II-21]
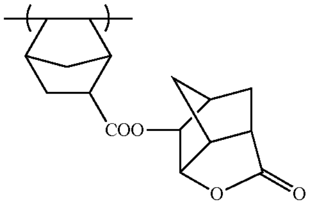
(II-22]
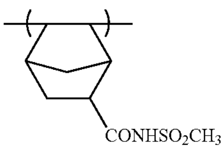
(II-23]
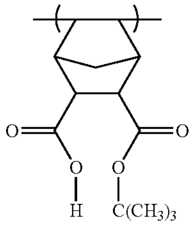
(II-24]
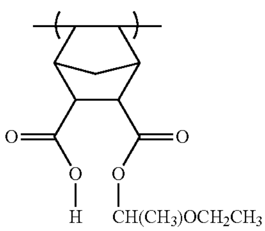
[II-25]
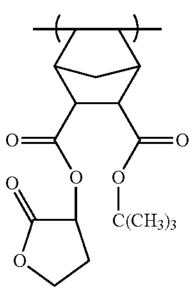
[II-26]
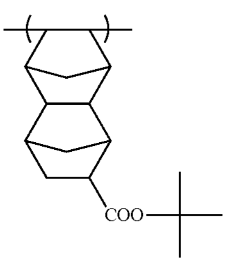
-continued
[II-27]
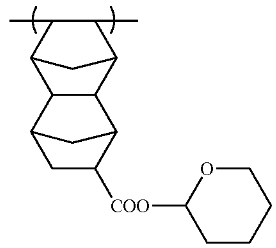
[II-28]
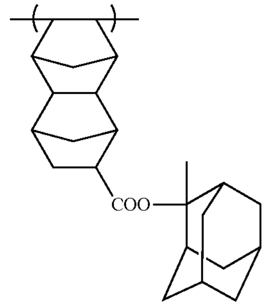
[II-29]
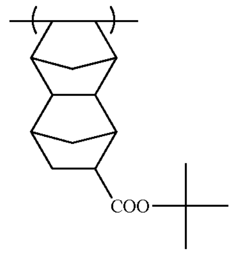
[II-30]
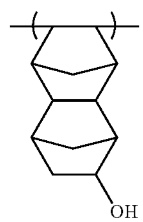
[II-31]
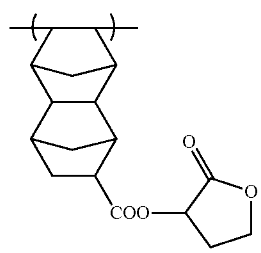
[II-32]
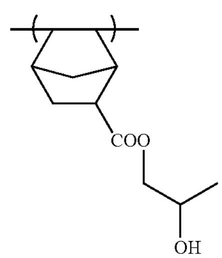
It is preferred for the alicyclic hydrocarbon acid-decomposable resin to contain a repeating unit containing a lactone group. The lactone group is preferably a group having a 5- to 7-membered ring lactone structure, more preferably one in which a 5- to 7-membered ring lactone structure is condensed with another cyclic structure in a fashion to form a bicyclo structure or spiro structure.

This alicyclic hydrocarbon acid-decomposable resin further more preferably contains a repeating unit containing a group with any of the lactone structures of general formulae (LC1-1) to (LC1-17) below. The groups with lactone structures may be directly bonded to the principal chain of the resin. Preferred lactone structures are those of formulae (LC1-1), (LC1-4), (LC1-5), (LC1-6), (LC1-13), (LC1-14) and (LC1-17). Using these specified lactone structures enhances the line edge roughness and development defect reduction.

LC1-1

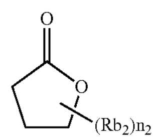

LC1-2

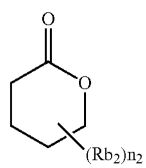

LC1-3

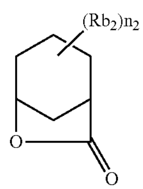

LC1-4

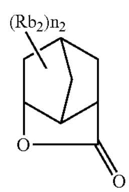

LC1-5

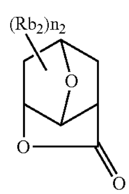

LC1-6

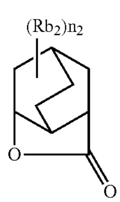

-continued

LC1-7

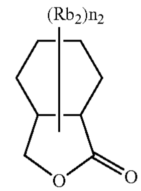

LC1-8

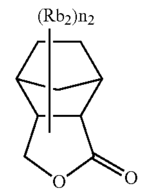

LC1-9

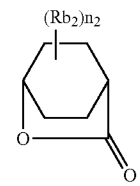

LC1-10

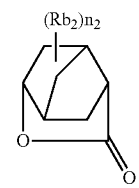

LC1-11

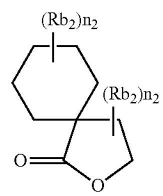

LC1-12

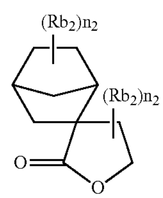

LC1-13

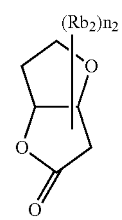

LC1-14

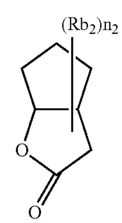

-continued

LC1-15

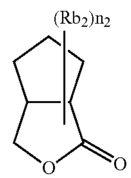

LC1-16

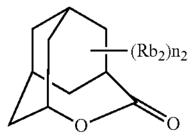

LC1-17

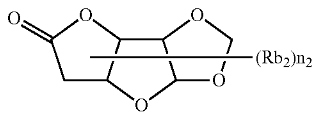

The presence of a substituent ($Rb_2$) on the portion of the lactone structure is optional. As preferred substituents ($Rb_2$), there can be mentioned, for example, an alkyl group having 1 to 8 carbon atoms, a cycloalkyl group having 3 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group and the like.

In the formulae, $n_2$ is an integer of 0 to 4. When $n_2$ is an integer of 2 or greater, the plurality of present substituents ($Rb_2$) may be identical to or different from each other. Further, the plurality of present substituents ($Rb_2$) may be bonded to each other to thereby form a ring structure.

As the repeating units containing the groups with lactone structures of any of general formulae (LC1-1) to (LC1-17) above, there can be mentioned, for example, the repeating units of general formulae (II-AB1) and (II-AB2) above wherein at least one of $R_{13}'$ to $R_{16}'$ contains any of the groups of general formulae (LC1-1) to (LC1-17) and the repeating units of general formula (AI) below. As examples of the former repeating units, there can be mentioned the structures in which $R_5$ in —$COOR_5$ represents any of the groups of general formulae (LC1-1) to (LC1-17).

(AI)

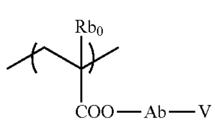

In general formula (AI), $Rb_0$ represents a hydrogen atom, a halogen atom or an alkyl group having 1 to 4 carbon atoms.

As the alkyl group represented by $Rb_0$, there can be mentioned, for example, a methyl group, an ethyl group, a propyl group, an n-butyl group, a sec-butyl group, a t-butyl group and the like. The alkyl group represented by $Rb_0$ may have a substituent. As preferred substituents that may be introduced in the alkyl group represented by $Rb_0$, there can be mentioned, for example, a hydroxyl group and a halogen atom.

As the halogen atom represented by $Rb_0$, there can be mentioned a fluorine atom, a chlorine atom, a bromine atom or an iodine atom. The $Rb_0$ is preferably a hydrogen atom or a methyl group.

Ab represents an alkylene group, a bivalent connecting group with an alicyclic hydrocarbon structure of a single ring or multiple rings, a single bond, an ether group, an ester group, a carbonyl group, a carboxyl group or a bivalent connecting group resulting from combination of these. A single bond and a connecting group of the formula -$Ab_1$-$CO_2$— are preferred.

$Ab_1$ is a linear or branched alkylene group or a monocyclic or polycyclic alkylene group, being preferably a methylene group, an ethylene group, a cyclohexylene group, an adamantylene group or a norbornylene group.

V represents any of the groups of the general formulae (LC1-1) to (LC1-17).

The repeating unit having a lactone structure is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

The following repeating units can be mentioned as repeating units each containing an especially preferred lactone group. Selecting the most appropriate lactone group enhances the pattern profile and iso/dense bias. In the formulae, each of Rx and R represents H, $CH_3$, $CH_2OH$ or $CF_3$.

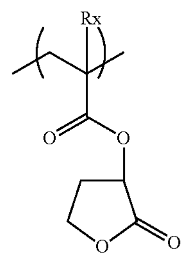

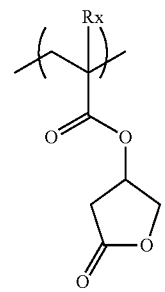

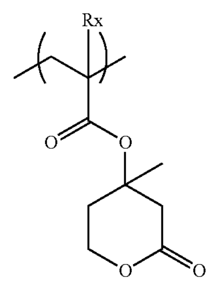

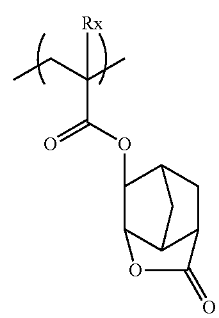

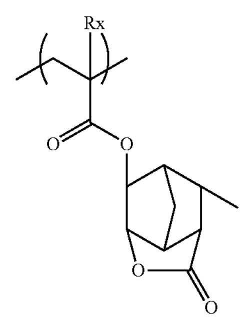

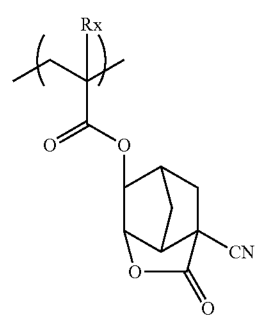

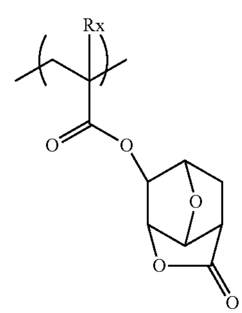

-continued
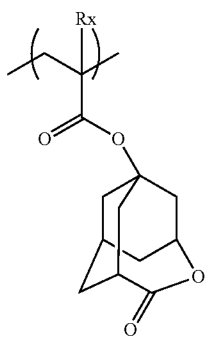
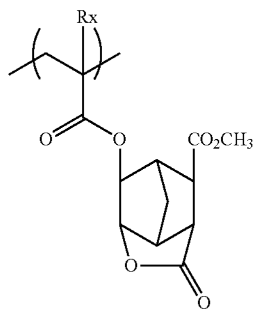
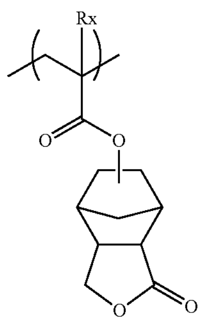
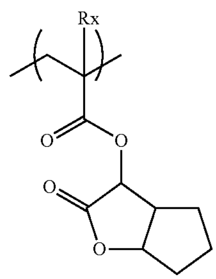
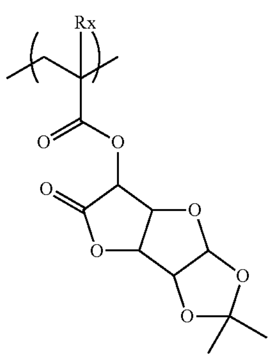
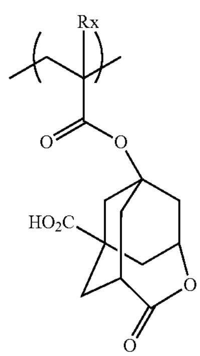
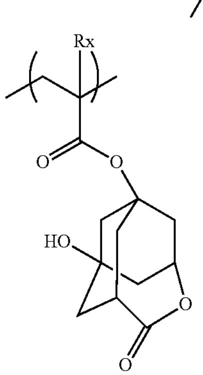
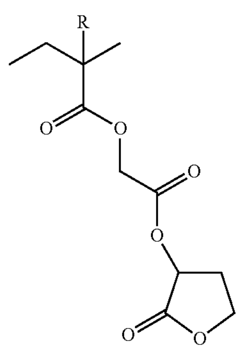
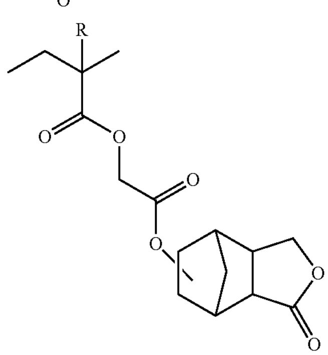
-continued
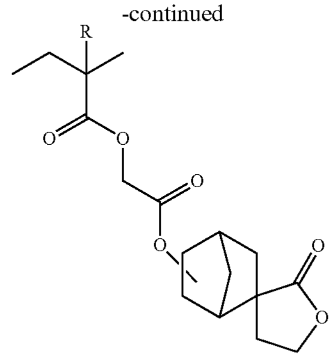
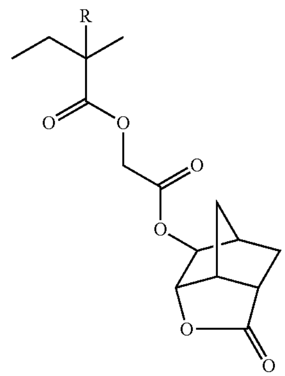
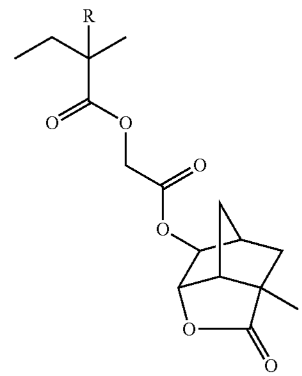
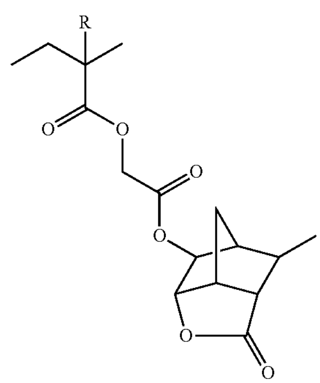
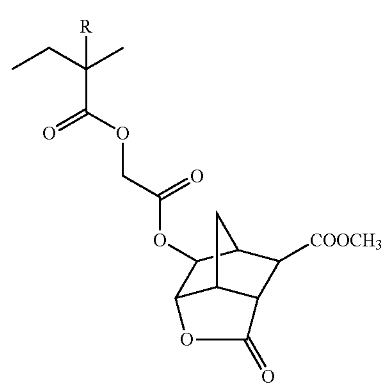

-continued
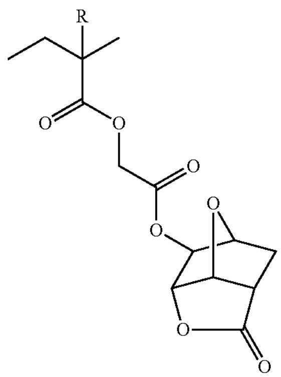
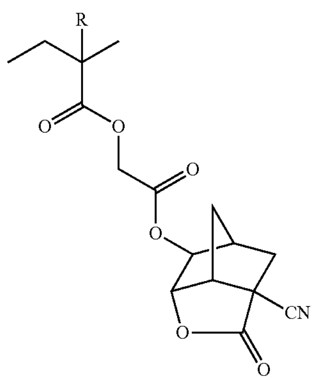
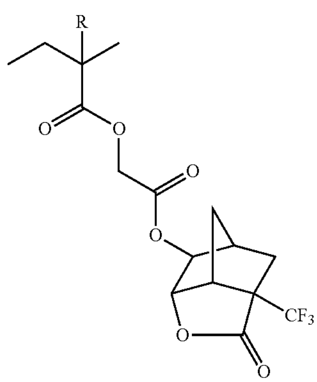
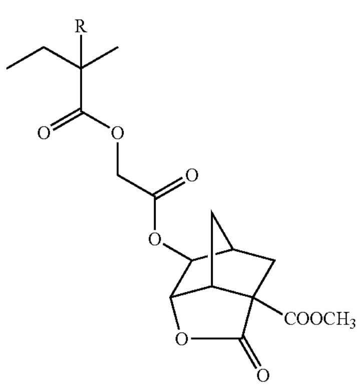
-continued
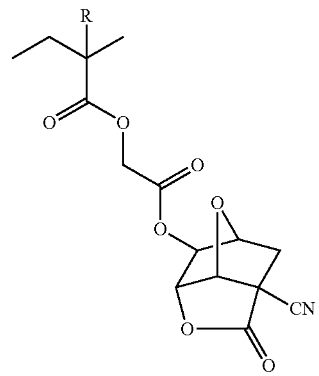
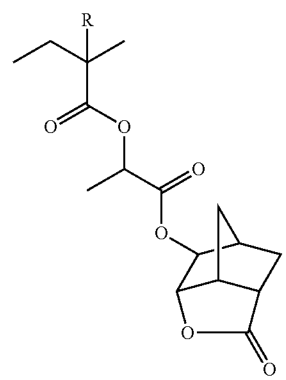
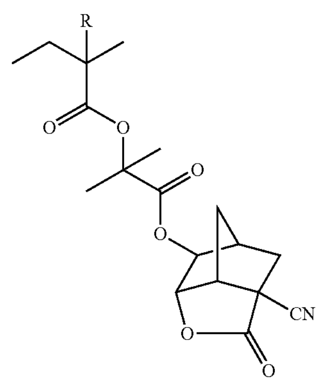
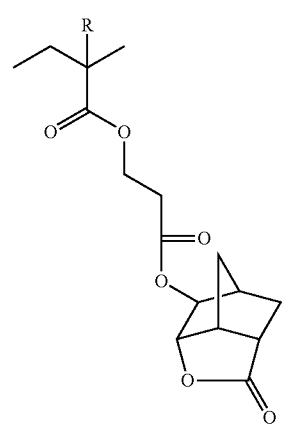

-continued

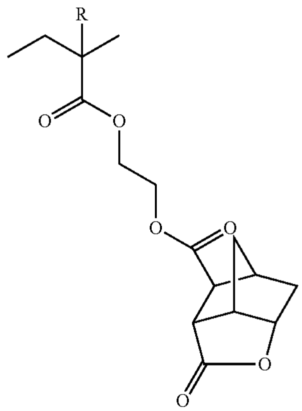

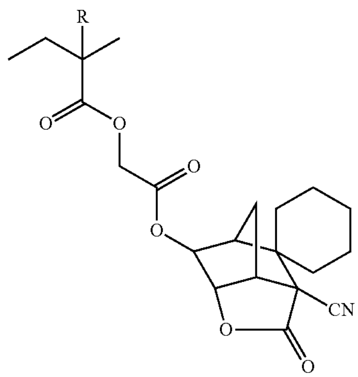

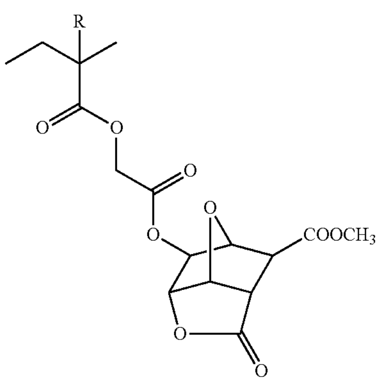

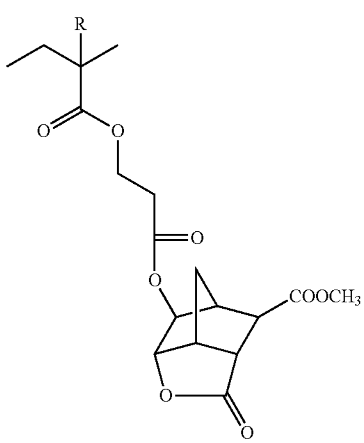

-continued

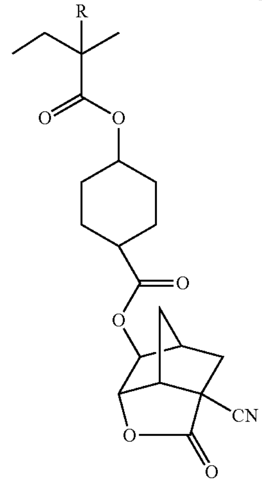

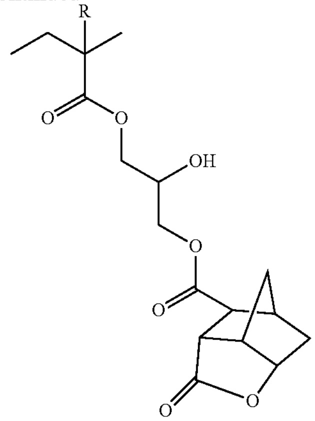

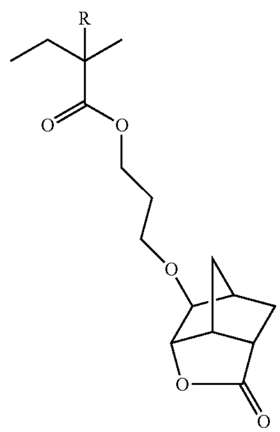

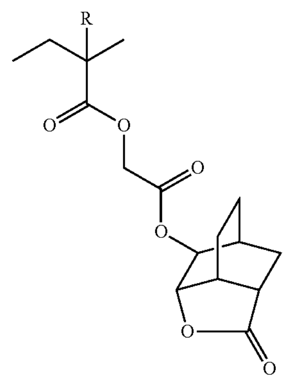

The alicyclic hydrocarbon based acid-decomposable resin may contain a plurality of repeating units each containing a lactone group. In this case, it is preferred for the acid-decomposable resin to contain either (1) any one of those of general formula (AI) in which Ab is a single bond together with any one of those of general formula (AI) in which Ab is -$Ab_1$-$CO_2$—, or (2) a combination of two of those of general formula (AI) in which Ab is-$Ab_1$-$CO_2$—.

The content of repeating unit containing a lactone group (when there are a plurality of repeating units each containing a lactone group, the sum thereof), based on all the repeating units of the resin (A), is preferably in the range of 10 to 70 mol %, more preferably 20 to 60 mol %.

It is preferred for the alicyclic hydrocarbon based acid-decomposable resin to contain a repeating unit with an alicyclic hydrocarbon structure substituted with a polar group. The adhesion to substrate and developer affinity can be enhanced by the incorporation of this repeating unit. The polar group is preferably a hydroxyl group or a cyano group. The hydroxyl group as a polar group constitutes an alcoholic hydroxyl group.

As the alicyclic hydrocarbon structure substituted with a polar group, there can be mentioned, for example, any of the structures of general formulae (VIIa) and (VIIb) below.

(VIIa)

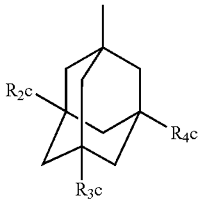

(VIIb)

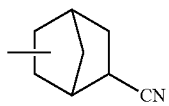

In general formula (VIIa), each of $R_2c$ to $R_4c$ independently represents a hydrogen atom, a hydroxyl group or a cyano group, provided that at least one of the $R_2c$ to $R_4c$ represents a hydroxyl group or a cyano group. Preferably, one or two of the $R_2c$ to $R_4c$ are hydroxyl groups and the remainder is a hydrogen atom. More preferably, two of the $R_2c$ to $R_4c$ are hydroxyl groups and the remainder is a hydrogen atom.

The groups of general formula (VIIa) preferably have a dihydroxy form or monohydroxy form, more preferably a dihydroxy form.

As the repeating units containing any of the groups of general formulae (VIIa) and (VIIb) above, there can be mentioned, for example, the repeating units of general formulae (II-AB1) and (II-AB2) above wherein at least one of $R_{13}'$ to $R_{16}'$ contains any of the groups of general formulae (VIIa) and (VIIb) above and the repeating units of general formulae (AIIa) and (AIIb) below. As examples of the former repeating units, there can be mentioned the structures in which $R_5$ in —$COOR_5$ represents any of the groups of general formulae (VIIa) and (VIIb).

(AIIa)

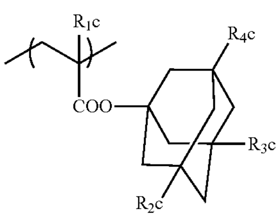

(AIIb)

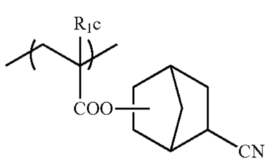

In general formulae (AIIa) and (AIIb), $R_1c$ represents a hydrogen atom, a methyl group, a trifluoromethyl group or a hydroxymethyl group.

$R_2c$ to $R_4c$ are as defined above in connection with general formula (VIIa).

Specific examples of the repeating units of general formula (AIIa) and (AIIb) are shown below, which in no way limit the scope of the present invention.

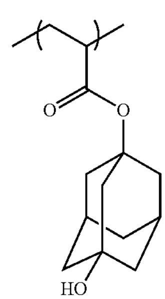

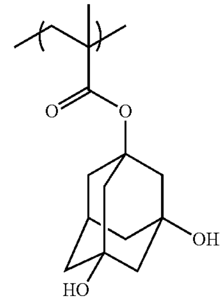

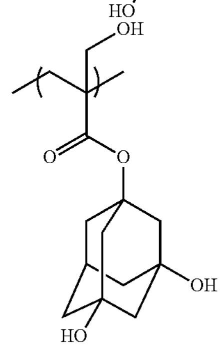

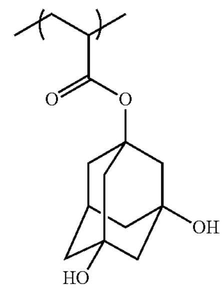

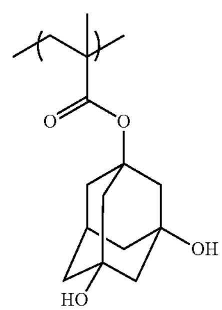

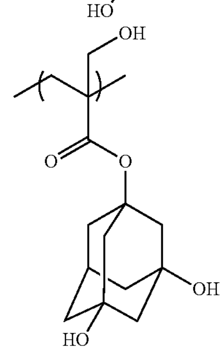

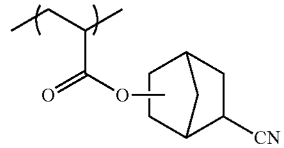

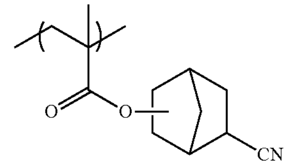

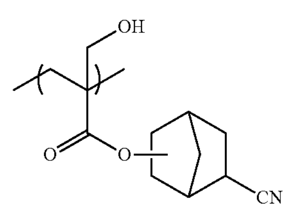

The content of any of these repeating units (when there are a plurality of relevant repeating units, the sum thereof), based on all the repeating units of the resin (A), is preferably in the range of 3 to 30 mol %, more preferably 5 to 25 mol %.

The resin (A) according to the present invention may contain a repeating unit that contains neither a hydroxyl group nor a cyano group and is stable against acids, aside from the foregoing repeating units.

As such a repeating unit, there can be mentioned, for example, any of repeating units of general formula as shown below in which a side chain of acrylic structure has a non-acid-decomposable aryl structure or cycloalkyl structure. The regulation of contrast, enhancement of etching resistance, etc. can be expected by the introduction of this structure.

This repeating unit may be introduced in the above-mentioned resin containing a hydroxystyrene repeating unit, or alicyclic hydrocarbon based acid-decomposable resin. When this repeating unit is introduced in the alicyclic hydrocarbon based acid-decomposable resin, from the viewpoint of 193 nm light absorption, it is preferred for the repeating unit to contain no aromatic ring structure.

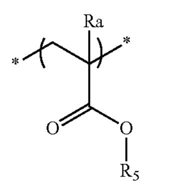

(VI)

In general formula (VI), $R_5$ represents a hydrocarbon group.

Ra represents a hydrogen atom, an alkyl group (preferably a methyl group), a hydroxyalkyl group (preferably a hydroxymethyl group) or a trifluoromethyl group.

It is preferred for the hydrocarbon group represented by $R_5$ to contain a ring structure therein. As particular examples of the hydrocarbon groups containing a ring structure, there can be mentioned a mono- or polycycloalkyl group (preferably 3 to 12 carbon atoms, more preferably 3 to 7 carbon atoms), a mono- or polycycloalkenyl group (preferably 3 to 12 carbon atoms), an aryl group (preferably 6 to 20 carbon atoms, more preferably 6 to 12 carbon atoms), an aralkyl group (preferably 7 to 20 carbon atoms, more preferably 7 to 12 carbon atoms) and the like.

The above cycloalkyl groups include ring-assembly hydrocarbon groups and crosslinked-ring hydrocarbon groups. As crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed rings, for example, those resulting from the condensation of a plurality of 5- to 8-membered cycloalkane rings.

As preferred crosslinked-ring hydrocarbon rings, there can be mentioned, for example, a norbornyl group, an adamantyl group, a bicyclooctanyl group and a tricyclo[5,2,1,$0^{2,6}$]decanyl group. As more preferred crosslinked-ring hydrocarbon rings, there can be mentioned a norbornyl group and an adamantyl group.

As preferred examples of the aryl groups, there can be mentioned a phenyl group, a naphthyl group, a biphenyl group and the like. As preferred examples of the aralkyl groups, there can be mentioned a phenylmethyl group, a phenylethyl group, a naphthylmethyl group and the like.

Substituents may be introduced in these hydrocarbon groups. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. A substituent may further be introduced in this alkyl group. As an optionally further introduced substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an acyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

The content of any of repeating units of general formula (VI) based on all the repeating units of the resin (A) is preferably in the range of 0 to 40 mol %, more preferably 0 to 20 mol %.

Specific examples of the repeating units of general formula (VI) are shown below, which in no way limit the scope of the present invention. In the formulae, Ra represents H, $CH_3$, $CH_2OH$ or $CF_3$.

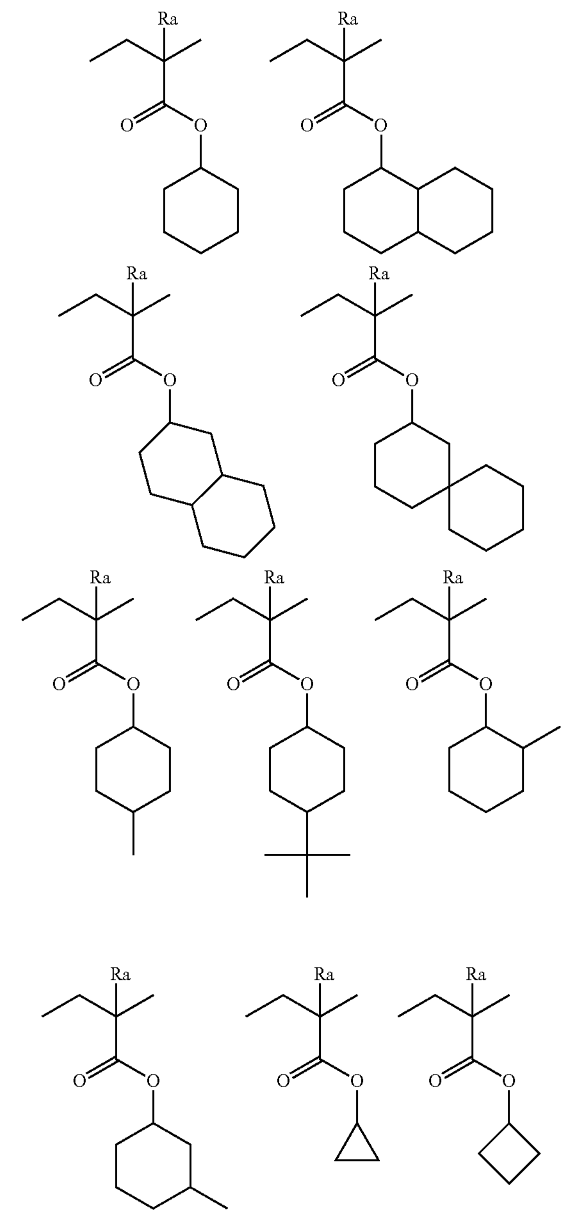

-continued

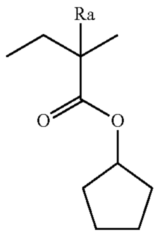

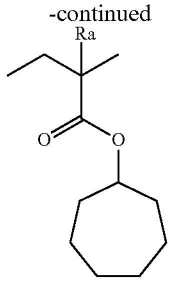

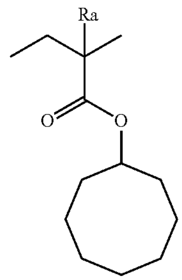

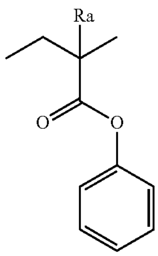

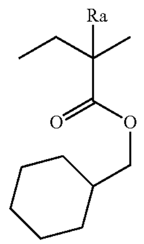

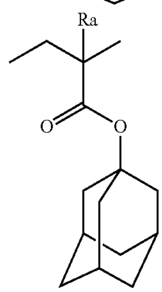

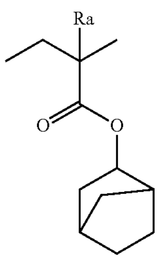

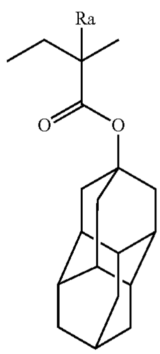

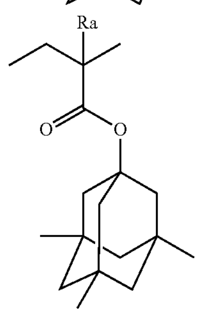

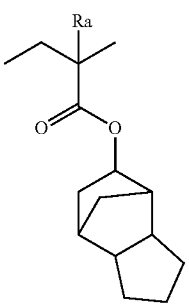

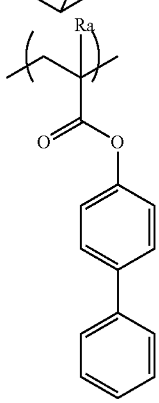

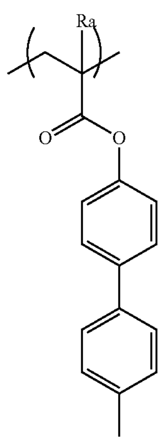

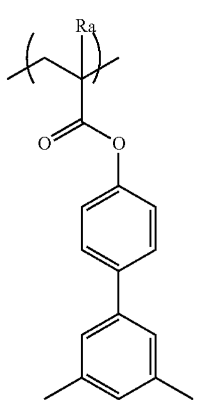

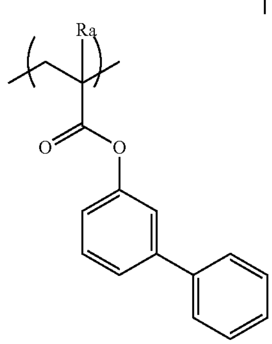

-continued

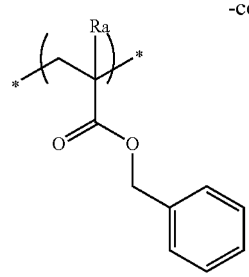

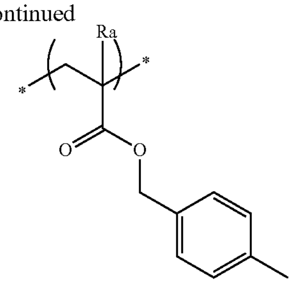

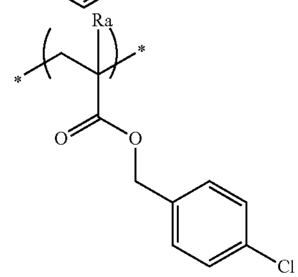

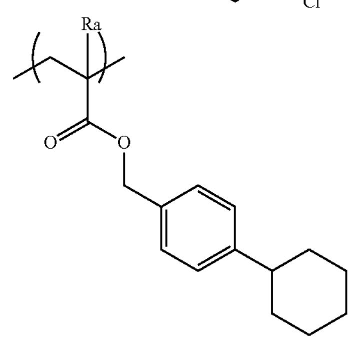

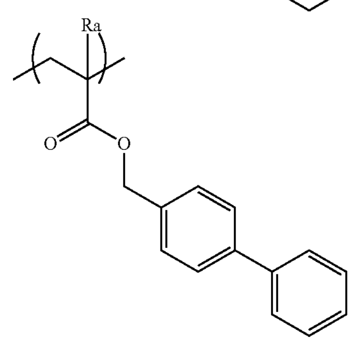

The content of any of these repeating units (when there are a plurality of relevant repeating units, the sum thereof), based on all the repeating units of the resin, is preferably in the range of 0 to 30 mol %, more preferably 1 to 20 mol %.

The alicyclic hydrocarbon based acid-decomposable resin may contain any of the repeating units of general formula (VIII) below.

(VIII)

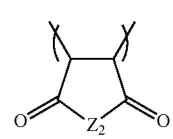

In general formula (VIII), $Z_2$ represents —O— or —N($R_{41}$)—. $R_{41}$ represents a hydrogen atom, a hydroxyl group, an alkyl group or —$OSO_2$—$R_{42}$. $R_{42}$ represents an alkyl group, a cycloalkyl group or a camphor residue. The alkyl groups represented by $R_{41}$ and $R_{42}$ may be substituted with, for example, a halogen atom. In that instance, the halogen atom is preferably a fluorine atom.

Specific examples of the repeating units of general formula (VIII) are shown below, which in no way limit the scope of the present invention.

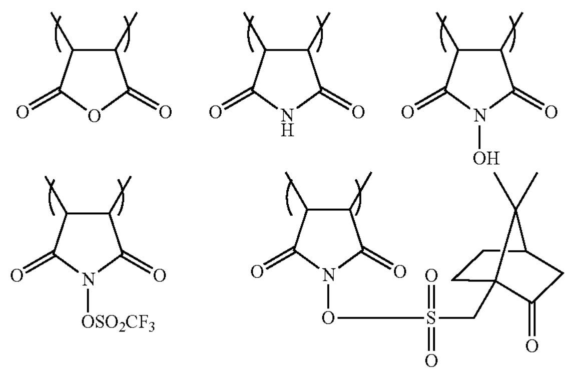

It is preferred for the alicyclic hydrocarbon based acid-decomposable resin to contain a repeating unit containing an alkali-soluble group, especially a repeating unit containing a carboxyl group. The resolution in contact hole usage can be enhanced by the incorporation of this repeating unit.

Both a repeating unit wherein the carboxyl group is directly bonded to the principal chain of the resin and a repeating unit wherein the carboxyl group is bonded via a connecting group to the principal chain of the resin are preferred as the repeating unit containing a carboxyl group.

As the former repeating unit, there can be mentioned, for example, an acrylic acid or methacrylic acid repeating unit. In the latter repeating unit, the connecting group may have a mono- or polycycloalkyl structure.

The repeating unit containing a carboxyl group is most preferably an acrylic acid or methacrylic acid repeating unit.

With respect to the resin that when acted on by an acid, is decomposed to thereby increase its solubility in an alkali developer, the weight average molecular weight thereof in terms of polystyrene-equivalent value as determined by GPC is preferably in the range of 2000 to 200,000. In particular, the heat resistance and dry etching resistance can be enhanced by regulating the weight average molecular weight to 2000 or greater. Not only can the developability be particularly enhanced but also, through lowering of the viscosity of the composition, the film forming property can be enhanced by regulating the weight average molecular weight to 200,000 or less.

More preferred molecular weight is in the range of 2500 to 50,000. Further more preferred molecular weight is in the range of 3000 to 20,000. In the formation of a nanopattern using electron beams, X-rays or high-energy rays of wavelength 50 nm or shorter (for example, EUV), it is most preferred for the weight average molecular weight to fall within the range of 3000 to 10,000. The enhancements of heat resistance and resolving power, reduction of development defects, etc. of the composition can be simultaneously attained by regulating the molecular weight.

With respect to the resin that when acted on by an acid, is decomposed to thereby increase its solubility in an alkali developer, the polydispersity index (Mw/Mn) thereof is preferably in the range of 1.0 to 3.0, more preferably 1.2 to 2.5 and further more preferably 1.2 to 1.6. For example, the line edge roughness performance can be enhanced by regulating this polydispersity index.

Particular examples of resin (A) set forth above are shown below, which in no way limit the scope of the present invention.

(R-1)

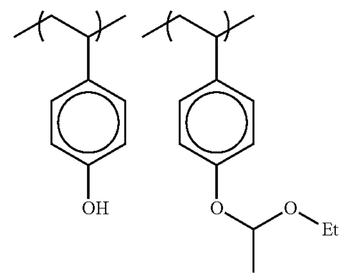

(R-2)

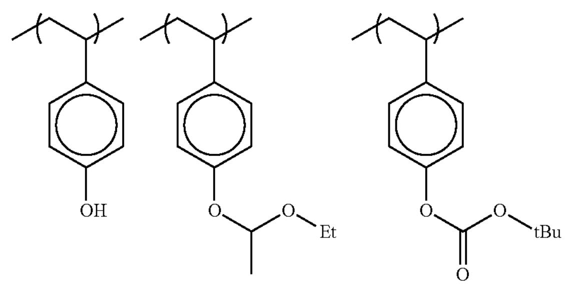

(R-3)

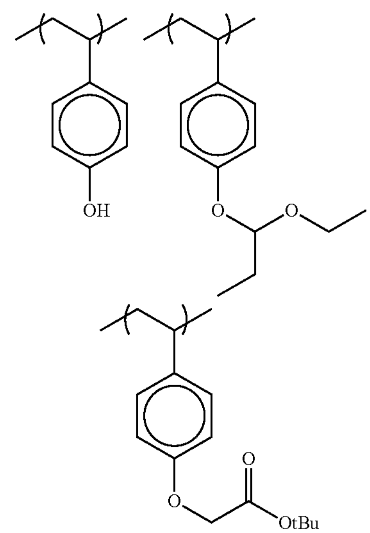

(R-4)

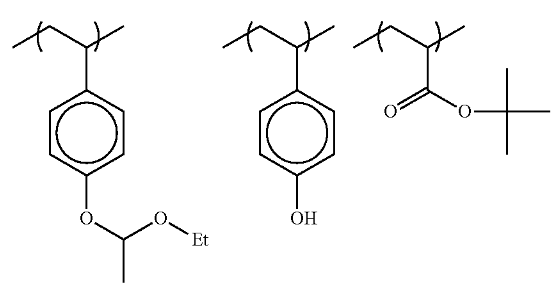

-continued
(R-5)
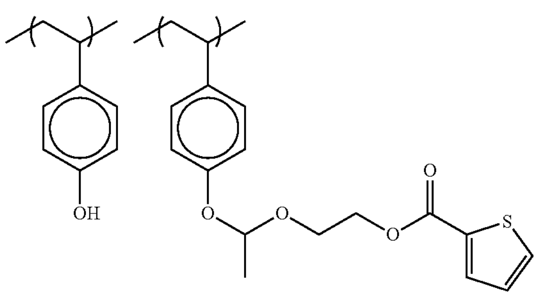
(R-6)
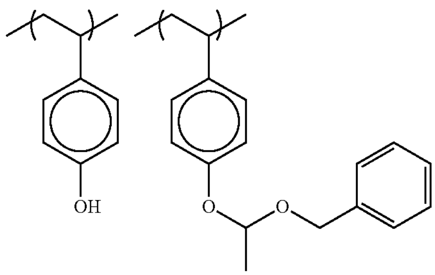
(R-7)
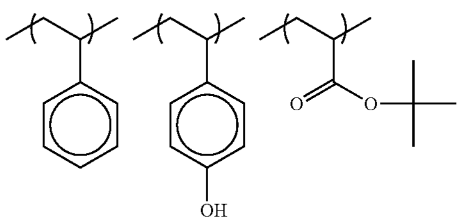
(R-8)
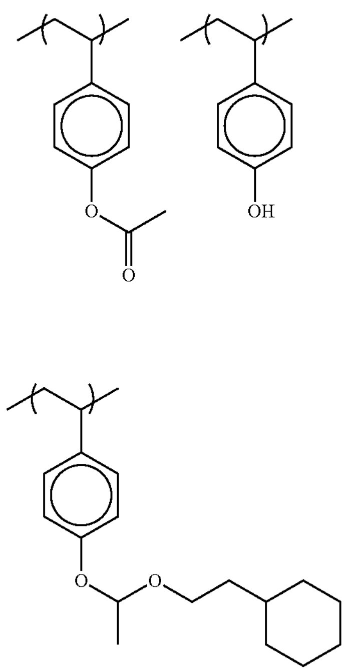
-continued
(R-9)
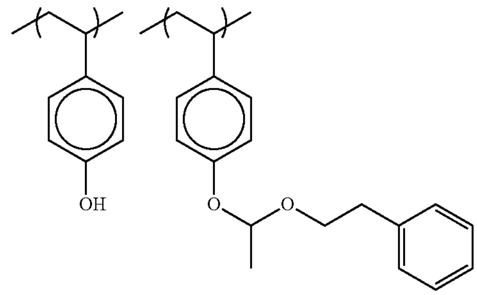
(R-10)
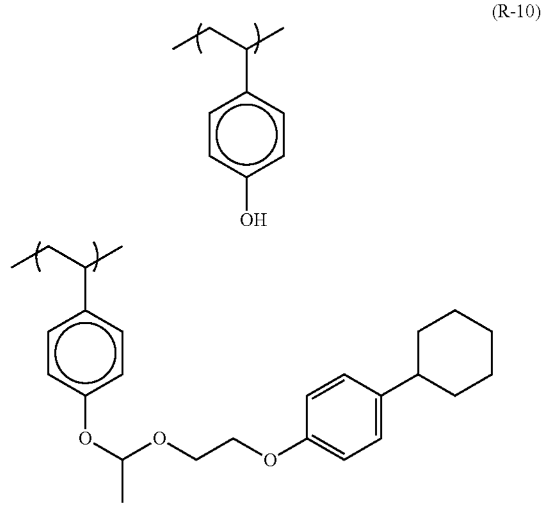
(R-11)
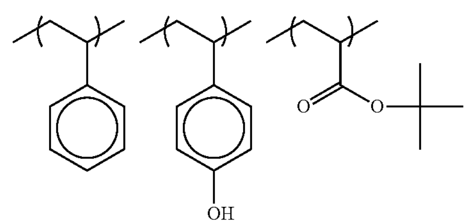
(R-12)
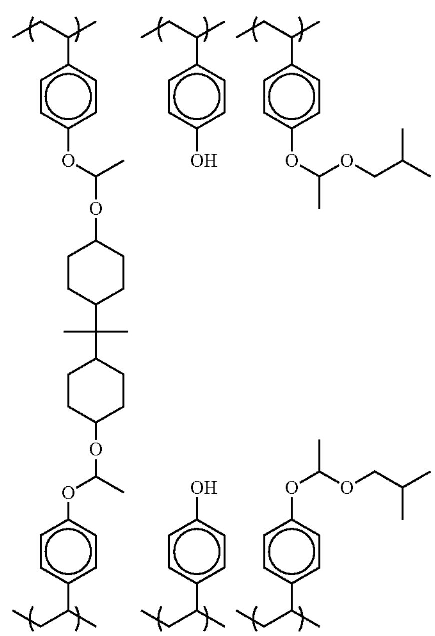

-continued
(R-13)
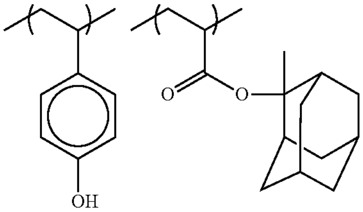
(R-14)
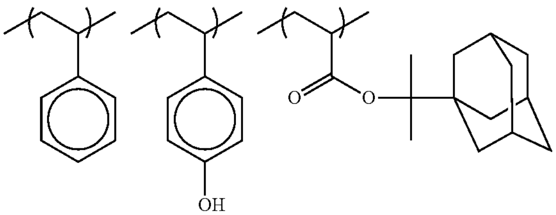
(R-15)
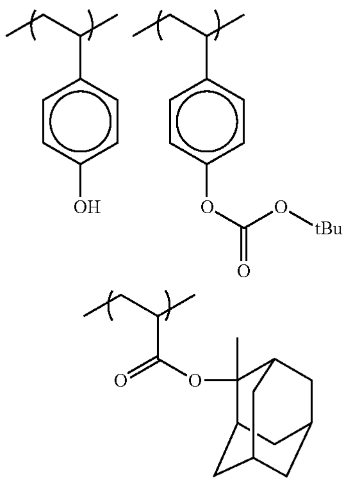
(R-16)
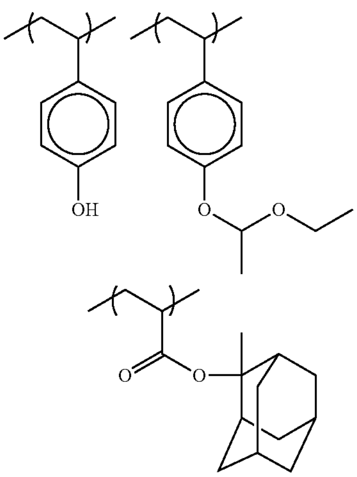
(R-17)
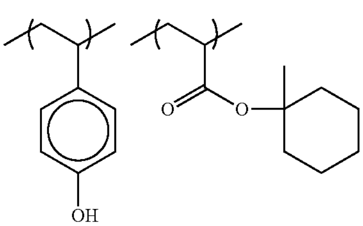
-continued
R-18
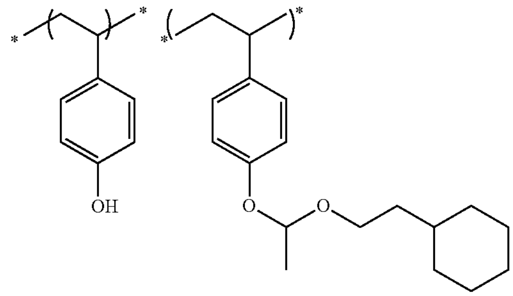
R-19
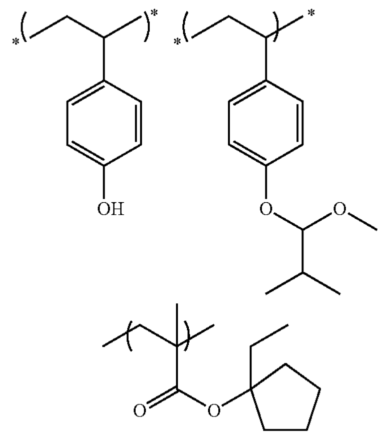
R-20
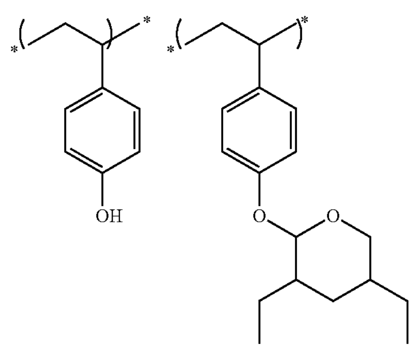
R-21
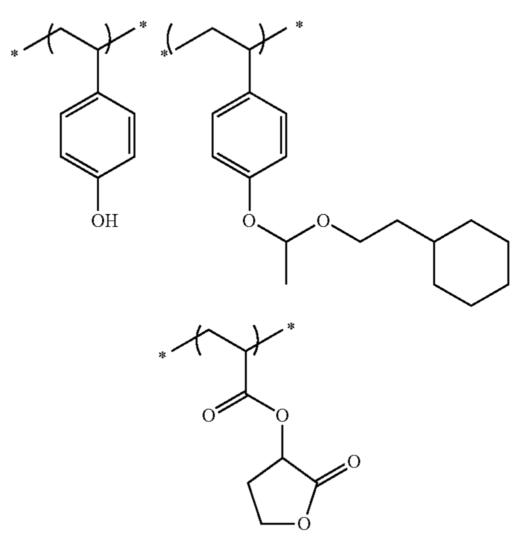

R-22
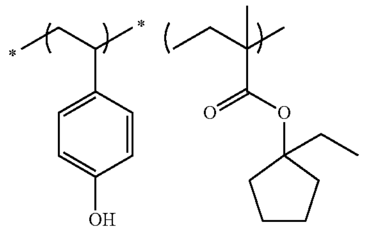
R-23
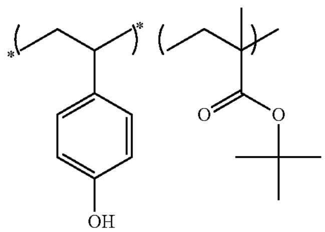
R-24
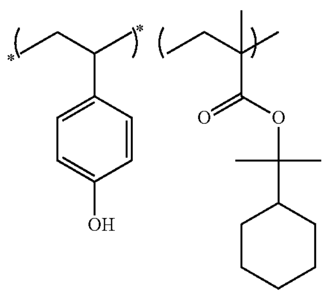
R-25
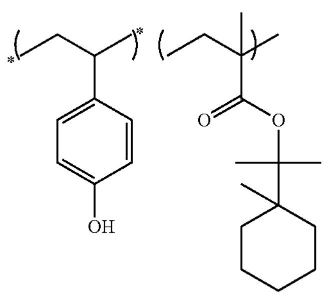
R-26
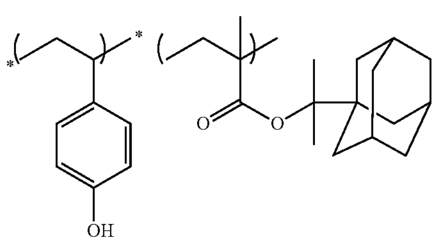
R-27
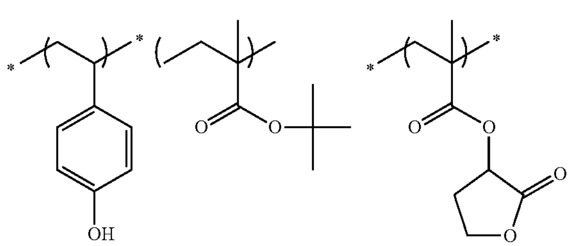
R-28
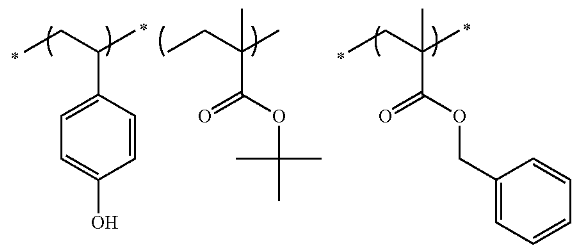
R-29
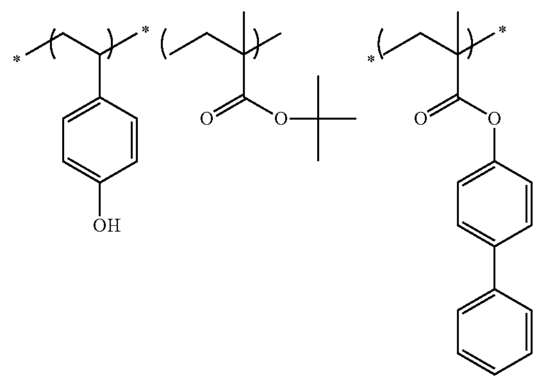
R-30
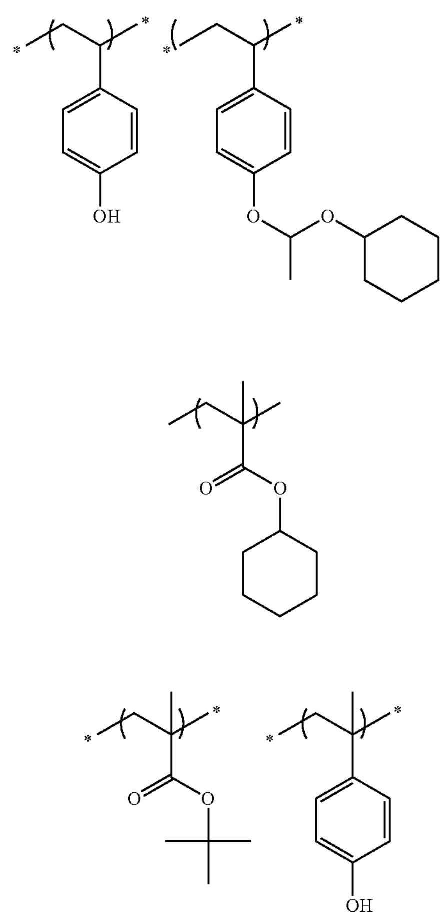

-continued

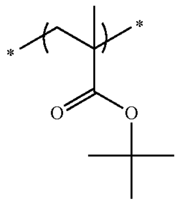
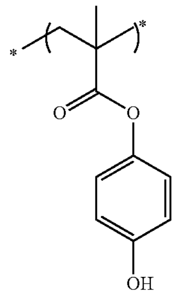
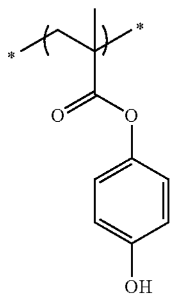
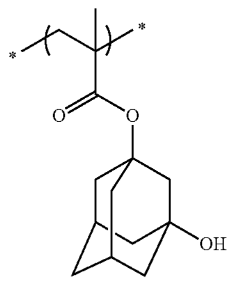
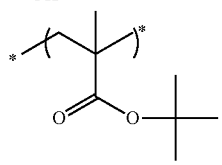
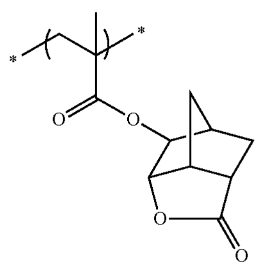
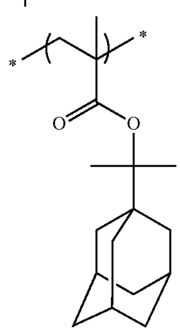
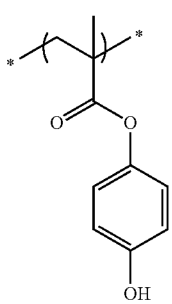
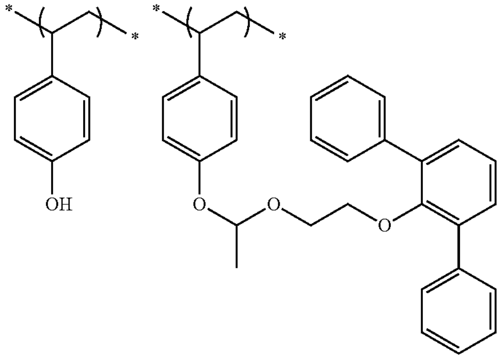

-continued

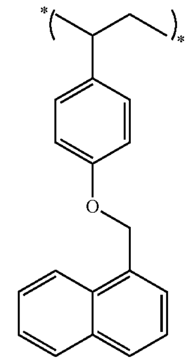
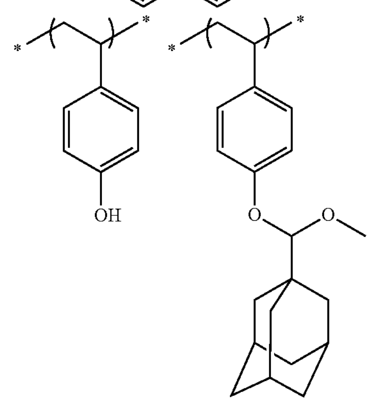

In the above particular examples, tBu represents a t-butyl group.

The content of resin (A) in the composition of the present invention, based on the total solids of the composition, is preferably in the range of 5 to 99.9 mass %, more preferably 50 to 95 mass % and most preferably 60 to 93 mass %.

[3] Dissolution Inhibiting Compound

The positive actinic-ray- or radiation-sensitive resin composition of the present invention may further contain a dissolution inhibiting compound. Here the "dissolution inhibiting compound" means compound having 3000 or less molecular weight that is decomposed by the action of an acid to increase the solubility in an alkali developer. From the viewpoint of preventing lowering of the transmission at the wavelength of 220 nm or shorter, the dissolution inhibiting compound is preferably an alicyclic or aliphatic compound having an acid-decomposable group, such as any of cholic acid derivatives having an acid-decomposable group described in Proceeding of SPIE, 2724, 355 (1996). Particular examples of the acid-decomposable groups are the same as set forth above in connection with the acid-decomposable units.

When the composition according to the present invention is exposed to a KrF excimer laser or irradiated with electron beams, preferred use is made of one having a structure resulting from substitution of the phenolic hydroxy group of a phenol compound with an acid-decomposable group. The phenol compound preferably contains 1 to 9 phenol skeletons, more preferably 2 to 6 phenol skeletons.

The content of the dissolution inhibiting compound based on the total solids of the composition is preferably in the range of 3 to 50 mass %, more preferably 5 to 40 mass %.

Specific examples of the dissolution inhibiting compound will be shown below, which however in no way limit the scope of the present invention.

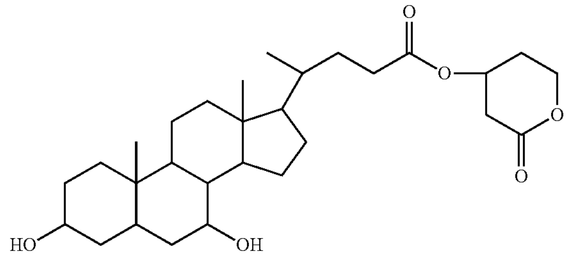

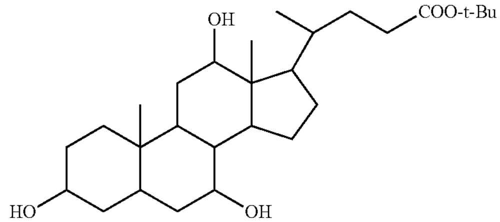

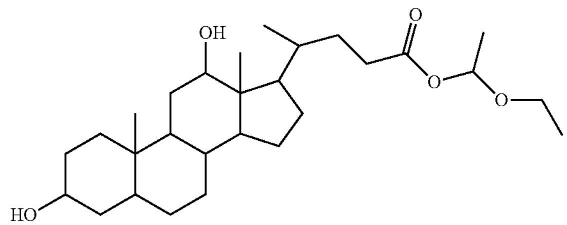

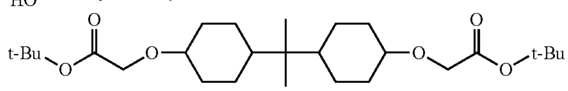

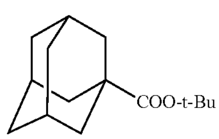

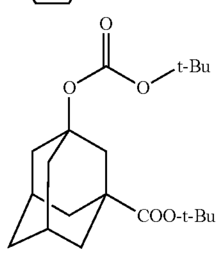

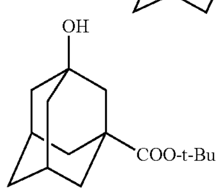

[4] Other Component

The positive or negative actinic-ray- or radiation-sensitive resin composition of the present invention may further comprise a basic compound, an organic solvent, a surfactant, a dye, a plasticizer, a photosensitizer, a compound capable of increasing the solubility in a developer, a compound containing a functional group as a proton acceptor, etc.

[Basic Compound]

The composition of the present invention may further contain a basic compound. Any change over time of performance during the period from exposure to baking (postbake) can be reduced by further containing a basic compound. Moreover, if so, the in-film diffusion of an acid generated upon exposure can be controlled.

The basic compound is preferably a nitrogen-containing organic compound. Useful compounds are not particularly limited. However, for example, the compounds of categories (1) to (4) below can be used.

(1) Compounds of General Formula (BS-1) Below (BS-1)

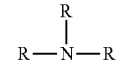

In general formula (BS-1), each of R's independently represents a hydrogen atom or an organic group, provided that at least one of three R's is an organic group. The organic group is a linear or branched alkyl group, a mono- or polycycloalkyl group, an aryl group or an aralkyl group.

The number of carbon atoms of the alkyl group represented by R is not particularly limited. However, it is generally in the range of 1 to 20, preferably 1 to 12.

The number of carbon atoms of the cycloalkyl group represented by R is not particularly limited. However, it is generally in the range of 3 to 20, preferably 5 to 15.

The number of carbon atoms of the aryl group represented by R is not particularly limited. However, it is generally in the range of 6 to 20, preferably 6 to 10. In particular, a phenyl group, a naphthyl group and the like can be mentioned.

The number of carbon atoms of the aralkyl group represented by R is not particularly limited. However, it is generally in the range of 7 to 20, preferably 7 to 11. In particular, a benzyl group and the like can be mentioned.

In the alkyl group, cycloalkyl group, aryl group and aralkyl group represented by R, a hydrogen atom thereof may be replaced by a substituent. As the substituent, there can be mentioned, for example, an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group or the like.

In the compounds of general formula (BS-1), preferably, at least two of R's are organic groups.

Specific examples of the compounds of general formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(t-butyl)aniline.

As preferred basic compounds of general formula (BS-1), there can be mentioned those in which at least one of R's is a hydroxylated alkyl group. In particular, there can be mentioned, for example, triethanolamine and N,N-dihydroxyethylaniline.

With respect to the alkyl group represented by R, an oxygen atom may be present in the alkyl chain. Namely, an oxyalkylene chain may be formed. The oxyalkylene chain is preferably —$CH_2CH_2O$—. In particular, there can be mentioned, for example, tris(methoxyethoxyethyl)amine and compounds shown by way of example in column 3 line 60 et seq. of U.S. Pat. No. 6,040,112.

(2) Compound with Nitrogen-Containing Heterocyclic Structure

The nitrogen-containing heterocycle may be aromatic or nonaromatic. It may contain a plurality of nitrogen atoms, and also may contain a heteroatom other than nitrogen. For example, there can be mentioned compounds with an imidazole structure (2-phenylbenzimidazole, 2,4,5-triphenylimidazole and the like), compounds with a piperidine structure (N-hydroxyethylpiperidine, bis(1,2,2,6,6-pentamethyl-4-piperidyl) sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. In particular, there can be mentioned, for example, 1,5-diazabicyclo[4.3.0]non-5-ene and 1,8-diazabicyclo[5.4.0]-undec-7-ene.

(3) Amine Compound with Phenoxy Group

The amine compounds with a phenoxy group are those having a phenoxy group at the end of the alkyl group of each of the amine compounds opposite to the nitrogen atom. A substituent may be introduced in the phenoxy group. The substituent is, for example, an alkyl group, an alkoxy group, a halogen atom, a cyano group, a nitro group, a carboxyl group, a carboxylic ester group, a sulfonic ester group, an aryl group, an aralkyl group, an acyloxy group or an aryloxy group.

Each of these compounds preferably contains at least one oxyalkylene chain between the phenoxy group and the nitrogen atom. The number of oxyalkylene chains in each molecule is preferably in the range of 3 to 9, more preferably 4 to 6. Among the oxyalkylene chains, $—CH_2CH_2O—$ is most preferred.

Particular examples thereof include 2-[2-{2-(2,2-dimethoxy-phenoxyethoxy)ethyl}-bis-(2-methoxyethyl)]-amine and compounds (C1-1) to (C3-3) shown by way of example in section [0066] of US Patent Application Publication No. 2007/0224539 A1.

(4) Ammonium Salt

Ammonium salts can also be appropriately used. Ammonium hydroxides and carboxylates are preferred. Particular preferred examples thereof are tetraalkylammonium hydroxides, such as tetrabutylammonium hydroxide.

As other basic compounds usable in the positive or negative actinic-ray- or radiation-sensitive resin composition of the present invention, there can be mentioned compounds synthesized in Examples of JP-A -2002-363146, compounds described in section [0108] of JP-A-2007-298569 and the like Further, photosensitive basic compounds may be used as the basic compound. As photosensitive basic compounds, use can be made of, for example, the compounds described in Jpn. PCT National Publication No. 2003-524799, J. Photopolym. Sci&Tech. Vol. 8, pp. 543-553 (1995), etc.

The molecular weight of each of these basic compounds is preferably in the range of 250 to 2000, more preferably 400 to 1000.

One of these basic compounds may be used alone, or two or more thereof may be used in combination.

The content of the basic compounds based on the total solids of the composition is preferably in the range of 0.01 to 8.0 mass %, more preferably 0.1 to 5.0 mass % and most preferably 0.2 to 4.0 mass %.

[Surfactant]

The composition according to the present invention may further contain a surfactant. The surfactant is most preferably a fluorinated and/or siliconized surfactant.

As such a surfactant, there can be mentioned, for example, Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., or polysiloxane polymer KP-341 produced by Shin-Etsu Chemical Co., Ltd.

Surfactants other than these fluorinated and/or siliconized surfactants can also be used. In particular, the other surfactants include polyoxyethylene alkyl ethers, polyoxyethylene alkyl aryl ethers and the like.

Moreover, heretofore known surfactants can also be appropriately used. As useful surfactants, there can be mentioned, for example, those described in section [0273] et seq of US Patent Application Publication No. 2008/0248425 A1.

These surfactants may be used alone or in combination.

The content of the surfactant is preferably in the range of 0 to 2 mass %, more preferably 0.0001 to 2 mass % and still more preferably 0.001 to 1 mass %, based on the total solids of the composition.

[Solvent]

The solvent that is usable in the preparation of the composition is not particularly limited as long as it can dissolve the components of the composition. For example, use can be made of an alkylene glycol monoalkyl ether carboxylate (propylene glycol monomethyl ether acetate (PGMEA, also known as 1-methoxy-2-acetoxypropane) or the like), an alkylene glycol monoalkyl ether (propylene glycol monomethyl ether (PGME, also known as 1-methoxy-2-propanol) or the like), an alkyl lactate (ethyl lactate, methyl lactate or the like), a cyclolactone (γ-butyrolactone or the like, preferably having 4 to 10 carbon atoms), a linear or cyclic ketone (2-heptanone, cyclohexanone or the like, preferably having 4 to 10 carbon atoms), an alkylene carbonate (ethylene carbonate, propylene carbonate or the like), an alkyl carboxylate (preferably an alkyl acetate such as butyl acetate), an alkyl alkoxyacetate (preferably ethyl ethoxypropionate) or the like. As other useful solvents, there can be mentioned, for example, those described in section [0244] et seq. of US 2008/0248425 A1 and the like.

Among the above solvents, an alkylene glycol monoalkyl ether carboxylate, an alkylene glycol monoalkyl ether, and ethyl lactate are especially preferred.

These solvents may be used alone or in combination. When two or more types of solvents are mixed together before use, it is preferred to mix a hydroxylated solvent with a non-hydroxylated solvent. The mass ratio of hydroxylated solvent to non-hydroxylated solvent is in the range of, for example, 1/99 to 99/1. The mass ratio is preferably 10/90 to 90/10, more preferably 20/80 to 60/40.

The hydroxylated solvent is preferably an alkylene glycol monoalkyl ether or an alkyl lactate. The non-hydroxylated solvent is preferably an alkylene glycol monoalkyl ether carboxylate.

The amount of solvent used is not particularly limited. However, the amount is generally so regulated that the total solid concentration of the composition falls in the range of preferably 0.5 to 30 mass %, more preferably 1.0 to 10 mass %. In particular when an electron beam or EUV lithography is carried out using the composition of the present invention, the amount is so regulated that the concentration falls in the range of preferably 2.0 to 6.0 mass %, more preferably 2.0 to 4.5 mass %.

[Other Additive]

According to necessity, the positive or negative actinic-ray- or radiation-sensitive resin composition of the present invention may further comprise a dye, a plasticizer, a photosensitizer, a light absorber, a compound capable of accelerating the dissolution in a developer (for example, a phenolic compound of 1000 or less molecular weight, or a carboxylated alicyclic or aliphatic compound), etc. Furthermore, appropriate use can be made of compounds containing a functional group with proton acceptor properties as described in, for example, JP-A's 2006-208781 and 2007-286574.

[5] Method of Forming Pattern

The positive or negative actinic-ray- or radiation-sensitive resin composition of the present invention is typically used in the following manner. Namely, the composition of the present invention is typically applied onto a support, such as a substrate, thereby forming a film. The thickness of the film is preferably in the range of 0.02 to 10.0 μm. The method of application onto a substrate is preferably a spin coating. The spin coating is performed at a rotating speed of preferably 1000 to 3000 rpm.

For example, the composition is applied onto, for example, any of substrates (e.g., silicon/silicon dioxide coating, silicon nitride and chromium-vapor-deposited quartz substrate, etc.) for use in, for example, the production of precision integrated circuit devices, etc. by appropriate application means, such as a spinner or a coater. The thus applied composition is dried, thereby obtaining an actinic-ray- or radiation-sensitive film (hereinafter also referred to as a photosensitive film). The application of the composition can be preceded by the application of a heretofore known antireflection film.

The resultant photosensitive film is exposed to actinic rays or radiation, preferably baked (heated), and developed. A pattern of enhanced quality can be obtained by baking. From the viewpoint of sensitivity and stability, the baking temperature is preferably in the range of 80 to 150° C., more preferably 90 to 130° C.

As the actinic rays or radiation, there can be mentioned, for example, infrared light, visible light, ultraviolet light, far-ultraviolet light, X-rays or electron beams. It is preferred for the actinic rays or radiation to have, for example, a wavelength of 250 nm or shorter, especially 220 nm or shorter. As such actinic rays or radiation, there can be mentioned, for example, a KrF excimer laser (248 nm), an ArF excimer laser (193 nm), an $F_2$ excimer laser (157 nm), X-rays or electron beams. As especially preferred actinic rays or radiation, there can be mentioned an ArF excimer laser, $F_2$ excimer laser, EUV-rays (13 nm) or electron beams.

The exposure performed in the condition that the interstice between the photosensitive film and a lens is filled with a liquid (for example, pure water) whose refractive index is higher than that of air, namely, liquid-immersion exposure may be carried out in the stage of the exposure to actinic rays or radiation. This liquid-immersion exposure can enhance the resolution. At the liquid-immersion exposure, for the prevention of any contact of the resist film with the immersion liquid, a film that is highly insoluble in the immersion liquid (also referred to as a "top coat") may be disposed on the film and between the film and the immersion liquid. As another means for the prevention of any contact of the film with the immersion liquid, a hydrophobic resin (HR) may be added to the above composition in advance.

The hydrophobic resin (HR) will be described in detail below.

In the exposure of the film of the composition of the present invention via the liquid immersion medium, a hydrophobic resin (HR) may be further added according to necessity. This would bring about uneven localization of the hydrophobic resin (HR) on the surface layer of the film. When the liquid immersion medium is water, there would be attained an improvement of receding contact angle on the surface of the film with reference to water upon formation of the film, and accordingly an enhancement of the liquid immersion water tracking property. By the addition of the hydrophobic resin (HR), the improvement of the receding contact angle on the surface of the film is realized. The receding contact angle of the film is preferably in the range of 60° to 90°, more preferably 70° or higher. Although the hydrophobic resin (HR) is unevenly localized on the interface as aforementioned, differing from the surfactant, the hydrophobic resin does not necessarily have to have a hydrophilic group in its molecule and does not need to contribute toward uniform mixing of polar/nonpolar substances.

The receding contact angle refers to a contact angle determined when the contact line at a droplet-substrate interface draws back. It is generally known that the receding contact angle is useful in the simulation of droplet mobility in a dynamic condition. In a simple definition, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the resist film in dynamic condition is important, and it is required for the resist to be capable of tracking the high-speed scanning of the exposure head without leaving any droplets.

As the hydrophobic resin (HR) is unevenly distributed in a surface of the film, it is preferred for the hydrophobic resin to contain a fluorine atom or a silicon atom. The fluorine atom or silicon atom of the hydrophobic resin (HR) may be present in the principal chain of the resin or may be a substituent on the side chain thereof.

The hydrophobic resin (HR) is preferably a resin having an alkyl group containing a fluorine atom, a cycloalkyl group containing a fluorine atom or an aryl group containing a fluorine atom as a partial structure containing a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a monocyclic or polycyclic alkyl group having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

(F2)

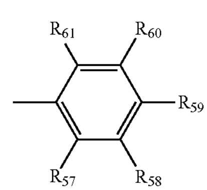

-continued (F3)

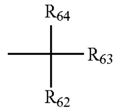

(F4)

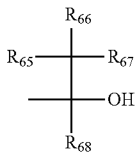

In the general formulae (F2) to (F4), each of $R_{57}$ to $R_{68}$ independently represents a hydrogen atom, a fluorine atom or an alkyl group, provided that at least one of each of $R_{57}$-$R_{61}$, $R_{62}$-$R_{64}$ and $R_{65}$-$R_{68}$ represents a fluorine atom or an alkyl group (preferably having 1 to 4 carbon atoms) having at least one hydrogen atom thereof substituted with a fluorine atom. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded with each other to thereby form a ring.

Specific examples of the groups of the general formula (F2) include a p-fluorophenyl group, a pentafluorophenyl group, a 3,5-di(trifluoromethyl)phenyl group and the like.

Specific examples of the groups of the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl) isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of the general formula (F4) include —$C(CF_3)_2OH$, —$C(C_2F_5)_2OH$, —$C(CF_3)(CF_3)OH$, —$CH(CF_3)OH$ and the like. —$C(CF_3)_2OH$ is preferred.

Specific examples of the repeating units having a fluorine atom will be shown below, which however in no way limit the scope of the present invention.

In the specific examples, $X_1$ represents a hydrogen atom, —$CH_3$, —F or —$CF_3$. $X_2$ represents —F or —$CF_3$.

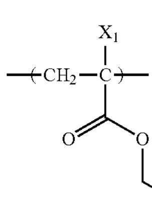

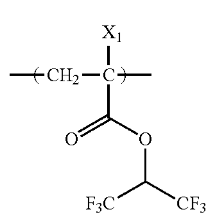

-continued

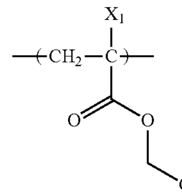

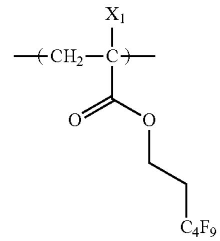

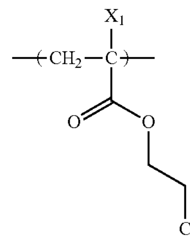

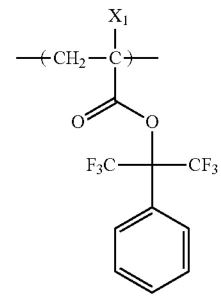

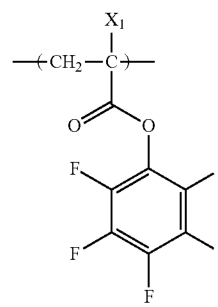

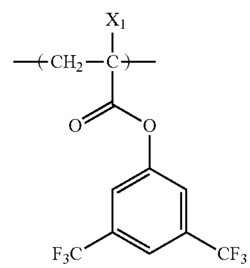

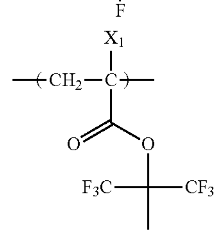

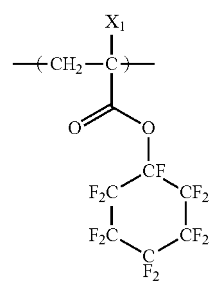

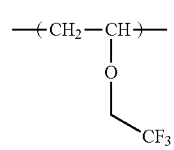

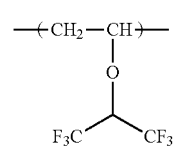

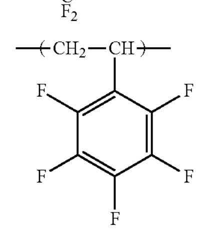

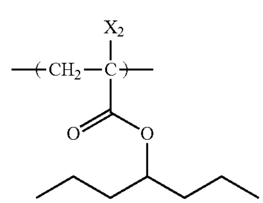

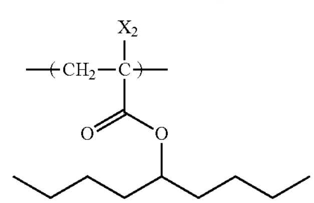

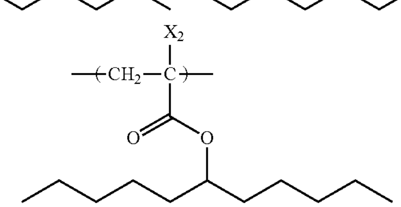

-continued

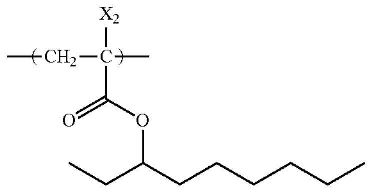

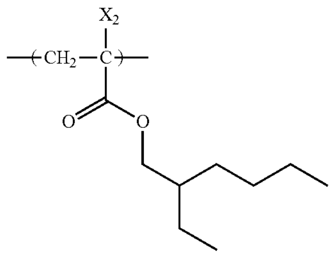

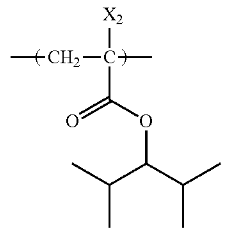

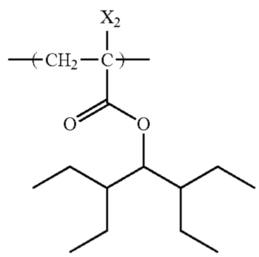

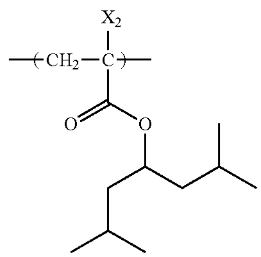

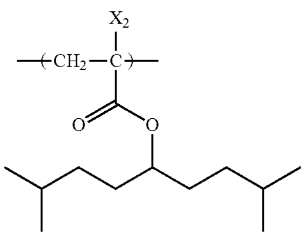

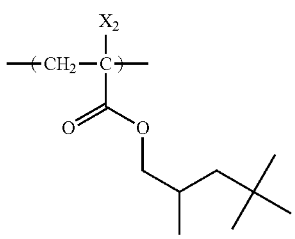

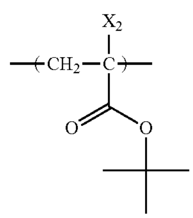

The hydrophobic resin (HR) may contain a silicon atom. The hydrophobic resin (HR) is preferably a resin having an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

(CS-1)

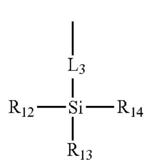

-continued (CS-2)

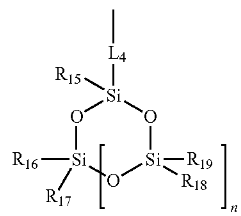

(CS-3)

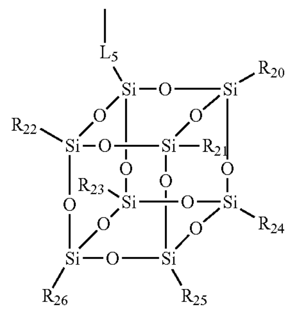

In the general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

In the formulae, n is an integer of 1 to 5. n is preferably an integer of 2 to 4.

Specific examples of the repeating units having the groups of the general formulae (CS-1) to (CS-3) will be shown below, which however in no way limit the scope of the present invention.

In the specific examples, $X_1$ represents a hydrogen atom, $—CH_3$, —F or $—CF_3$.

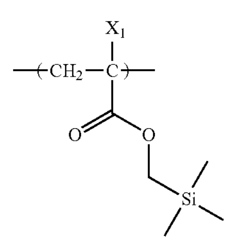

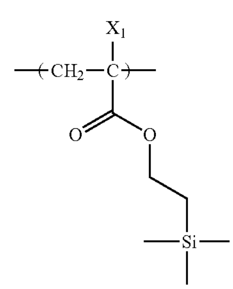

-continued

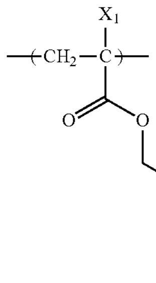

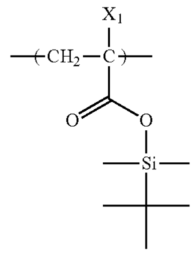

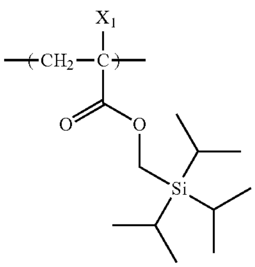

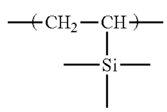

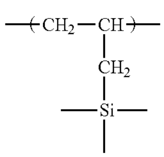

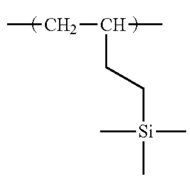

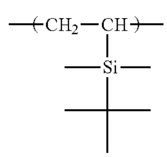

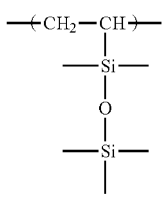

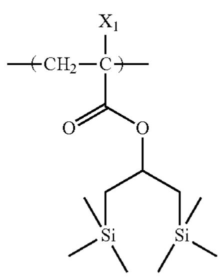

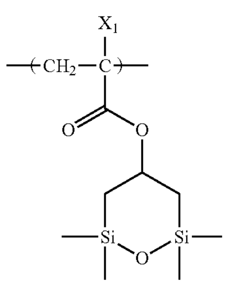

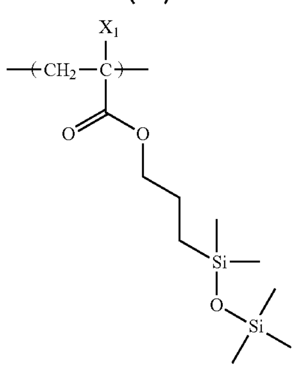

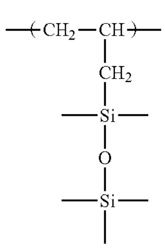

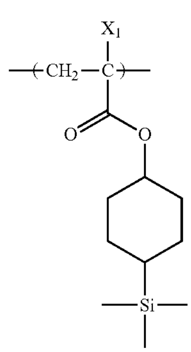

-continued

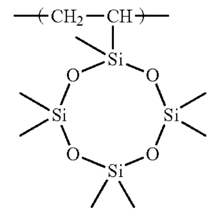

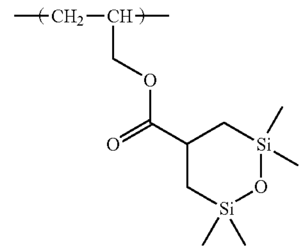

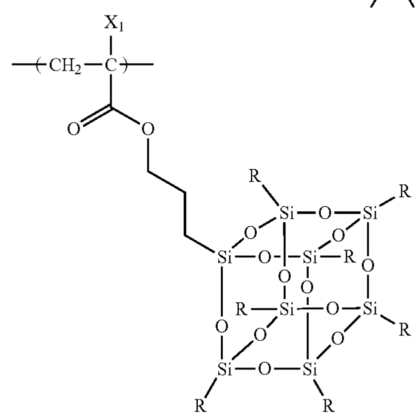

R = $CH_3$, $C_2H_5$, $C_3H_7$, $C_4H_9$

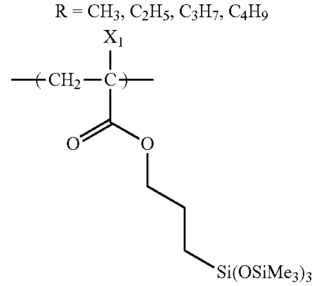

Moreover, the hydrophobic resin (HR) may have at least one group selected from among the following groups (x) to (z):

(x) an alkali soluble group, (y) a group that is decomposed by the action of an alkali developer, resulting in an increase of solubility in the alkali developer, and (z) a group that is decomposed by the action of an acid.

As the alkali soluble group (x), there can be mentioned a phenolic hydroxyl group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali soluble groups, there can be mentioned a fluoroalcohol group (preferably hexafluoroisopropanol), a sulfonimido group and a bis(carbonyl)methylene group.

As the repeating unit having an alkali soluble group (x), preferred use is made of any of a repeating unit resulting from direct bonding of an alkali soluble group to the principal chain of a resin like a repeating unit of acrylic acid or methacrylic acid, a repeating unit resulting from bonding, via a connecting group, of an alkali soluble group to the principal chain of a resin and a repeating unit resulting from polymerization with the use of a chain transfer agent or polymerization initiator having an alkali soluble group to thereby introduce the same in a polymer chain terminal.

The content of repeating units having an alkali soluble group (x) is preferably in the range of 1 to 50 mol %, more preferably 3 to 35 mol % and still more preferably 5 to 20 mol % based on all the repeating units of the polymer.

Specific examples of the repeating units having an alkali soluble group (x) will be shown below, which however in no way limit the scope of the present invention. In the formulae, Rx represents H, $CH_3$, $CF_3$ or $CH_2OH$.

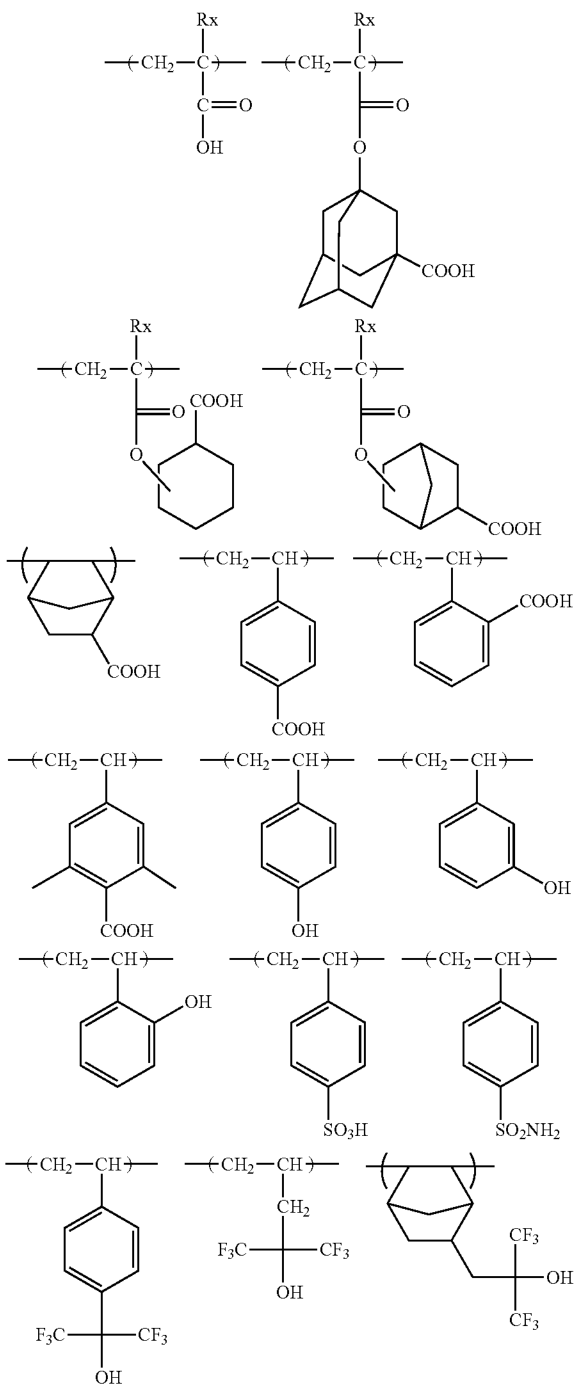

-continued

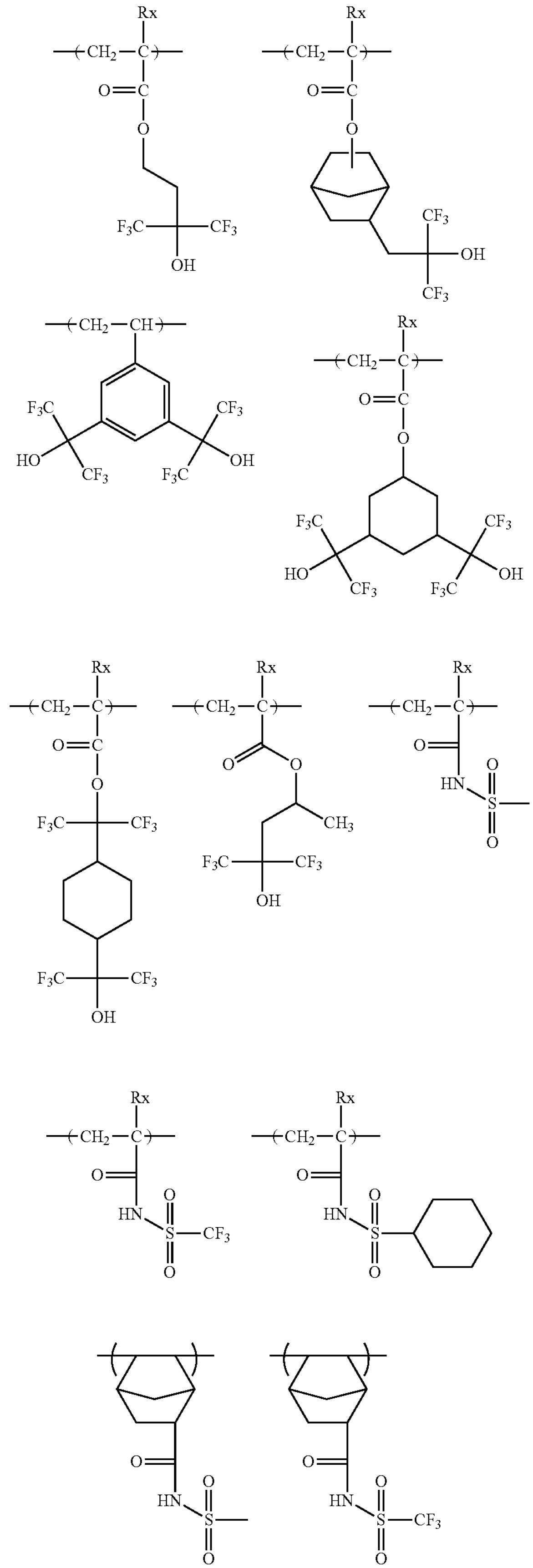

-continued

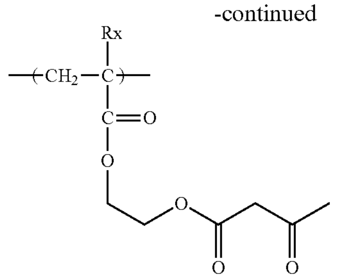

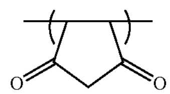

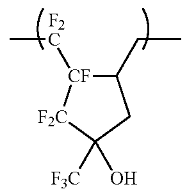

As the group (y) that is decomposed by the action of an alkali developer, resulting in an increase of solubility in the alkali developer, there can be mentioned, for example, a group having a lactone structure, an acid anhydride group, an acid imide group or the like. A group having a lactone structure is preferred.

As the repeating unit having a group (y) that is decomposed by the action of an alkali developer, resulting in an increase of solubility in the alkali developer, preferred use is made of both of a repeating unit resulting from bonding of a group (y) that is decomposed by the action of an alkali developer, resulting in an increase of solubility in the alkali developer, to the principal chain of a resin such as a repeating unit of acrylic ester or methacrylic ester, and a repeating unit resulting from polymerization with the use of a chain transfer agent or polymerization initiator having a group (y) resulting in an increase of solubility in an alkali developer to thereby introduce the same in a polymer chain terminal.

The content of repeating units having a group (y) resulting in an increase of solubility in an alkali developer is preferably in the range of 1 to 40 mol %, more preferably 3 to 30 mol % and still more preferably 5 to 15 mol % based on all the repeating units of the polymer.

As specific examples of the repeating units having a group (y) resulting in an increase of solubility in an alkali developer, there can be mentioned those similar to the repeating units having a lactone structure set forth with respect to the resins as the component (A).

As the repeating unit having a group (z) that is decomposed by the action of an acid in the hydrophobic resin (HR), there can be mentioned those similar to the repeating units having an acid decomposable group set forth with respect to the resin (A). The content of repeating units having a group (z) that is decomposed by the action of an acid in the hydrophobic resin (HR) is preferably in the range of 1 to 80 mol %, more preferably 10 to 80 mol % and still more preferably 20 to 60 mol % based on all the repeating units of the polymer.

The hydrophobic resin (HR) may further have any of the repeating units of the following general formula (VII).

(VII)

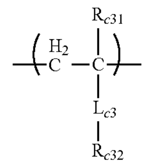

In the general formula (VII), $R_{c31}$ represents a hydrogen atom, an alkyl group, an alkyl group substituted with a fluorine atom, a cyano group or —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, especially preferably a hydrogen atom or a methyl group.

$R_{c32}$ represents a group having any of an alkyl group, a cycloalkyl group, an alkenyl group, a cycloalkenyl group and an aryl group. These groups may optionally be substituted with a fluorine atom or a silicon atom.

$L_{c3}$ represents a single bond or a bivalent connecting group.

In the general formula (VII), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, such as a phenyl group or a naphthyl group. These groups may have a substituent.

Preferably, $R_{c32}$ represents an unsubstituted alkyl group or an alkyl group substituted with a fluorine atom.

The bivalent connecting group represented by $L_{c3}$ is preferably an alkylene group (preferably having 1 to 5 carbon atoms), an oxy group, a phenylene group or an ester bond (group of the formula —COO—).

Further, the hydrophobic resin (HR) may preferably have any of the repeating units of general formula (CII-AB) below.

(CII-AB)

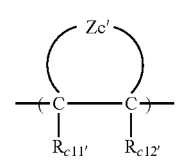

In the general formula (CII-AB), each of $R_{c11'}$ and $R_{c12'}$ independently represents a hydrogen atom, a cyano group, a halogen atom or an alkyl group.

Zc' represents an atomic group for forming an alicyclic structure which contains two bonded carbon atoms (C—C).

Specific examples of the repeating units of the general formula (III) and general formula (CII-AB) will be shown below, which however in no way limit the scope of the present invention. In the formulae, Ra represents H, $CH_3$, $CH_2OH$, $CF_3$ or CN.

-continued
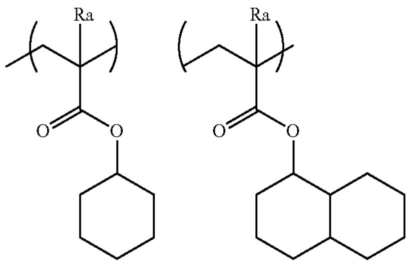
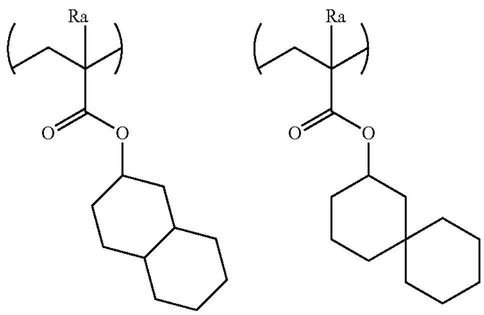
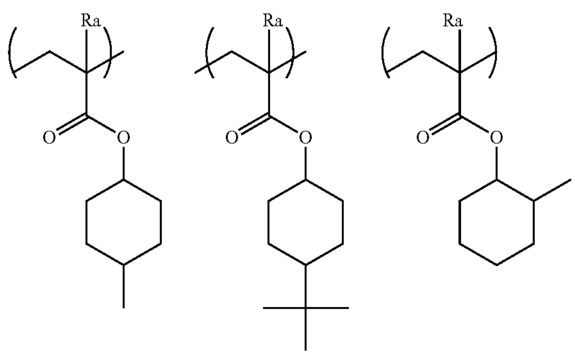
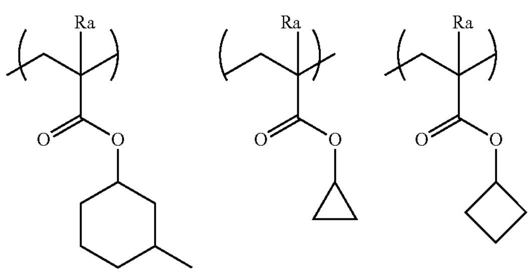
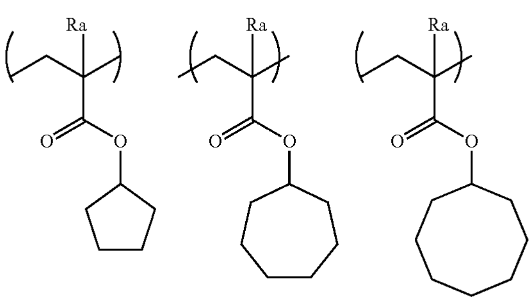
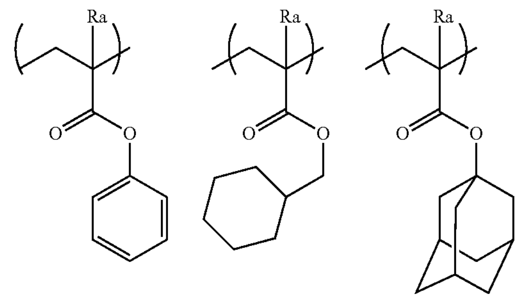
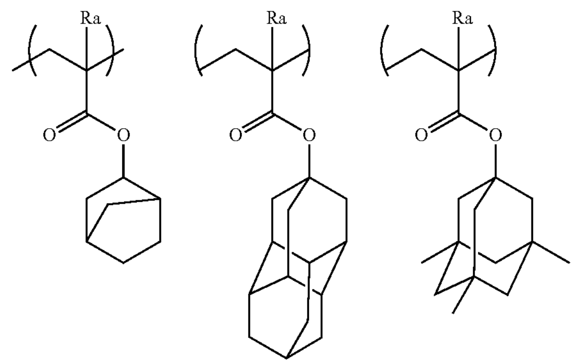
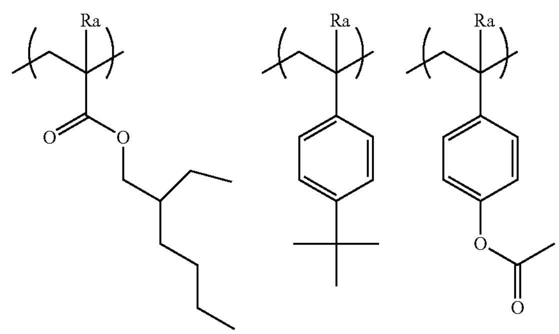
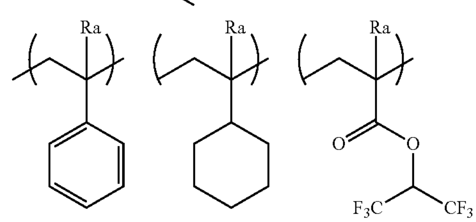
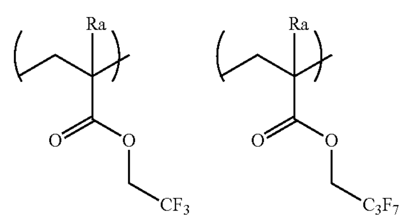
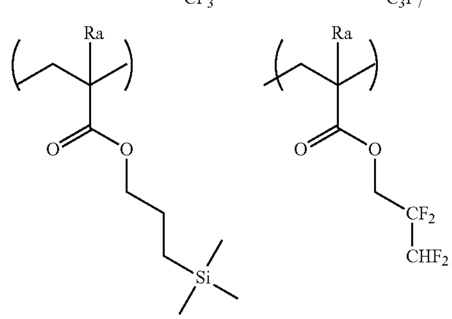

-continued

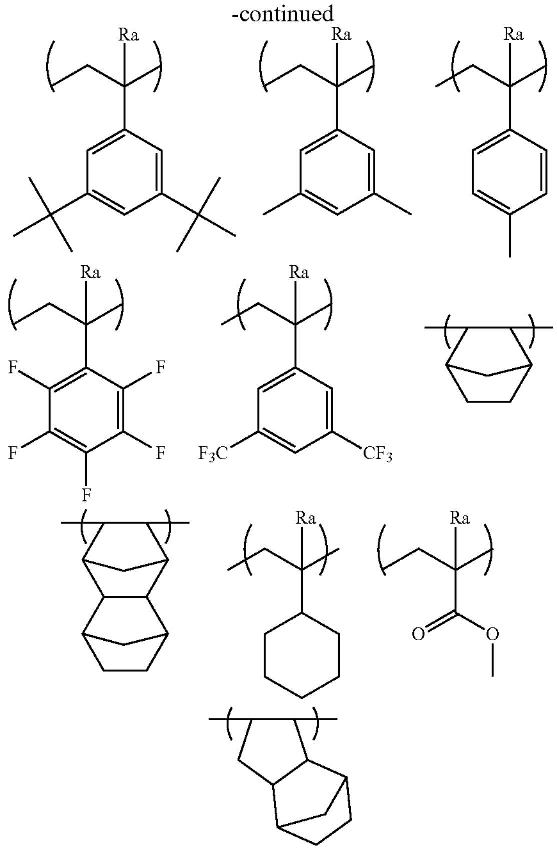

When the hydrophobic resin (HR) has a fluorine atom, the content of fluorine atom(s) is preferably in the range of 5 to 80 mass %, more preferably 10 to 80 mass %, based on the molecular weight of the hydrophobic resin (HR). The repeating unit containing a fluorine atom preferably exists in the hydrophobic resin (HR) in an amount of 10 to 100 mass %, more preferably 30 to 100 mass %.

When the hydrophobic resin (HR) has a silicon atom, the content of silicon atom(s) is preferably in the range of 2 to 50 mass %, more preferably 2 to 30 mass %, based on the molecular weight of the hydrophobic resin (HR). The repeating unit containing a silicon atom preferably exists in the hydrophobic resin (HR) in an amount of 10 to 100 mass %, more preferably 20 to 100 mass %.

The weight average molecular weight of the hydrophobic resin (HR) in terms of standard polystyrene molecular weight is preferably in the range of 1,000 to 100,000, more preferably 1,000 to 50,000 and still more preferably 2,000 to 15,000.

The content of the hydrophobic resin (HR) in the composition is preferably in the range of 0.01 to 10 mass %, more preferably 0.05 to 8 mass % and still more preferably 0.1 to 5 mass % based on the total solid of the composition of the present invention.

Impurities, such as metals, should naturally be of low quantity in the hydrophobic resin (HR), as for the resin (A). The content of residual monomers and oligomer components is preferably 0 to 10 mass %, more preferably 0 to 5 mass % and still more preferably 0 to 1 mass %. Accordingly, there can be obtained a resist being free from a change of in-liquid foreign matter, sensitivity, etc. over time. From the viewpoint of resolving power, resist profile, side wall of resist pattern, roughness, etc., the molecular weight distribution (Mw/Mn, also referred to as the polydispersity) thereof is preferably in the range of 1 to 5, more preferably 1 to 3 and still more preferably 1 to 2.

A variety of commercially available products can be used as the hydrophobic resin (HR), and also the resin can be synthesized in accordance with conventional methods (for example, radical polymerization). As general synthesizing methods, there can be mentioned, for example, a batch polymerization method in which a monomer species and an initiator are dissolved in a solvent and heated to thereby carry out polymerization, a dropping polymerization method in which a solution of monomer species and initiator is dropped into a hot solvent over a period of 1 to 10 hours, and the like. The dropping polymerization method is preferred. As a reaction solvent, there can be mentioned, for example, an ether such as tetrahydrofuran, 1,4-dioxane or diisopropyl ether, a ketone such as methyl ethyl ketone or methyl isobutyl ketone, an ester solvent such as ethyl acetate, an amide solvent such as dimethylformamide or dimethylacetamide, or the aforementioned solvent capable of dissolving the composition of the present invention, such as propylene glycol monomethyl ether acetate, propylene glycol monomethyl ether or cyclohexanone. Preferably, the polymerization is carried out with the use of the same solvent as that used in the composition of the present invention. This would inhibit any particle generation during storage.

The polymerization reaction is preferably carried out in an atmosphere consisting of an inert gas, such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxyl group are more preferred. As specific preferred initiators, there can be mentioned azobisisobutyronitrile, azobisdimethylvaleronitrile, dimethyl 2,2'-azobis(2-methylpropionate) and the like. The reaction concentration is in the range of 5 to 50 mass %, preferably 30 to 50 mass %. The reaction temperature is generally in the range of 10° to 150° C., preferably 30° to 120° C. and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents and the like. Of these, it is preferred to employ a solvent containing at least an alcohol (especially methanol or the like) or water as the precipitation or re-precipitation solvent.

The amount of precipitation or re-precipitation solvent used is generally in the range of 100 to 10,000 parts by mass, preferably 200 to 2000 parts by mass and more preferably 300 to 1000 parts by mass per 100 parts by mass of the polymer solution, according to intended efficiency, yield, etc.

The temperature at which the precipitation or re-precipitation is carried out is generally in the range of about 0° to 50° C., preferably about room temperature (for example, about 20° to 35° C.), according to efficiency and operation easiness. The operation of precipitation or re-precipitation can be carried out by a publicly known method, such as a batch or continuous method, with the use of a common mixing vessel, such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° to 100° C., preferably about 30° to 50° C. at ordinary pressure or reduced pressure (preferably reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d) and separating the precipitated resin (step e).

Specific examples of the hydrophobic resins (HR) will be shown below. The following Table 1 shows the molar ratio of individual repeating units (corresponding to individual repeating units in order from the left), weight average molecular weight and degree of dispersal with respect to each of the resins.

(HR-1)

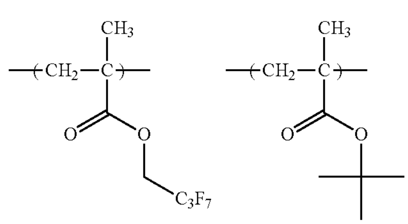

(HR-2)

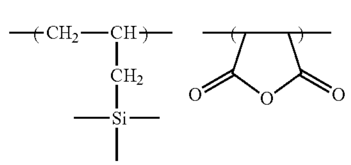

-continued (HR-3)

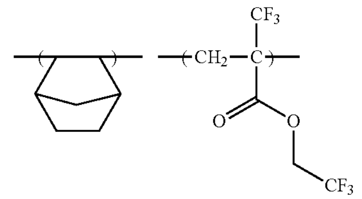

(HR-4)

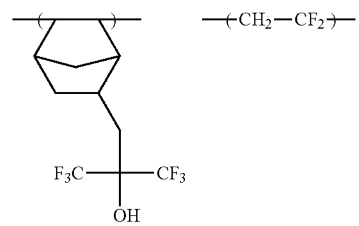

(HR-5)

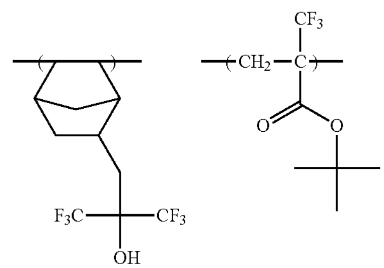

(HR-6)

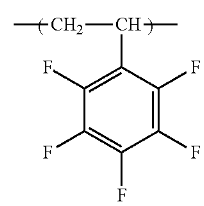

(HR-7)

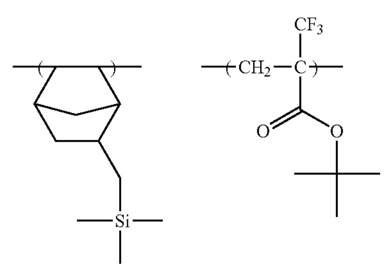

(HR-8)

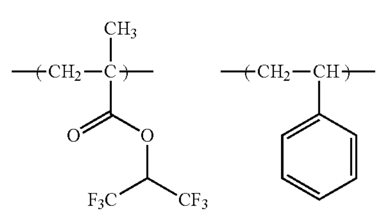

-continued
(HR-9)
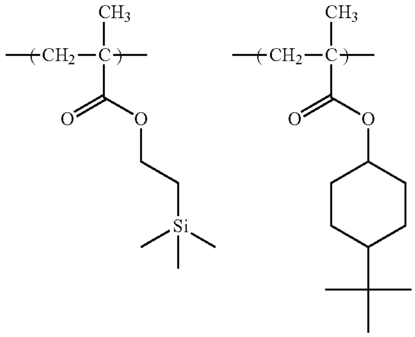
(HR-10)
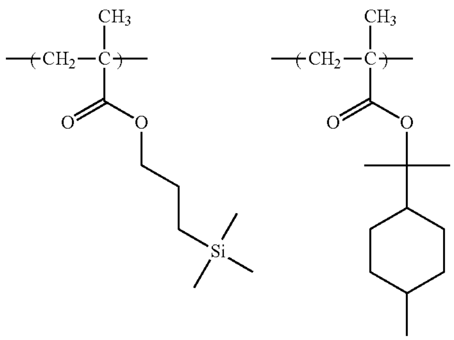
(HR-11)
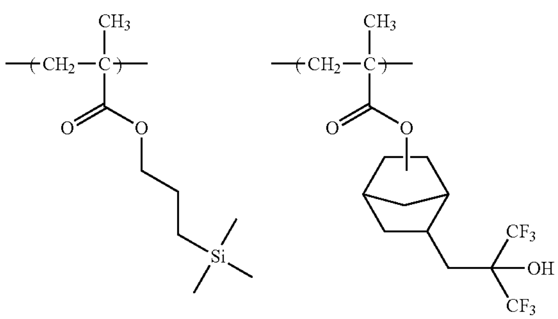
(HR-12)
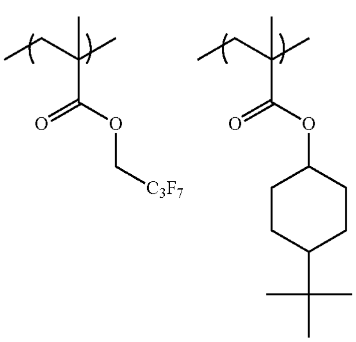
-continued
(HR-13)
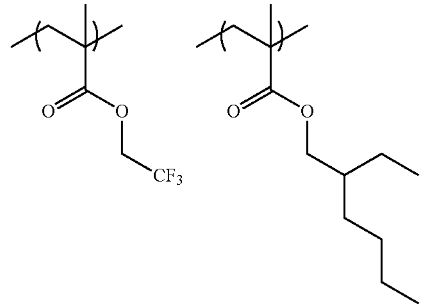
(HR-14)
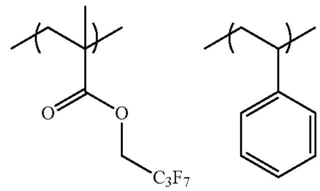
(HR-15)
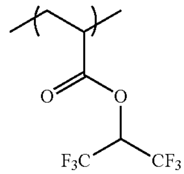
(HR-16)
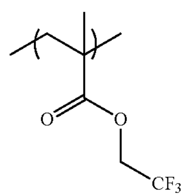
(HR-17)
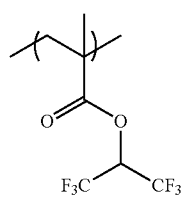
(HR-18)
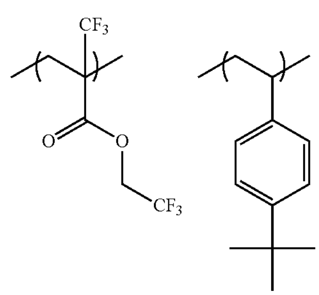

-continued
(HR-19)
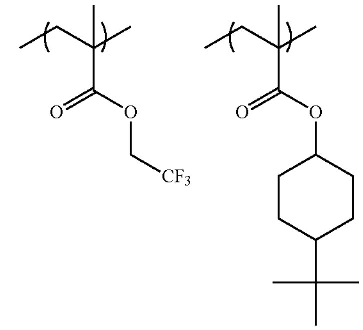
(HR-20)
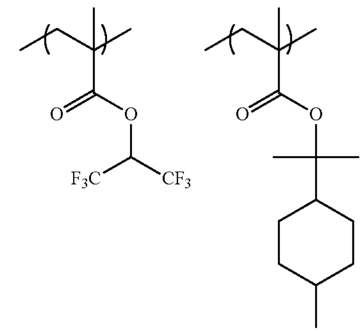
(HR-21)
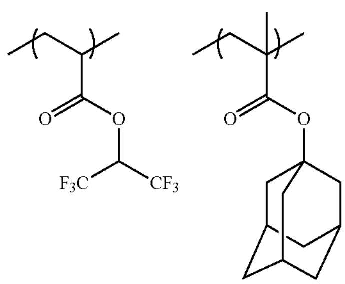
(HR-22)
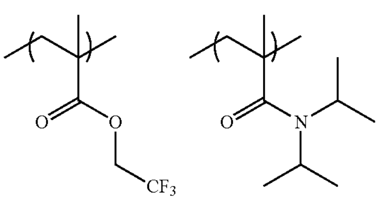
(HR-23)
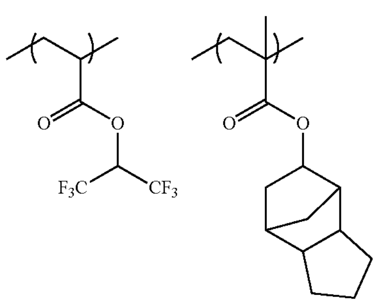
-continued
(HR-24)
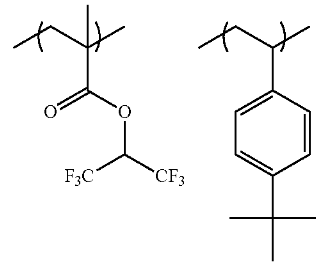
(HR-25)
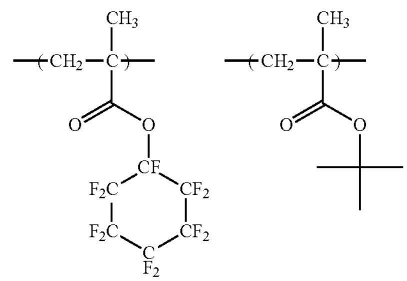
(HR-26)
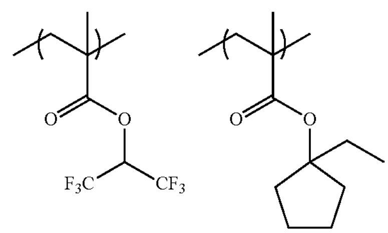
(HR-27)
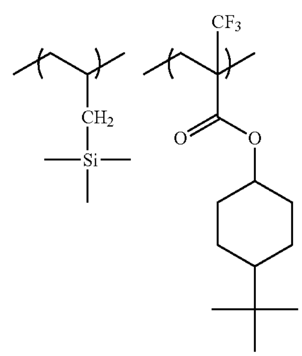
(HR-28)
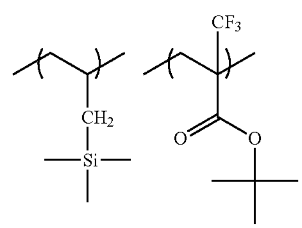
(HR-29)
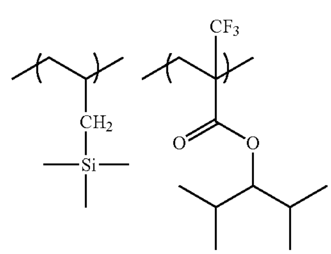

(HR-30)
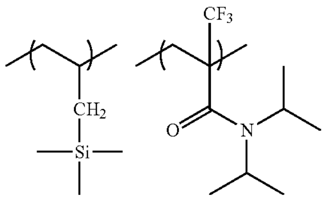
(HR-31)
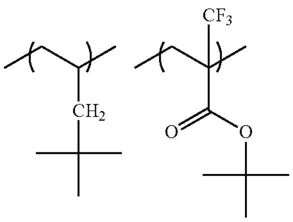
(HR-32)
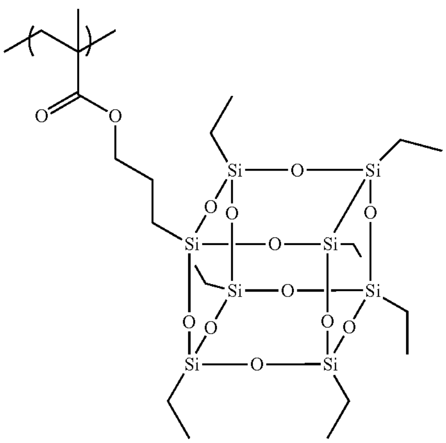
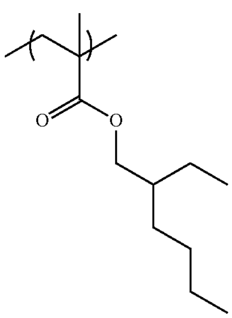
(HR-33)
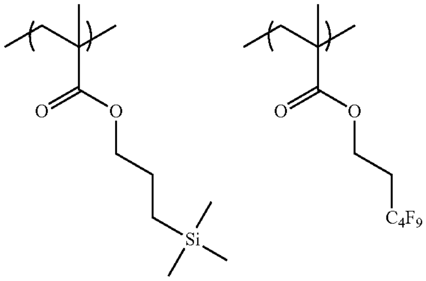
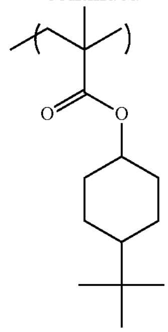
(HR-34)
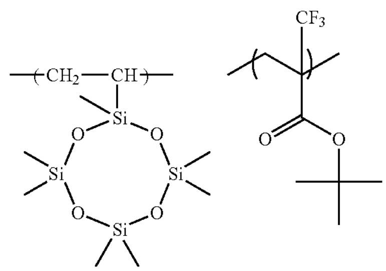
(HR-35)
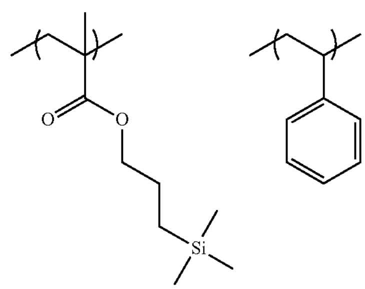
(HR-36)
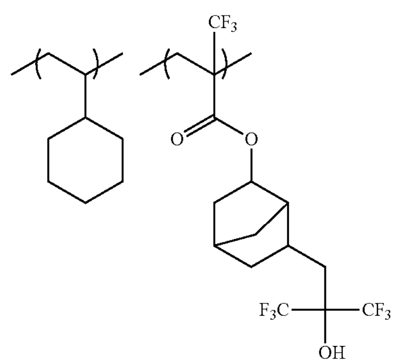
(HR-37)
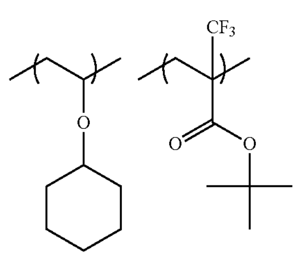

-continued
(HR-38)
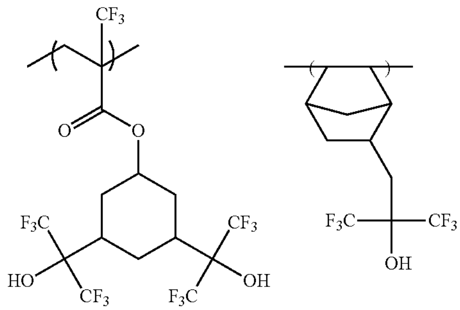
(HR-39)
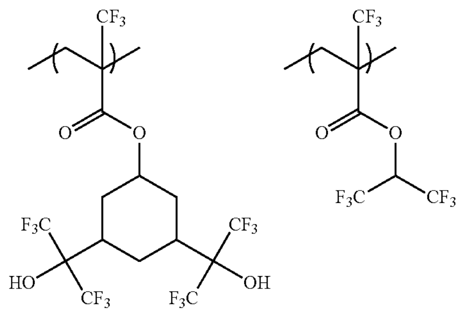
(HR-40)
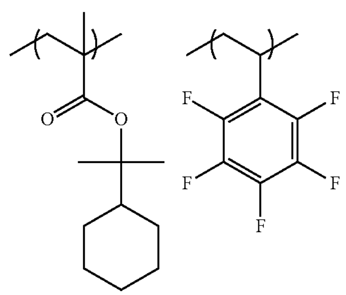
(HR-41)
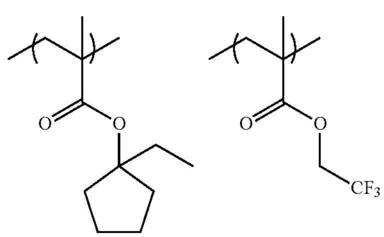
(HR-42)
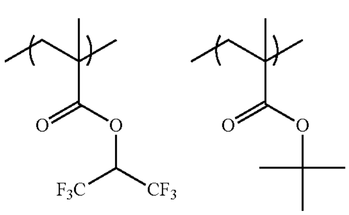
-continued
(HR-43)
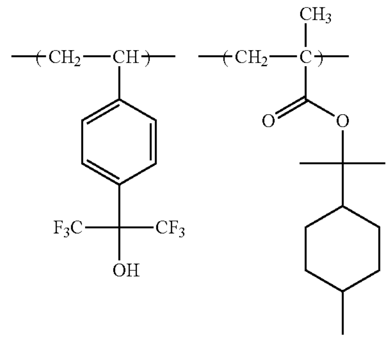
(HR-44)
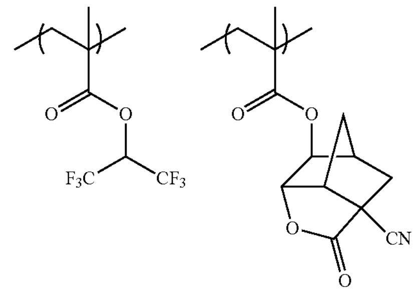
(HR-45)
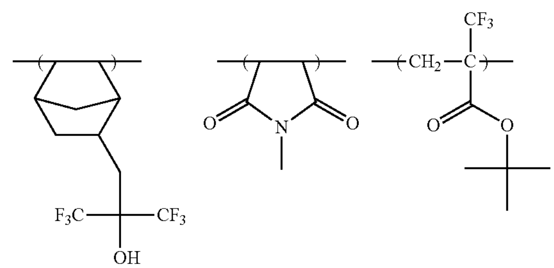
(HR-46)
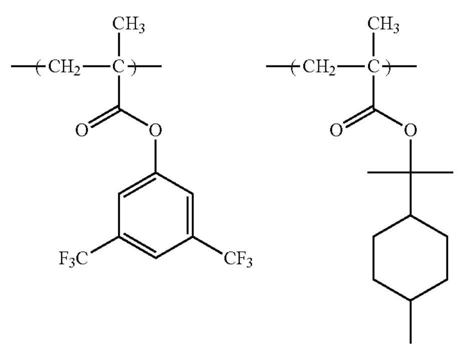
(HR-47)
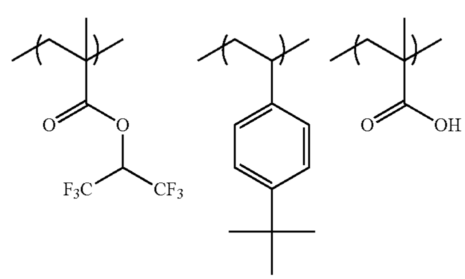

-continued
(HR-48)
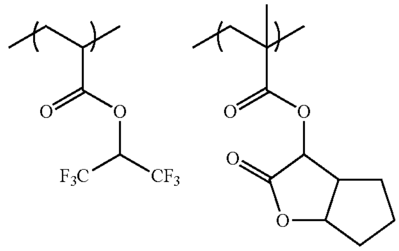
(HR-49)
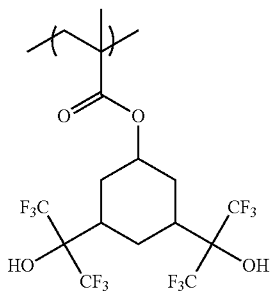
(HR-50)
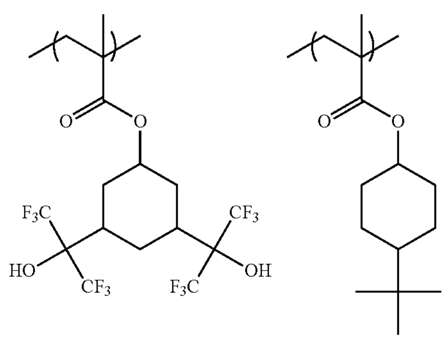
(HR-51)
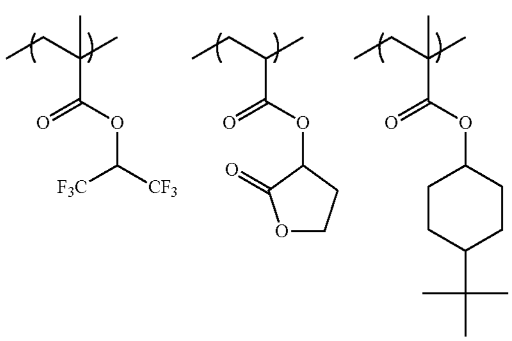
(HR-52)
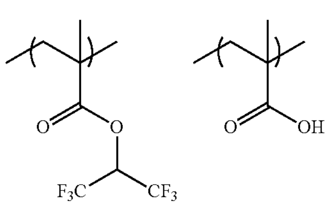
-continued
(HR-53)
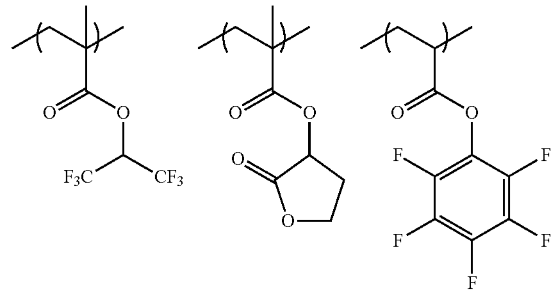
(HR-54)
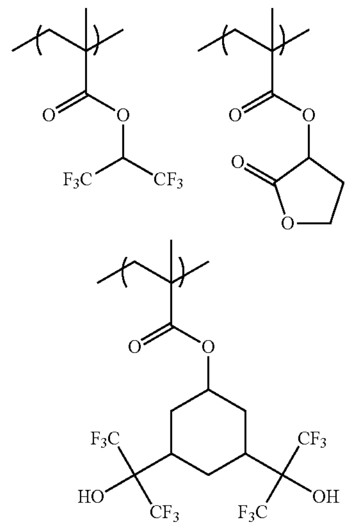
(HR-55)
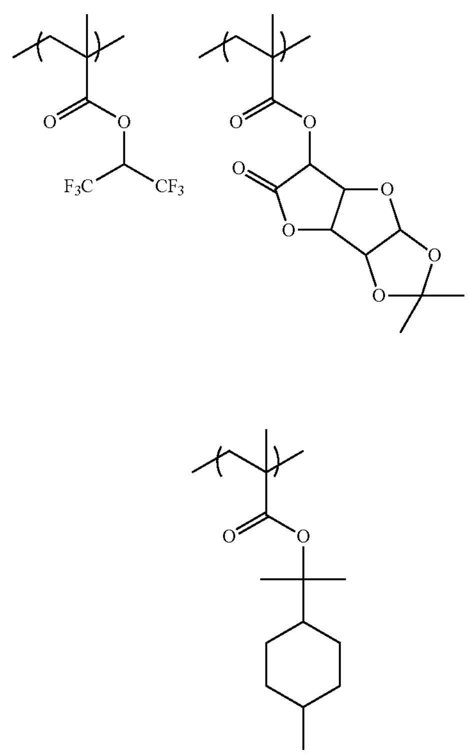

-continued
(HR-56)
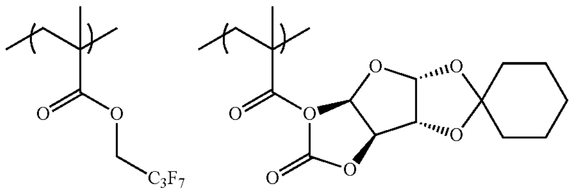
(HR-57)
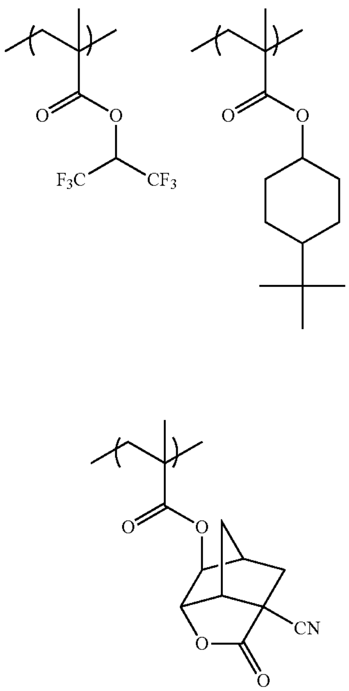
(HR-58)
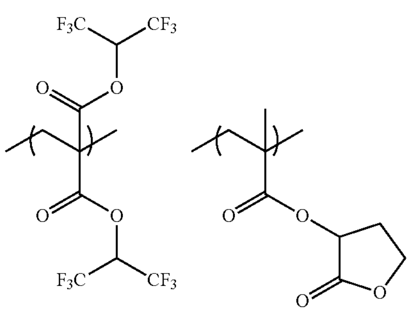
(HR-59)
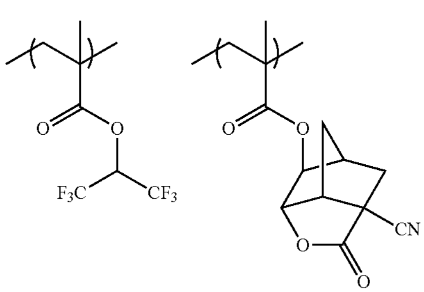
-continued
(HR-60)
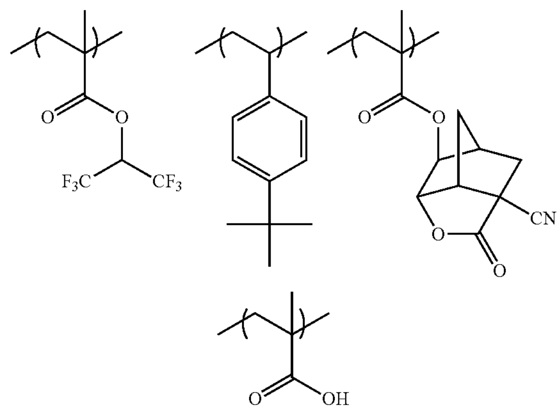
(HR-61)
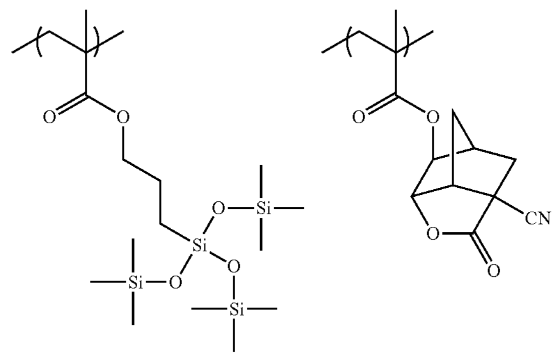
(HR-62)
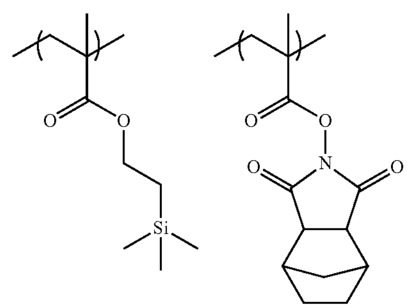
(HR-63)
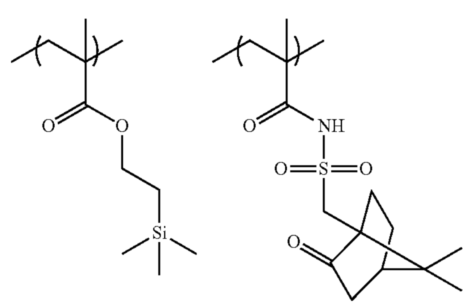
(HR-64)
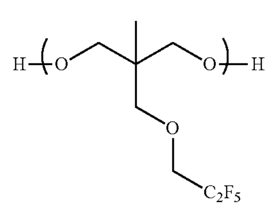

-continued (HR-65)

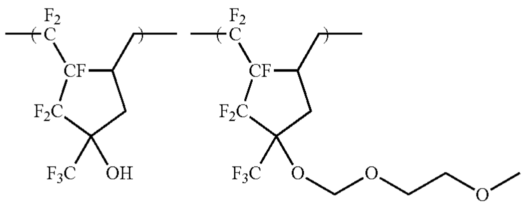

TABLE 1

| resin | composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |

TABLE 1-continued

| resin | composition | Mw | Mw/Mn |
|---|---|---|---|
| HR-63 | 80/20 | 7000 | 1.7 |
| HR-64 | 100 | 5500 | 1.8 |
| HR-65 | 50/50 | 9500 | 1.9 |

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

Further, from the viewpoint of refractive index increase, use can be made of a medium having a refractive index of 1.5 or higher. Such a medium may be an aqueous solution or an organic solvent.

In the use of water as a liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase a surface activating power. The additive is preferably an aliphatic alcohol with a refractive index approximately equal to that of water, for example, methyl alcohol, ethyl alcohol, isopropyl alcohol or the like. The addition of an alcohol with a refractive index approximately equal to that of water is advantageous in that even when the alcohol component is evaporated from water to thereby cause a change of content concentration, the change of refractive index of the liquid as a whole can be minimized. On the other hand, when a substance being opaque in 193 nm rays or an impurity whose refractive index is greatly different from that of water is mixed therein, the mixing would invite a distortion of optical image projected on the resist film. Accordingly, it is preferred to use distilled water as the liquid immersion water. Furthermore, use may be made of pure water having been filtered through an ion exchange filter or the like.

Desirably, the electrical resistance of the water is 18.3 MQcm or higher, and the TOC (organic matter concentration) thereof is 20 ppb or below. Prior deaeration of the water is desired.

Raising the refractive index of the liquid for liquid immersion would enable an enhancement of lithography performance. From this viewpoint, an additive suitable for refractive index increase may be added to the water, or heavy water ($D_2O$) may be used in place of water.

For the prevention of direct contact of a film with a liquid for liquid immersion, a film that is highly insoluble in the liquid for liquid immersion (hereinafter also referred to as a "top coat") may be provided between the film from the composition of the present invention and the liquid for liquid immersion. The functions to be fulfilled by the top coat are applicability to an upper layer portion of the film, transparency in radiation of especially 193 nm and being highly insoluble in the liquid for liquid immersion. Preferably, the top coat does not mix with the film and is uniformly applicable to an upper layer of the film.

From the viewpoint of 193 nm transparency, the top coat preferably consists of a polymer not abundantly containing an aromatic moiety. As such, there can be mentioned, for example, a hydrocarbon polymer, an acrylic ester polymer, polymethacrylic acid, polyacrylic acid, polyvinyl ether, a siliconized polymer, a fluoropolymer or the like. The aforementioned hydrophobic resins (HR) also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or a separate peeling agent may be used. The peeling agent preferably consists of a solvent having a lower permeation into the film. Detachability by an alkali developer is preferred from the viewpoint of simultaneous attainment of the detachment step with the development processing step for the film. The top coat is preferred to be acidic from the viewpoint of detachment with the use of an alkali developer. However, from the viewpoint of non-intermixability with the film, the top coat may be neutral or alkaline.

The less the difference in refractive index between the top coat and the liquid for liquid immersion, the higher the resolving power. In an ArF excimer laser (wavelength: 193 nm), when water is used as the liquid for liquid immersion, the top coat for ArF liquid immersion exposure preferably has a refractive index close to that of the liquid for liquid immersion. From the viewpoint of approximation of the refractive index to that of the liquid for liquid immersion, it is preferred for the top coat to contain a fluorine atom. From the viewpoint of transparency and refractive index, it is preferred to reduce the thickness of the film.

Preferably, the top coat does not mix with the film and also does not mix with the liquid for liquid immersion. From this viewpoint, when the liquid for liquid immersion is water, it is preferred for the solvent used in the top coat to be highly insoluble in the solvent used in the actinic ray-sensitive or radiation-sensitive resin composition and be a non-water-soluble medium. When the liquid for liquid immersion is an organic solvent, the top coat may be soluble or insoluble in water.

The developing step will be described below.

In the development step, an alkali developer is generally used.

As the alkali developer, use can be made of any of alkaline aqueous solutions containing, for example, an inorganic alkali compound such as sodium hydroxide, potassium hydroxide, sodium carbonate, sodium silicate, sodium metasilicate or aqueous ammonia; a primary amine such as ethylamine or n-propylamine; a secondary amine such as diethylamine or di-n-butylamine; a tertiary amine such as triethylamine or methyldiethylamine; an alcoholamine such as dimethylethanolamine or triethanolamine; a quaternary ammonium salt such as tetramethylammonium hydroxide or tetraethylammonium hydroxide; or a cycloamine such as pyrrole or piperidine.

Appropriate amounts of an alcohol and/or a surfactant may be added to the alkali developer.

The concentration of alkali developer is generally in the range of 0.1 to 20 mass %. The pH value of the alkali developer is generally in the range of 10.0 to 15.0.

In the developing operation, use may be made of a developer whose main component is an organic solvent. In that instance, the obtained pattern is negative. The particulars of the method of forming a negative pattern with the use of a developer whose main component is an organic solvent are described in, for example, JP-A's 2010-217884 and 2011-248019.

With respect to the particulars of the process for fabricating an imprint mold using the composition according to the present invention, reference can be made to, for example, Japanese Patent No. 4109085, JP-A-2008-162101, "Fundamentals of nanoimprint and its technology development/application deployment-technology of nanoimprint substrate and its latest technology deployment" edited by Yoshihiko Hirai, published by Frontier Publishing, etc.

EXAMPLE

The present invention will be described in greater detail below by way of its examples. However, the gist of the present invention is in no way limited to these examples.

Synthetic Example 1

Synthesis of Resin (A-1)

Poly(p-hydroxystyrene) (VP-8000, produced by Nippon Soda Co., Ltd.) as a polyhydroxystyrene compound amounting to 30.0 g was dissolved in 120 g of acetone. Thereafter, 1.32 g of 1-chloromethylnaphthalene, 2.07 g of potassium carbonate and 0.56 g of sodium iodide were added to the solution and refluxed for four hours. About half the amount of acetone was distilled off by means of an evaporator, and 200 ml of ethyl acetate and then 200 ml of 1N hydrochloric acid was added thereto under agitation. The thus obtained mixture was transferred into a separatory funnel, and the water phase was removed. The resultant organic phase was washed with 200 ml of 1N hydrochloric acid and then 200 ml of distilled water. The washed organic phase was concentrated by means of an evaporator, and dissolved in 120 g of propylene glycol monomethyl ether acetate (PGMEA). As a result of this sequence of operations, 3% naphthylmethylated poly(p-hydroxystyrene) (PGMEA solution) was obtained.

Subsequently, 9.81 g of 2,6-diphenylphenoxyethyl vinyl ether as a vinyl ether compound was added to the above solution. Further, 1.45 g of 2% camphorsulfonic acid (PGMEA solution) was added, and agitated at room temperature for four hours. Thereafter, 1.05 g of 10% triethylamine (PGMEA solution) was added to the mixture, and agitated for a while. The resultant reaction liquid was transferred into a separatory funnel in which 165 ml of ethyl acetate was placed in advance. The thus obtained organic phase was washed with 200 ml of distilled water thrice, and the washed organic phase was concentrated by means of an evaporator while removing ethyl acetate. The resultant reaction liquid was dropped into 2 lit. of hexane. An aliquot of the thus obtained precipitate was sampled for NMR measurement, and the remainder was dissolved in 70 g of PGMEA. Low-boiling-point solvents were removed from the obtained solution by means of an evaporator. As a result, 101.6 g of a PGMEA solution of resin (A-1) (32.4 mass %) was obtained.

With respect to the obtained resin (A-1), the component ratio (molar ratio) thereof was calculated by $^1$H-NMR analysis. Further, with respect to the resin (A-1), the weight average molecular weight (Mw: polystyrene-equivalent), the number average molecular weight (Mn: polystyrene-equivalent) and the polydispersity index (Mw/Mn, hereinafter also referred to as "PDI") were calculated by GPC analysis (solvent: THF). The thus obtained results are indicated in the chemical formula below.

(A-1)

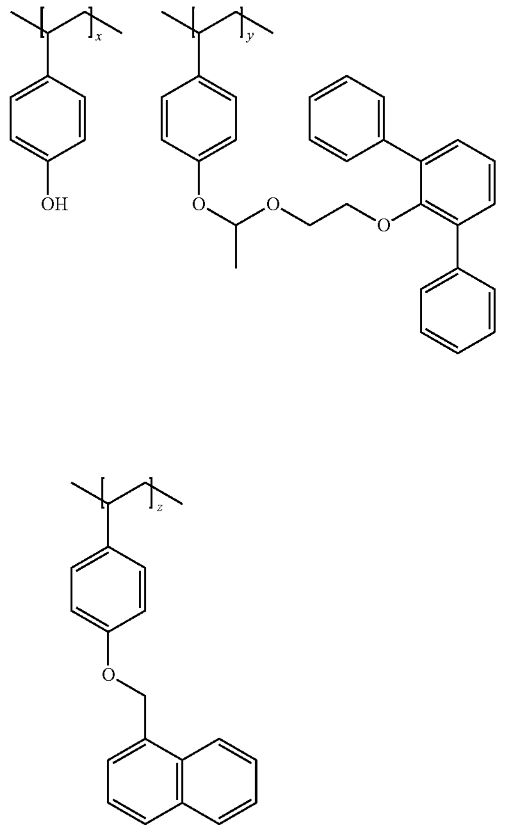

x/y/z = 85/12/3
Mw = 12100 PDI = 1.07

Synthetic Example 3

Synthesis of Resin (A-2)

(Synthesis of Chloroether Compound)

In a 500 ml round-bottomed flask, 20.0 g of adamantane-1-carboaldehyde, 16.8 g of trimethyl orthoformate, 283 mg of camphorsulfonic acid and 100 ml of hexane were placed, and agitated at 25° C. for an hour. Subsequently, 617 mg of triethylamine was added to the mixture and agitated. The resultant organic phase was washed with 150 ml of distilled water thrice. The hexane was removed in vacuum conditions. Thus, 24.0 g of the following compound 1 was obtained as an acetal compound.

Thereafter, 8.96 g of acetyl chloride was added to 20.0 g of obtained compound 1, and agitated in a water bath heated at 45° C. for four hours. The temperature was lowered to room temperature, and unreacted acetyl chloride was removed in vacuum conditions. Thus, 20.42 g of the following compound 2 was obtained as a chloroether compound.

$^{1}$H-NMR ($CDCl_3$: ppm) δ: 1.58-1.83 (12H, m), 2.02 (3H, s), 3.52 (3H, s), 5.08 (1H, s).

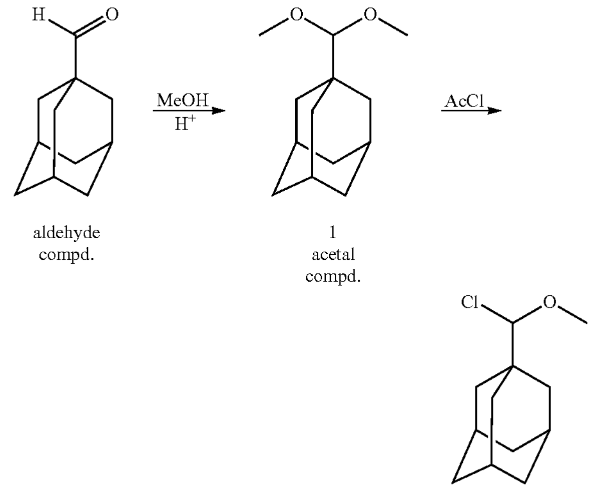

aldehyde compd.

1
acetal compd.

2
chloroether compd.

(Synthesis of Resin (A-2))

Poly(p-hydroxystyrene) (VP-2500, produced by Nippon Soda Co., Ltd.) as a polyhydroxystyrene compound amounting to 10.0 g was dissolved in 60 g of tetrahydrofuran (THF). Thereafter, 8.85 g of triethylamine was added to the solution and agitated in an ice water bath. The above obtained compound 2 (4.47 g) was dropped into the resultant reaction liquid, and agitated for four hours. A small amount of reaction liquid was sampled and subjected to $^{1}$H-NMR analysis. It was found that the protection ratio was 22.3%. Thereafter, a procedure comprising further adding a small amount of compound 2, agitating the mixture for an hour and performing $^{1}$H-NMR analysis was repeated. When the protection ratio exceeded the target value of 25.0%, the reaction was terminated by adding distilled water to the mixture. THF was distilled off in vacuum, and the reaction product was dissolved in ethyl acetate. The thus obtained organic phase was washed with distilled water five times, and the washed organic phase was dropped into 1.5 lit. of hexane. The thus obtained precipitate was separated by filtration, and washed with a small amount of hexane. The washed precipitate was dissolved in 35 g of propylene glycol monomethyl ether acetate (PGMEA). Low-boiling-point solvents were removed from the obtained solution by means of an evaporator. Thus, 43.3 g of a PGMEA solution of resin (A-2) (23.7 mass %) was obtained.

(A-2)

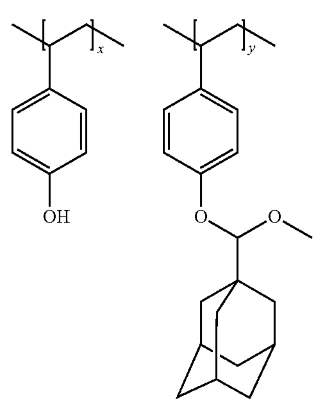

x/y = 77/25
Mw = 4400 PDI = 1.17

[Acid Generator (B)]
B-1
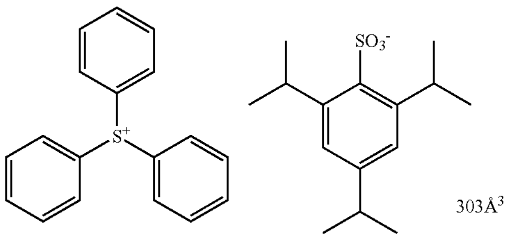
303Å$^3$
B-2
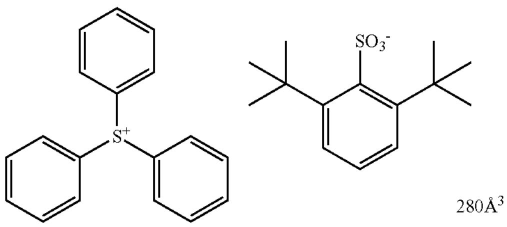
280Å$^3$
B-3
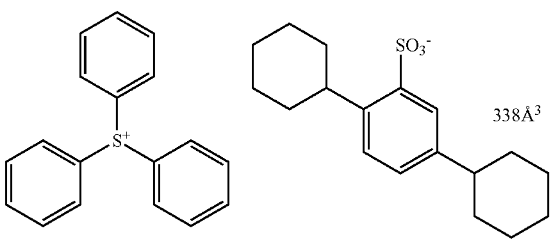
338Å$^3$
B-4
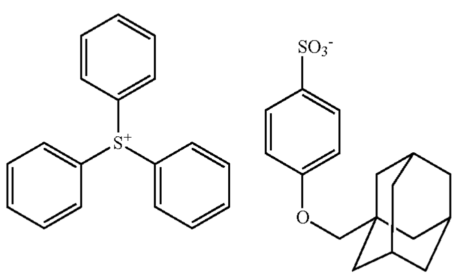
310Å$^3$
B-5
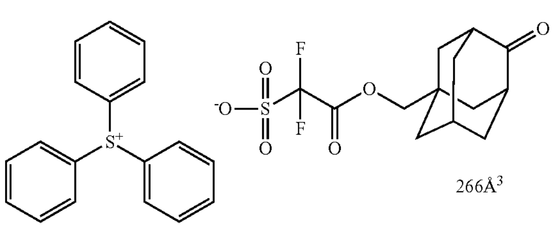
266Å$^3$
[Acid Generator (C)]
C-1
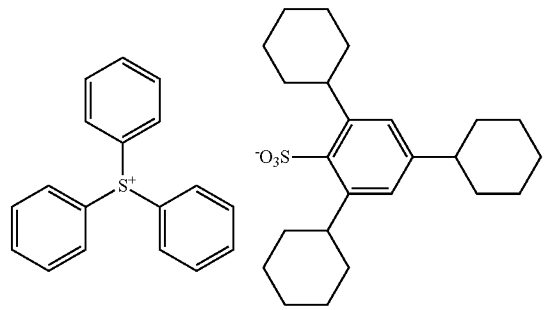
437Å$^3$
C-2
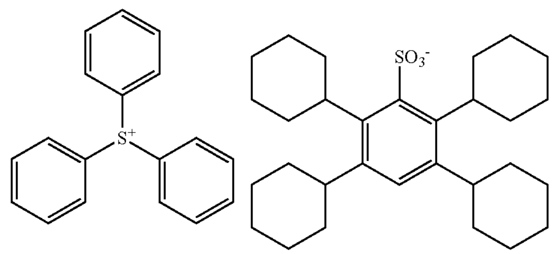
529Å$^3$
C-3
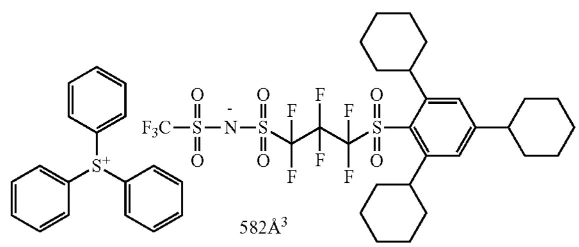
582Å$^3$
C-4
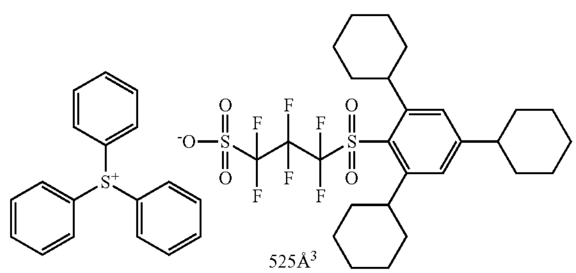
525Å$^3$
C-5
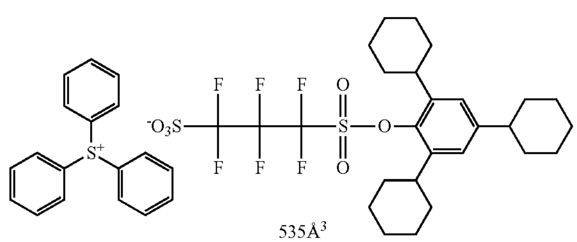
535Å$^3$

[Other Acid Generator (D)]

D-1

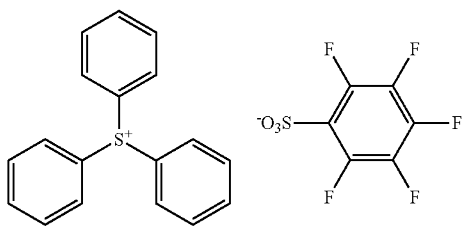

$127Å^3$

D-2

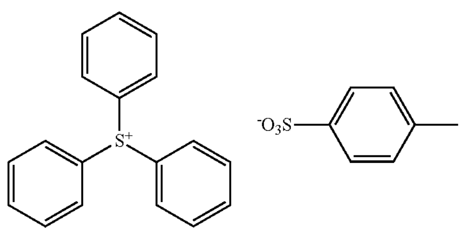

$186Å^3$

D-3

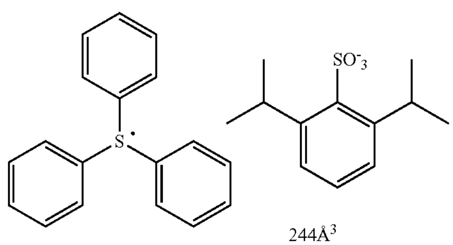

$244Å^3$

<Basic Compound>

BASE1: TBAH (tetrabutylammonium hydroxide), and

BASE2: TPI (triphenylimidazole).

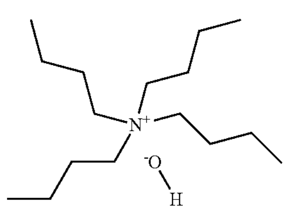

BASE1 (TBAH)

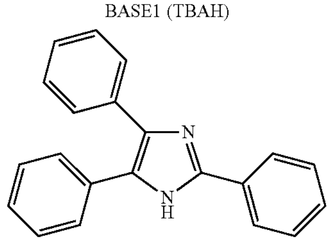

BASE2 (TPI)

<Solvent>

S1: PGMEA (propylene glycol monomethyl ether acetate),

S2: PGME (propylene glycol monomethyl ether),

S3: EL (ethyl lactate), and

S4: CyHx (cyclohexanone).

<Surfactant>

W-1: Megafac R08 (produced by DIC Corporation, fluorinated and siliconized), and W-2: PF6320 (produced by OMNOVA SOLUTIONS, INC., fluorinated).

<Preparation of Resist>

Dissolution of individual components in solvents as indicated in the following Table was carried out, and the thus obtained solutions were each passed through a polytetrafluoroethylene filter of 0.1 μm pore size, thereby obtaining positive resist solutions of total solid contents as indicated in the Table. The content of each component indicated in the Table is mass % based on the mass of total solids (excluding surfactants).

<Evaluation of Resist>

Each of the prepared positive resist solutions was uniformly applied onto a silicon substrate having undergone hexamethyldisilazane treatment by means of a spin coater, and dried by baking on a hot plate at 130° C. for 90 seconds. Thus, resist films each having a thickness of 0.10 μm were formed.

Each of the obtained resist films was exposed to electron beams by means of an electron beam irradiating apparatus (model HL750, acceleration voltage 50 KeV) manufactured by Hitachi, Ltd. The exposed film was immediately baked on a hot plate at 120° C. for 90 seconds. The baked film was developed with a 2.38 mass % aqueous tetramethylammonium hydroxide solution at 23° C. for 60 seconds, rinsed with pure water for 30 seconds and dried. Thus, isolated line patterns and contact hole patterns were obtained.

[Sensitivity]

Each of the obtained patterns was observed by means of a scanning electron microscope (model S-9220, manufactured by Hitachi, Ltd.). The sensitivity (Eo) was defined as the electron beam exposure amount in which a predetermined size 100 nm (IsoLine or Hole) was reproduced.

(IsoLine Resolving Power and Hole Resolving Power)

The IsoLine resolving power was defined as a limiting IsoLine resolving power (minimum line width at which a line and a space could be separated and resolved from each other) under the exposure amount exhibiting the above sensitivity. With respect to the Hole resolving power, the resolution was defined as a minimum size at which no missing hole occurred.

[LER (Line Edge Roughness)]

A 100 nm line width line and space 1/1 pattern was observed by means of a critical dimension scanning electron microscope (SEM) in the measurement of line edge roughness (nm). The distance between actual edge and a reference line on which edges were to be present was measured on 50 points within a 2 μm edge region in the longitudinal direction of the line pattern by means of a critical dimension SEM (model S-9220, manufactured by Hitachi, Ltd.). The standard deviation of measured distances was determined, and 3σ was computed therefrom. The smaller the value thereof, the more favorable the LER performance exhibited.

[Pattern Profile]

The shape of a cross section of each 100 nm line pattern formed in the exposure amount exhibiting the above sensitivity was observed by means of a scanning electron microscope (model S-4800, manufactured by Hitachi, Ltd.) The pattern shape was graded into T-top, rectangle and round-top on a 3-point scale.

TABLE 2

| Ex. | Resin A (89 mass %) | Photoacid generator B (mass %) | | Volume of generated acid (Å$^3$) | Photoacid generator C (mass %) | | Volume of generated acid (Å$^3$) | Average value (Å$^3$) | Basic comp. (1 mass %) | Solvent (mass ratio) | Surfactant (0.01 mass %) | Total solid content (mass %) |
|---|---|---|---|---|---|---|---|---|---|---|---|---|
| Ex. 1 | A-1 | B-1 | 2.5 | 303 | C-1 | 7.5 | 437 | 404 | BASE1 | S1/S2/S3 (60/20/20) | None | 3.2 |
| Ex. 2 | A-1 | B-1 | 5.0 | 303 | C-1 | 5.0 | 437 | 370 | BASE1 | S1/S2 (80/20) | None | 3.5 |
| Ex. 3 | A-1 | B-1 | 7.5 | 303 | C-1 | 2.5 | 437 | 337 | BASE2 | S1/S2 (80/20) | None | 3.5 |
| Ex. 4 | A-1 | B-5 | 5.0 | 266 | C-4 | 5 | 525 | 396 | BASE1 | S1/S2 (80/20) | W-1 | 3.5 |
| Ex. 5 | A-1 | B-2 | 5.0 | 280 | C-2 | 5.0 | 529 | 405 | BASE1 | S1/S2 (80/20) | None | 3.5 |
| Ex. 6 | A-1 | B-3 | 5.0 | 338 | C-5 | 5.0 | 535 | 437 | BASE1 | S1/S2/S4 (60/20/20) | W-1 | 3.2 |
| Ex. 7 | A-1 | B-3 | 5.0 | 338 | C-3 | 5.0 | 582 | 460 | BASE1 | S1/S2 (80/20) | None | 3.5 |
| Ex. 8 | A-2 | B-1 | 5.0 | 303 | C-1 | 5 | 437 | 370 | BASE1 | S1/S2 (80/20) | None | 3.5 |
| Ex. 9 | A-2 | B-2 | 5.0 | 280 | C-2 | 5 | 529 | 405 | BASE2 | S1/S2 (80/20) | None | 3.5 |
| Ex. 10 | A-2 | B-4 | 5.0 | 310 | C-4 | 5 | 525 | 418 | BASE1 | S1/S2 (80/20) | W-2 | 3.5 |
| Ex. 11 | A-2 | B-3 | 5.0 | 338 | C-3 | 5 | 582 | 460 | BASE1 | S1/S2 (80/20) | None | 3.5 |
| Comp. Ex. 1 | A-1 | | | | C-1 | 10.0 | 437 | 437 | BASE1 | S1/S2 (80/20) | None | 3.5 |
| Comp. Ex. 2 | A-1 | B-1 | 10.0 | 303 | | | | 303 | BASE1 | S1/S2 (80/20) | None | 3.5 |
| Comp. Ex. 3 | A-1 | B-1<br>B-2 | 5.0<br>5.0 | 280<br>303 | | | | 292 | BASE1 | S1/S2 (80/20) | None | 3.5 |
| Comp. Ex. 4 | A-1 | | | | C-4<br>C-5 | 5.0<br>5.0 | 525<br>535 | 530 | BASE1 | S1/S2 (80/20) | None | 3.5 |
| Comp. Ex. 5 | A-1 | D-2 | 5.0 | 186 | C-1 | 5.0 | 437 | 312 | BASE2 | S1/S2/S4 (60/20/20) | W-2 | 3.2 |
| Comp. Ex. 6 | A-2 | | | | C-1 | 10.0 | 437 | 437 | BASE1 | S1/S2 (80/20) | None | 3.5 |
| Comp. Ex. 7 | A-2 | B-1 | 10.0 | 303 | | | | 303 | BASE1 | S1/S2 (80/20) | None | 3.5 |
| Comp. Ex. 8 | A-1 | D-1 | 5.0 | 127 | C-1 | 5.0 | 437 | 282 | BASE2 | S1/S2/S4 (60/20/20) | None | 3.2 |
| Comp. Ex. 9 | A-1 | D-3 | 5.0 | 244 | C-1 | 5.0 | 437 | 341 | BASE2 | S1/S2/S4 (60/20/20) | None | 3.2 |

| Ex. | LER (nm) | Hole resolving power (nm) | IsoLine resolving power (nm) | IsoLine profile | Sensitivity (uC/cm$^2$) |
|---|---|---|---|---|---|
| Ex. 1 | 3.8 | 50 | 50 | Rectangle | 23.8 |
| Ex. 2 | 3.5 | 37.5 | 37.5 | Rectangle | 23.5 |
| Ex. 3 | 4.2 | 50 | 50 | Rectangle | 23.3 |
| Ex. 4 | 4 | 50 | 50 | Rectangle | 22.5 |
| Ex. 5 | 4 | 50 | 50 | Rectangle | 23.2 |
| Ex. 6 | 4.2 | 50 | 50 | Rectangle | 23.2 |
| Ex. 7 | 4.5 | 50 | 50 | Rectangle | 22.9 |
| Ex. 8 | 3.4 | 37.5 | 37.5 | Rectangle | 23.5 |
| Ex. 9 | 4.2 | 50 | 50 | Rectangle | 23.5 |
| Ex. 10 | 4.4 | 50 | 50 | Rectangle | 23.9 |
| Ex. 11 | 4.5 | 75 | 75 | Rectangle | 23.6 |
| Comp. Ex. 1 | 5.1 | 75 | 75 | Rectangle | 28.3 |
| Comp. Ex. 2 | 4.9 | 75 | 75 | Rectangle | 26.8 |
| Comp. Ex. 3 | 5.5 | 75 | 75 | Round-top | 27.3 |
| Comp. Ex. 4 | 5.8 | 100 | 75 | Rectangle | 27.3 |
| Comp. Ex. 5 | 5.1 | 75 | 75 | Round-top | 27.1 |
| Comp. Ex. 6 | 5.4 | 75 | 75 | Rectangle | 27.9 |
| Comp. Ex. 7 | 5.2 | 75 | 75 | Rectangle | 27.3 |

TABLE 2-continued

| | | | | | |
|---|---|---|---|---|---|
| Comp. Ex. 8 | 6.3 | 100 | 100 | Round-top | 27.8 |
| Comp. Ex. 9 | 6.2 | 100 | 100 | Round-top | 28.2 |

What is claimed is:

1. An actinic-ray- or radiation-sensitive resin composition comprising:

(A) a resin that when acted on by an acid, is decomposed to thereby increase its alkali solubility, which resin comprises both of any of repeating units (I) of general formula (I) below and any of repeating units (III) of general formula (III) below, (B) an onium salt acid generator that when exposed to actinic rays or radiation, generates a sulfonic acid whose volume ranges from 250 Å$^3$ to less than 350 Å$^3$, and (C) an onium salt acid generator that when exposed to actinic rays or radiation, generates a sulfonic acid whose volume is 400 Å$^3$ or greater, (I)

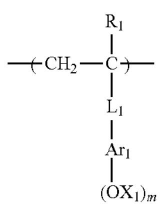

(III)

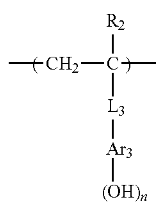

in which in general formula (I), $R_1$ represents a hydrogen atom or a methyl group; $L_1$ represents a single bond or a bivalent connecting group; $Ar_1$ represents an aromatic connecting group; $X_1$ represents a group leaving when acted on by an acid; and m is an integer of 1 to 3, and in general formula (III), $R_3$ represents a hydrogen atom or a methyl group; $L_3$ represents a single bond or a bivalent connecting group; $Ar_3$ represents an aromatic connecting group; and n is an integer of 1 to 3, wherein the acid generators (B) and (C) are simultaneously acid generators that when exposed to actinic rays or radiation, generate an optionally substituted benzenesulfonic acid.

2. The composition according to claim 1, wherein $L_1$ in general formula (I) and $L_3$ in general formula (III) simultaneously represent a single bond.

3. The composition according to claim 1, wherein at least one group represented by $OX_1$ in general formula (I) has an acetal structure.

4. The composition according to claim 1, wherein the acid generator (B) is an onium salt acid generator with any of anion structures of general formula (IV) below, and the acid generator (C) is an onium salt acid generator with any of anion structures of general formula (V) below, (IV)

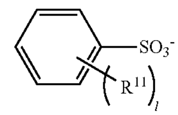

(V)

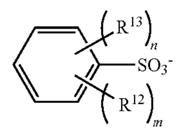

in which in general formula (IV), $R^{11}$ represents an alkyl group or a cycloalkyl group; and l is an integer of 1 to 3 provided that when l is 1, $R^{11}$ represents an alkyl group having 7 to 12 carbon atoms or a cycloalkyl group having 7 to 12 carbon atoms, and that when l is 2 or 3, $R^{11}$ represents an alkyl group or a cycloalkyl group and the groups $R^{11}$ altogether have 7 to 12 carbon atoms in total, and in general formula (V), $R^{12}$ represents a cycloalkyl group; $R^{13}$ represents an alkyl group, a halogen atom or a hydroxyl group; m is an integer of 2 to 5; and n is an integer of 0 to 3 satisfying the relationship m+n <5.

5. The composition according to claim 1, wherein the acid generators (B) and (C) are simultaneously sulfonium salts.

6. An actinic-ray- or radiation-sensitive film formed from the composition according to claim 1.

7. A photomask blank comprising the actinic-ray- or radiation-sensitive film according to claim 6.

8. A method of forming a pattern, comprising forming a film from the composition according to claim 1, exposing the film to actinic rays or radiation, and developing the thus exposed film.

9. The method of forming a pattern according to claim 8, wherein electron beams are used as the actinic rays or radiation.

10. The composition according to claim 1, wherein the repeating unit of general formula (I) is any of repeating units represented by:

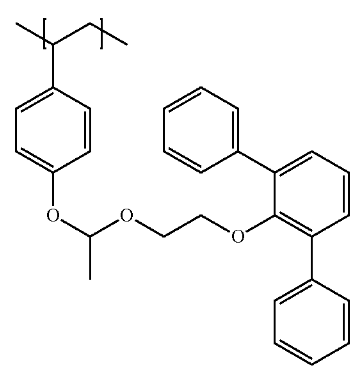

or

-continued

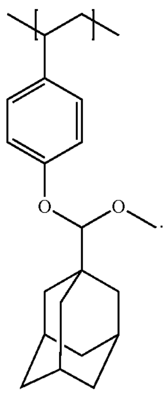

11. The composition according to claim 1, wherein the resin (A) is any of resins represented by:

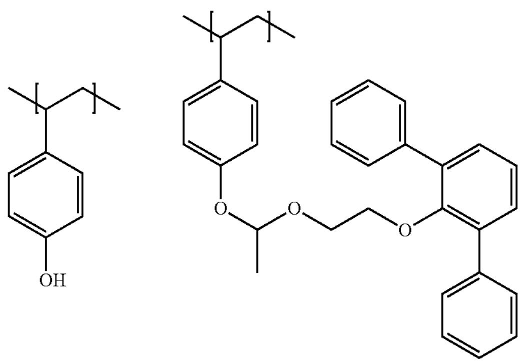

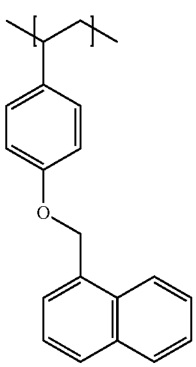

or

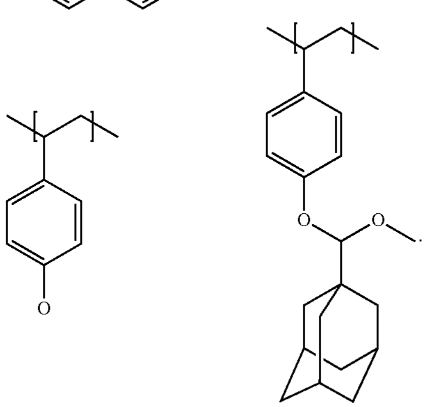

12. An actinic-ray- or radiation-sensitive resin composition comprising:

(A) a resin that when acted on by an acid, is decomposed to thereby increase its alkali solubility, which resin comprises both of any of repeating units (I) of general formula (I) below and any of repeating units (III) of general formula (III) below, (B) an onium salt acid generator that when exposed to actinic rays or radiation, generates a sulfonic acid whose volume ranges from 250 $Å^3$ to less than 350 $Å^3$, and (C) an onium salt acid generator that when exposed to actinic rays or radiation, generates a sulfonic acid whose volume is 400 $Å^3$ or greater, (I)

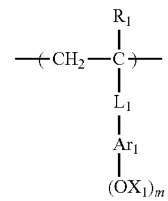

(III)

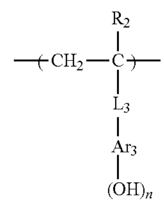

in which in general formula (I), $R_1$ represents a hydrogen atom or a methyl group; $L_1$ represents a single bond or a bivalent connecting group; $Ar_1$ represents an aromatic connecting group; $X_1$ represents a group leaving when acted on by an acid; and m is an integer of 1 to 3, and in general formula (III), $R_3$ represents a hydrogen atom or a methyl group; $L_3$ represents a single bond or a bivalent connecting group; $Ar_3$ represents an aromatic connecting group; and n is an integer of 1 to 3, wherein the volume of the sulfonic acid generated by the acid generator (C) is in the range of 400 to 470 $Å^3$.

13. The composition according to claim 12, wherein at least one $X_1$ in general formula (I) is a group represented by following general formula (B):

(B)

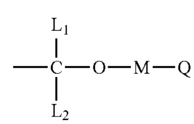

in the formula, each of $L_1$ and $L_2$ independently represents a hydrogen atom, an alkyl group, a cycloalkyl group, an aryl group or an aralkyl group, M represents a single bond or a bivalent connecting group, and Q represents an aromatic ring group, provided that the aromatic ring group may contain a heteroatom.

14. An actinic-ray- or radiation-sensitive resin composition comprising:

(A) a resin that when acted on by an acid, is decomposed to thereby increase its alkali solubility, which resin comprises both of any of repeating units (I) of general formula (I) below and any of repeating units (III) of general formula (III) below, (B) an onium salt acid generator that when exposed to actinic rays or radiation, generates a sulfonic acid whose volume ranges from 250 Å$^3$ to less than 350 Å$^3$, and (C) an onium salt acid generator that when exposed to actinic rays or radiation, generates a sulfonic acid whose volume is 400 Å$^3$ or greater, (I)

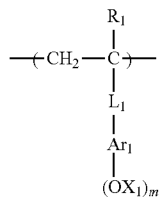

(III)

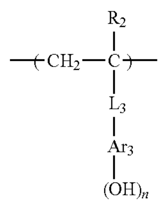

in which in general formula (I), $R_1$ represents a hydrogen atom or a methyl group; $L_1$ represents a single bond or a bivalent connecting group; $Ar_1$ represents an aromatic connecting group; $X_1$ represents a group leaving when acted on by an acid; and m is an integer of 1 to 3, and in general formula (III), $R_3$ represents a hydrogen atom or a methyl group; $L_3$ represents a single bond or a bivalent connecting group; $Ar_3$ represents an aromatic connecting group; and n is an integer of 1 to 3, wherein an average value of generated acid volumes is in the range of 350 to 405 Å$^3$, wherein an average value of generated acid volumes refers to the sum of [volume (Å$^3$) of an acid generated by each acid generator]×[mass ratio of the acid generator based on the total mass of acid generators].

15. The composition according to claim 14, wherein the acid generators (B) and (C) are simultaneously acid generators that when exposed to actinic rays or radiation, generate an optionally substituted benzenesulfonic acid.

16. An actinic-ray- or radiation-sensitive resin composition comprising:

(A) a resin that when acted on by an acid, is decomposed to thereby increase its alkali solubility, which resin comprises both of any of repeating units (I) of general formula (I) below and any of repeating units (III) of general formula (III) below, (B) an onium salt acid generator that when exposed to actinic rays or radiation, generates a sulfonic acid whose volume ranges from 250 Å$^3$ to less than 350 Å$^3$, and (C) an onium salt acid generator that when exposed to actinic rays or radiation, generates a sulfonic acid whose volume is 400 Å$^3$ or greater, (I)

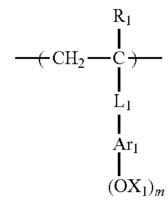

(III)

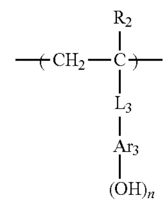

in which in general formula (I), $R_1$ represents a hydrogen atom or a methyl group; $L_1$ represents a single bond or a bivalent connecting group; $Ar_1$ represents an aromatic connecting group; $X_1$ represents a group leaving when acted on by an acid; and m is an integer of 1 to 3, and in general formula (III), $R_3$ represents a hydrogen atom or a methyl group; $L_3$ represents a single bond or a bivalent connecting group; $Ar_3$ represents an aromatic connecting group; and n is an integer of 1 to 3, wherein at least one $X_1$ in general formula (I) is a group represented by following general formula (B):

(B)

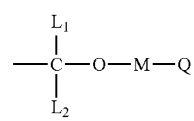

in the formula,

L1 represents a hydrogen atom, an alkyl group, a cycloalkyl group, an aryl group or an aralkyl group, L2 represents a cycloalkyl group, an aryl group or an aralkyl group, M represents a single bond or a bivalent connecting group, and Q represents an alkyl group, a cycloalkyl group, a cycloaliphatic group, an aromatic ring group, an amino group, an ammonium group, a mercapto group, a cyano group or an aldehyde group, provided that each of the cycloaliphatic group and the aromatic ring group may contain a heteroatom.

17. The composition according to claim 16, wherein L2 in general formula (B) is a cycloalkyl group.

18. The composition according to claim 16, wherein L2 in general formula (B) is an adamantyl group.

* * * * *